(12) United States Patent
Nagai

(10) Patent No.: US 8,004,030 B2
(45) Date of Patent: Aug. 23, 2011

(54) SEMICONDUCTOR DEVICE AND METHOD FOR MANUFACTURING THE SAME

(75) Inventor: Kouichi Nagai, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 218 days.

(21) Appl. No.: 12/542,243

(22) Filed: Aug. 17, 2009

(65) Prior Publication Data

US 2009/0302363 A1    Dec. 10, 2009

Related U.S. Application Data

(63) Continuation of application No. PCT/JP2007/053210, filed on Feb. 21, 2007.

(51) Int. Cl.
*H01L 27/11* (2006.01)

(52) U.S. Cl. ............ 257/296; 438/3; 438/396; 257/295; 257/71; 257/300; 257/306; 257/532; 257/E27.034; 257/E27.087; 257/E21.008; 257/E21.664; 257/E23.002; 257/E27.104; 365/49.13; 365/49.12

(58) Field of Classification Search .................. None
See application file for complete search history.

(56) References Cited

U.S. PATENT DOCUMENTS

| 6,548,343 B1 | 4/2003 | Summerfelt et al. | |
|---|---|---|---|
| 7,232,764 B1 * | 6/2007 | Yaegashi | 438/702 |
| 2005/0285173 A1 | 12/2005 | Nagai et al. | |

FOREIGN PATENT DOCUMENTS

| JP | 5-074921 A | 3/1993 |
|---|---|---|
| JP | 2001-244426 A | 9/2001 |
| JP | 2006-049795 A | 2/2006 |

OTHER PUBLICATIONS

International Search Report of PCT/JP2007/053210, Mailing Date of May 15, 2007.

* cited by examiner

*Primary Examiner* — Minh-Loan T Tran
*Assistant Examiner* — Fei Fei Yeung Lopez
(74) *Attorney, Agent, or Firm* — Westerman, Hattori, Daniels & Adrian, LLP

(57) ABSTRACT

Provided is a semiconductor device that includes: a base insulating film 25 formed above a silicon substrate 10; a ferroelectric capacitor Q formed on the base insulating film 25; multiple interlayer insulating films 35, 48, and 62, and metal interconnections 45, 58, and 72 which are alternately formed on and above the capacitor Q; and conductive plugs 57 which are respectively formed inside holes 54a provided in the interlayer insulating films 48 and are electrically connected to the metal interconnections 45. In the semiconductor device, a first capacitor protection insulating film 50 is formed on an upper surface of the interlayer insulating film 48 by sequentially stacking a first insulating metal oxide film 50a, an intermediate insulating film 50b having a relative dielectric constant lower than that of the interlayer insulating film 48, and a second insulating metal oxide film 50c; and the holes 54a are also formed in the first capacitor protection insulating film 50.

20 Claims, 69 Drawing Sheets

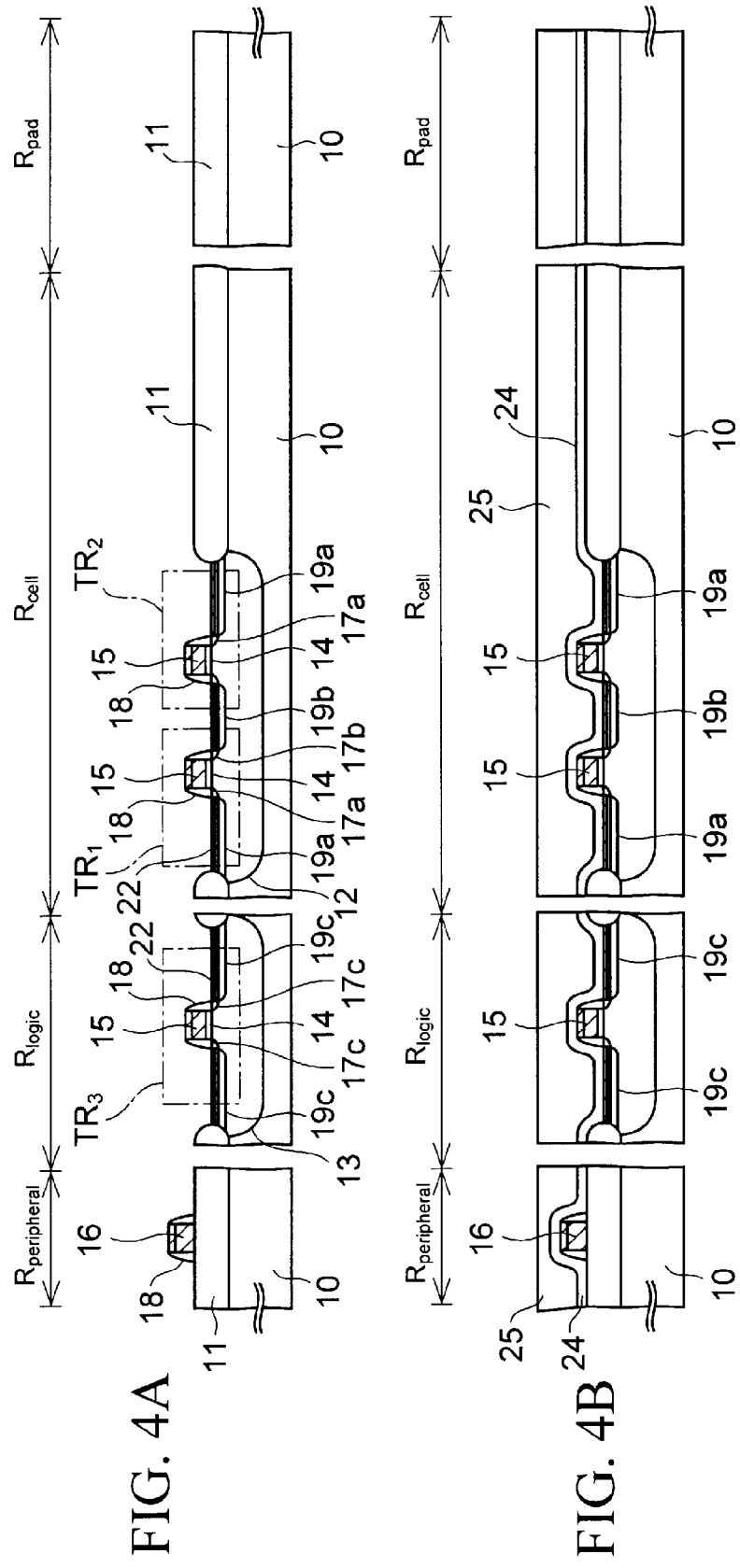

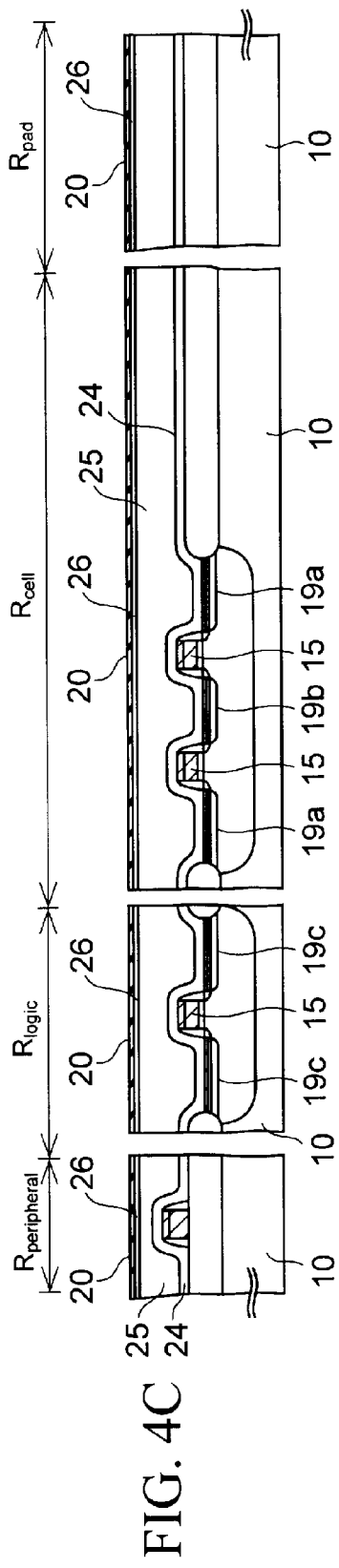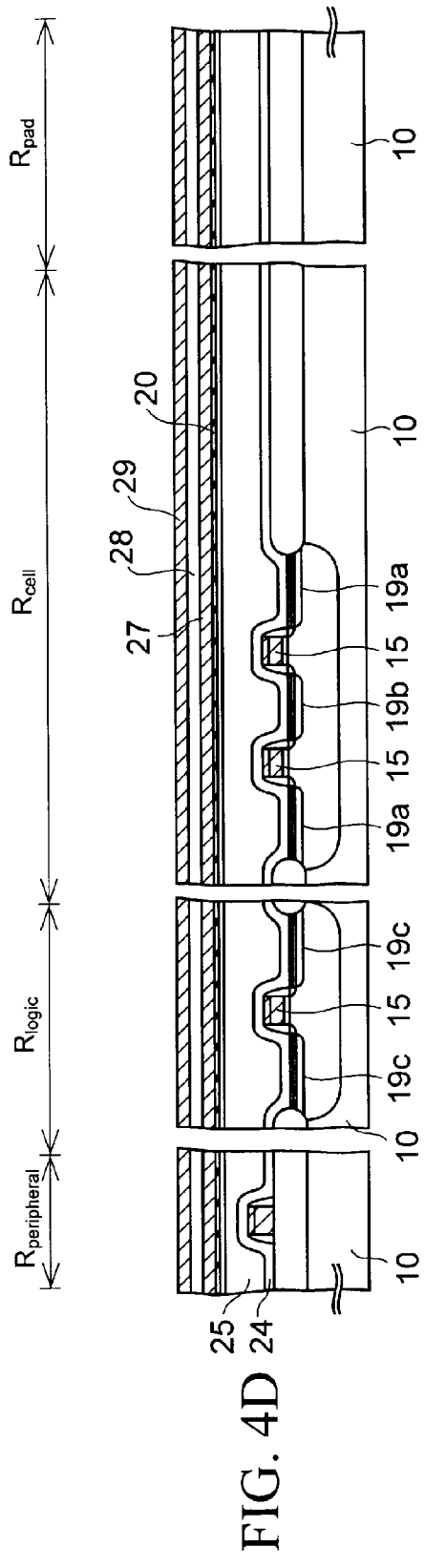

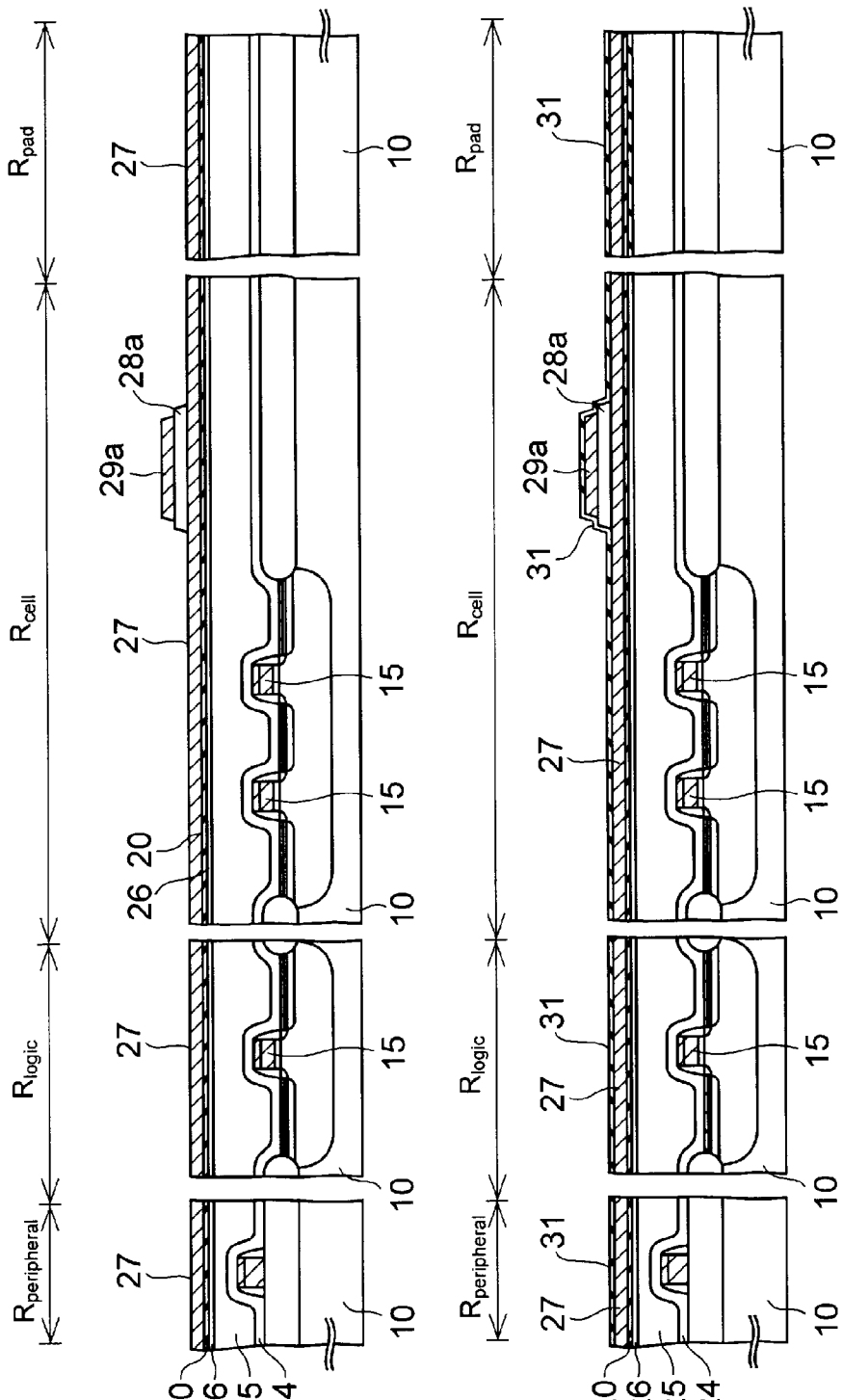

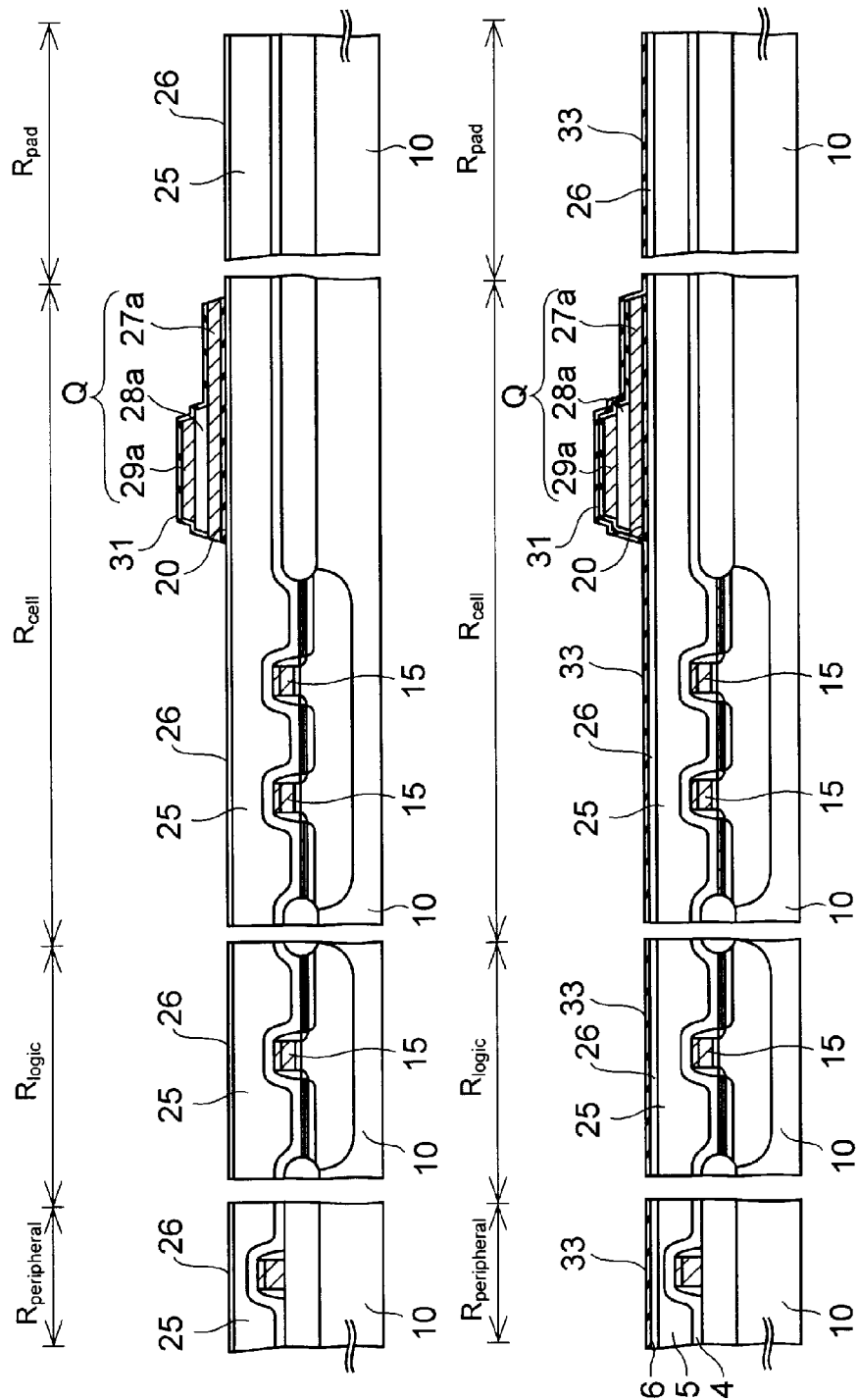

FIG. 23

UHAST (percent defective)

| elapsed time | 168(hours) | 336(hours) | 504(hours) | 1008(hours) |
|---|---|---|---|---|
| the fifth capacitor protective insulating film 50 is not formed | 50 | 80 | 100 | 100 |
| conventional example 1 (Fig. 1) | 0 | 0 | 20 | 20 |
| conventional example 2 (Fig. 3) | 0 | 0 | 20 | 30 |
| present embodiment | 0 | 0 | 20 | 30 |

US 8,004,030 B2

SEMICONDUCTOR DEVICE AND METHOD FOR MANUFACTURING THE SAME

CROSS-REFERENCE TO RELATED APPLICATIONS

This application is based upon prior International Patent Application No. PCT/JP2007/53210, filed on Feb. 21, 2007, the entire contents of which are incorporated herein by reference.

FIELD

It is related to a semiconductor device and a method for manufacturing the semiconductor device.

BACKGROUND

Recently, there have been developed ferroelectric memories, called FeRAM (ferroelectric random access memories), in each of which information is held in a ferroelectric capacitor by use of polarization inversion of a ferroelectric material. The ferroelectric memory is a non-volatile memory in which information is not erased even after the power is turned off, and is particularly drawing attention because of its capabilities to achieve high integration, high-speed operation, high durability, and low power consumption.

As a material for a ferroelectric film constituting a ferroelectric capacitor, mainly used is a ferroelectric oxide having a perovskite crystal structure, such as PZT (lead zirconate titanate: $PbZr_{1-x}Ti_xO_3$) or SBT ($SrBi_2Ta_2O_9$), the residual polarization charge amount of which is as high as approximately 10 $\mu C/cm^2$ to 30 $\mu C/cm^2$. It has been known that the ferroelectric characteristic of such a ferroelectric film is deteriorated due to moisture which enters from the outside through an interlayer insulating film having an affinity for moisture, such as a silicon oxide film. The reason for this is considered as follows. Namely, the moisture entered a device is decomposed into hydrogen and oxygen when a substrate is heated to form an interlayer insulating film or a metal interconnection. Then, the hydrogen enters the ferroelectric film and reduces the ferroelectric film and, this causes oxygen defect in the ferroelectric film and thereby lowers the crystallinity in the ferroelectric film.

Similarly, long term use of a ferroelectric memory also leads to a deterioration of the ferroelectric characteristic of the ferroelectric film, and consequently a deterioration of the performance of the ferroelectric capacitor. Furthermore, in some cases, this also results in a deterioration of the performance of a transistor or the like in addition to the ferroelectric capacitor.

To deal with these problems, in a ferroelectric device such as a FeRAM, a capacitor protection insulating film such as an alumina ($Al_2O_3$) film is generally formed in order to prevent moisture or hydrogen from entering a ferroelectric capacitor.

Such a capacitor protection insulating film is disclosed in, for example, Japanese Laid-open Patent Publication No. 2006-49795.

FIG. 1 is an enlarged cross-sectional view of an essential part of a semiconductor device disclosed in the Japanese Laid-open Patent Publication No. 2006-49795.

This semiconductor device includes a ferroelectric capacitor Q formed on a first interlayer insulating film 201 over a semiconductor substrate 200. The ferroelectric capacitor Q includes a lower electrode 202, a capacitor dielectric film 203 made of a ferroelectric material, and an upper electrode 204 stacked in this order.

A capacitor protection insulating film 210 is formed on a second interlayer insulating film 206 made of a silicon oxide covering the ferroelectric capacitor Q. The capacitor protection insulating film 210 serves to prevent hydrogen or moisture from entering the ferroelectric capacitor Q.

Furthermore, holes 206a and 206b for electric connections are formed in each of the insulating films 201, 206, and 210. Conductive plugs 211a and 211b are respectively filled in these holes.

According to the Japanese Laid-open Patent Publication No. 2006-49795, as the capacitor protection insulating film 210, a stacked film of an alumina film 207, a silicon nitride film 208, and an alumina film 209 is formed. The Japanese Laid-open Patent Publication No. 2006-49795 teaches that the silicon nitride film 208 eases stresses in the alumna films 207 and 209.

However, in such capacitor protection insulating film 210, the silicon nitride film 208 functions as a stopper for etching when the holes 206a and 206b are formed by etching. Accordingly, the etching needs a long period of time and also the diameters of the holes 206a and 206b become extremely small below the silicon nitride film 208.

FIGS. 2A and 2B are plan views of the holes 206a and 206b drawn based on an SEM (scanning electron microscope) image viewed from above. As depicted in these figures, the upper ends 206c of holes 206a and 206b are each formed in a relatively fine circular shape, whereas their lower ends 206d are each formed in an unstable planar shape, and the lower ends 206d have the diameter smaller than the corresponding upper end 206c.

In this manner, when the stacked film including the silicon nitride film 208 is formed as the capacitor protection insulating film 210, the holes 206a and 206b cannot be formed in fine shapes. This causes a problem that the contact resistances of the conductive plugs 211a and 211b filled in these holes 206a and 206b become unstable.

FIG. 3 is an enlarged cross-sectional view of an essential part of another example of the semiconductor device disclosed in the Japanese Laid-open Patent Publication No. 2006-49795.

This semiconductor device differs from the example of FIG. 1 in that alumina films 220, 222, and 224 and silicon oxide films 221 and 223 are stacked as a capacitor protection insulating film 225 as depicted in FIG. 3.

In this example, a silicon nitride film is not included in the capacitor protection insulating film 225. Therefore, the etching for the holes 206a and 206b is easier than that in the example of FIG. 1.

However, the silicon oxide films 221 and 223 are formed by a plasma CVD (chemical vapor deposition) method which easily generates a tensile stress in a film. Accordingly, a semiconductor substrate 200 is easily warped in a recessed state due to the tensile stresses generated in the silicon oxide films 221 and 223. This causes another problem that a stress is applied to the ferroelectric capacitor Q serving as a piezoelectric element, and therefore makes it likely to deteriorate the ferroelectricity of the ferroelectric capacitor Q.

SUMMARY

According to one aspect discussed herein, a semiconductor device includes a base insulating film formed over a semiconductor substrate, a capacitor formed on the base insulating film, the capacitor including a lower electrode, a capacitor dielectric film made of a ferroelectric material, and an upper electrode, a plurality of interlayer insulating films and metal interconnections which are alternately formed over the capacitor, and a conductive plug which is formed in a hole provided in the interlayer insulating film and is electrically connected to the metal interconnection, wherein a first capacitor protection insulating film is formed on an upper surface of the at least one interlayer insulating film among the plurality of interlayer insulating films, the first capacitor protection insulating film being formed by sequentially stacking a first insulating metal oxide film, an intermediate insulating film having a relative dielectric constant lower than that of the one interlayer insulating film, and a second insulating metal oxide film, and the hole is also formed in the first capacitor protection insulating film.

BRIEF DESCRIPTION OF THE DRAWINGS

FIG. 23 depicts examination results of percent defective of the semiconductor device according to the second modification of the first embodiment.

DESCRIPTION OF EMBODIMENTS

Figure 1:
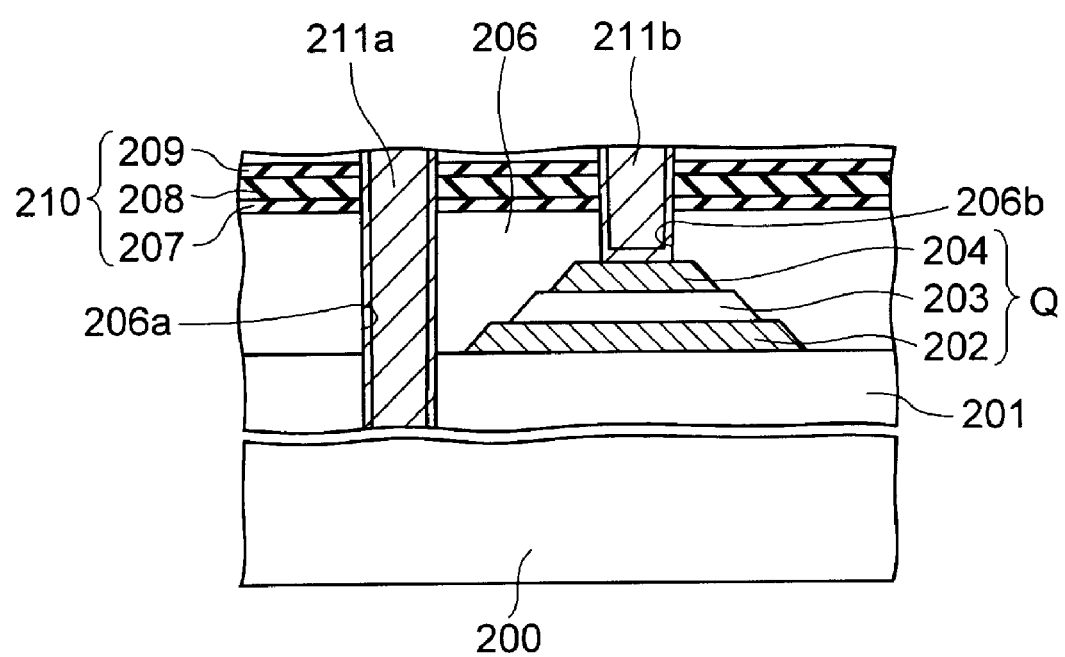
FIG. 1 is an enlarged cross-sectional view of an essential part of a semiconductor device disclosed in Patent Document 1.

Embodiments are described in detail below by referring to the accompanying drawings.

First Embodiment

Firstly, a semiconductor device according to a first embodiment is described by following manufacturing processes thereof.

FIGS. 4A to 4Z and FIGS. 5A to 5F are cross-sectional views of a semiconductor device according to the present embodiment in the course of manufacturing. Note that, in these figures, a peripheral circuit region $R_{peripheral}$, a logic circuit region $R_{logic}$, a cell region $R_{cell}$, and a pad region $R_{pad}$ in one semiconductor chip are depicted together.

This semiconductor device is a planer-type FeRAM and is manufactured as follows.

Firstly, processes for obtaining a cross-sectional structure depicted in FIG. 4A are described.

A surface of an n type or p type silicon (semiconductor) substrate 10 is thermally oxidized to form a device isolation insulating film 11. This device isolation insulating film 11 defines active regions of transistors. The device isolation insulating film 11 has a film thickness of, for example, approximately 200 nm when measured from the upper surface of the silicon substrate 10. Such a device isolation structure is referred to as LOCOS (local oxidation of silicon). In place of the LOCOS, STI (shallow trench isolation) may be employed.

Subsequently, a p type impurity, for example boron, is introduced into the active region of the silicon substrate 10 so as to form first and second p wells 12 and 13. Thereafter, the surface of the active regions is thermally oxidized, so that a thermal oxidation film serving as a gate insulating film 14 is formed with a thickness of approximately 6 nm to 7 nm.

After that, an amorphous silicon film with a thickness of approximately 50 nm and a tungsten silicide film with a thickness of approximately 150 nm are sequentially formed on the entire upper surface of the silicon substrate 10. Note that a polycrystalline silicon film may be formed in place of the amorphous silicon film. Then, these films are patterned by photolithography to form gate electrodes 15 over the silicon substrate in the logic circuit region $R_{logic}$ and the cell region $R_{cell}$, and to form an interconnection 16 on the device isolation insulating film 11 in the peripheral circuit region $R_{peripheral}$.

A gate length of each gate electrode is, for example, approximately 360 μm.

Furthermore, phosphorus as an n type impurity is introduced into the silicon substrate 10 at the side of each gate electrode 15 by ion implantation using the gate electrodes 15 as masks, so that first to third source/drain extensions 17a to 17c are formed.

After that, an insulating film is formed on the entire upper surface of the silicon substrate 10. The insulating film is then etched back and left at the lateral side of each gate electrode 15 and of the interconnection 16 as insulating spacers 18. As the insulating film, a silicon oxide film is formed with a thickness of 45 nm by the CVD method, for example.

Subsequently, by using the insulating spacers 18 and the gate electrodes 15 as masks, ions of n type impurities such as arsenic are implanted again into the silicon substrate 10, so that first to third source/drain regions (impurity diffusion regions) 19a to 19c are formed on sides of the gate electrodes 15 on the silicon substrate 10.

Furthermore, a refractory metal film such as a cobalt film is formed by a sputtering method on the entire upper surface of the silicon substrate 10. After that, the refractory metal film is heated so as to be reacted with silicon. Accordingly, a refractory silicide layer 22, such as a cobalt silicide layer, is formed in the first to third source/drain regions 19a to 19c on the silicon substrate 10. As a result, the individual source/drain regions 19a to 19c are caused to have a low resistance. Note that such a refractory metal silicide layer is also formed on the surfaces of each gate electrode 15 and the interconnection 16.

After that, the refractory metal layer which is left unreacted on the device isolation insulating film 11 and the like are removed by wet etching.

With the processes up to this point, formed in the cell region $R_{cell}$ and the logic circuit region $R_{logic}$ of the silicon substrate 10 are first to third MOS transistors $TR_1$, to $TR_3$, each of which includes the gate insulating film 14, the gate electrode 15, and the first to third source/drain regions 19a to 19c.

Next, as depicted in FIG. 4B, a silicon oxynitride (SiON) film is formed by the plasma CVD method with a thickness of approximately 200 nm on the entire upper surface of the silicon substrate 10. The resultant film serves as an etching stopper film 24.

Furthermore, by a plasma CVD method using a mixed gas of a TEOS (tetraethoxysilane) gas and an oxygen gas, a silicon oxide ($SiO_2$) film is formed, as a base insulating film 25, with a thickness of approximately 600 nm on the etching stopper film 24. After that, the upper surface of the base insulating film 25 is polished by CMP (chemical mechanical polishing) in order to planarize the upper surface thereof. An amount of the polishing is, for example, approximately 200 nm.

Next, as depicted in FIG. 4C, by a plasma CVD method using the TEOS gas, a silicon oxide film is formed on the base insulating film 25 again with a thickness of approximately 100 nm. The resultant silicon oxide film serves as a first cap insulating film 26.

After that, as dehydration processing of these insulating films 25 and 26, annealing is performed at a substrate temperature of approximately 650° C. in a nitrogen atmosphere for approximately 30 minutes. Thereafter, an alumina film 20 is formed with a thickness of approximately 20 nm on the first cap insulating film 26 by the sputtering method.

Then, RTA (rapid thermal anneal) is performed on the alumina film 20 at the substrate temperature of 650° C. for the processing time of 60 seconds.

By forming the first cap insulating film 26 as described above, microscratches, which are made in the upper surface of the base insulating film 25 when the base insulating film 25 comes in contact with a polishing pad during the CMP, are filled with the first cap insulating film 26.

Accordingly, the alumina film 20 is formed in a preferably planarized state on the first cap insulating film 26.

Next, processes for obtaining a cross-sectional structure depicted in FIG. 4D are described.

Firstly, a platinum film as a first conductive film 27 is formed on the alumina film 20 by the sputtering method. The first conductive film 27 serves as a capacitor lower electrode after being pattered later, and a film thickness thereof is approximately 155 nm.

Furthermore, a PZT (lead zirconate titanate: $PbZr_{1-x}Ti_xO_3$) film is formed with a thickness of 150 nm to 200 nm on the first conductive film 27 by the sputtering method. The resultant PZT film serves as a ferroelectric film 28.

Note that film forming methods for the ferroelectric film 28 include a MOCVD (metal organic CVD) method and a sol-gel method in addition to the sputtering method. Furthermore, a material for the ferroelectric film 28 is not limited to the above-described PZT. The ferroelectric conductive film 28 may be made of: a Bi layered structure compound such as SBT ($SrBi_2Ta_2O_9$), $SrBi_2$ ($Ta_xNb_{1-x}$) 209, or $Bi_4Ti_2O_{12}$; PLZT ($Pb_{1-x}La_xZr_{1-y}Ti_yO_3$) obtained by doping lanthanum into PZT; or another metal oxide ferroelectric material.

Here, the PZT formed by the sputtering method is hardly crystallized just after the film is formed, and, thus, is poor in ferroelectricity. To deal with this problem, as crystallization annealing for crystallizing the PZT constituting the ferroelectric film 28, RTA (rapid thermal anneal) is performed at a substrate temperature of approximately 585° C. for approximately 90 seconds in an oxygen-containing atmosphere whose flow rate of Ar is 1.98 liters per minute and whose flow rate of oxygen is 0.025 liters per minute. Note that, when the ferroelectric film 28 is formed by the MOCVD method, this crystallization annealing is not needed.

Next, a first iridium oxide ($IrO_2$) film is formed with a thickness of approximately 50 nm on the ferroelectric film 28 by the sputtering method. This first iridium oxide film is subjected to the RTA. Conditions for the RTA are not particularly limited. However, in the present embodiment, the RTA is performed at the substrate temperature of 725° C. for the processing time of 20 seconds in the oxygen-containing atmosphere whose flow rate of Ar is 2.00 liters per minute and whose flow rate of oxygen is 0.025 liters per minute.

Thereafter, a second iridium oxide film is formed with a thickness of approximately 200 nm on the first iridium oxide film by the sputtering method. These first and second iridium oxide films constitute a stacked film which serves as a second conductive film 29.

Here, the first conductive film 27 is formed on the alumina film 20, so that the orientation of platinum constituting the first conductive film 27 becomes preferable as compared with the case where the first conductive film 27 is directly formed on the cap insulating film 26 by omitting the alumina film 20. The orientation of the first conductive film 27 has an effect to align the orientation of the PZT constituting the ferroelectric film 28. As a result, the ferroelectricity of the ferroelectric film 28 is improved.

Next, processes for obtaining a cross-sectional structure depicted in FIG. 4E are described.

Firstly, a second conductive film 29 is patterned by photolithography to form an upper electrode 29a. After that, recovery annealing is performed on the ferroelectric film 28 in a vertical furnace in order to recover damages received by the ferroelectric film 28 during this patterning. The recovery annealing is performed in an oxygen-containing atmosphere whose flow rate of oxygen is 20 liters per minute, under conditions of, for example, the substrate temperature of 650° C. and the processing time of 60 minutes.

Next, the ferroelectric film 28 is patterned by photolithography to form a capacitor dielectric film 28a made of a ferroelectric material such as PZT. The damages received by the capacitor dielectric film 28a during this patterning are recovered by recovery annealing. The recovery annealing is performed in an oxygen-containing atmosphere using a vertical furnace. Employed conditions for the recovery annealing are that the flow rate of oxygen is 20 liters per minute, the substrate temperature is 350° C., and the processing time is 60 minutes.

Subsequently, as a first capacitor protection insulating film 31 for protecting the capacitor dielectric film 28a from reducing materials such as hydrogen and moisture, an alumina film is formed with a thickness of approximately 50 nm on the entire upper surface of the silicon substrate 10 by the sputtering method.

Note that, in place of the alumina film, any one of a titanium oxide ($TiO_x$) film, a zirconium oxide ($ZrO_x$) film, a magnesium oxide ($MgO_x$) film, and a titanium magnesium oxide ($MgTiO_x$) film may be formed as the first capacitor protection insulating film 31.

After that, to recover damages received by the capacitor dielectric film 28a during this sputtering, recovery annealing is performed at the substrate temperature of 550° C. for approximately 60 minutes in an oxygen-containing atmosphere whose flow rate of 20 liters per minute. This recovery annealing is performed using a vertical furnace.

Next, as depicted in FIG. 4G, the first conductive film 27 and the first capacitor protection insulating film 31 are patterned by photolithography, so that the first conductive film 27 under the capacitor dielectric film 28a becomes a lower electrode 27a and that the first capacitor protection insulating film 31 is left so as to cover the lower electrode 27a.

Thereafter, to recover damages received by the capacitor dielectric film 28a during the processes, recovery annealing is performed on the capacitor dielectric film 28a in an oxygen-containing atmosphere whose flow rate of oxygen is 20 liters per minute, under conditions of the substrate temperature of 650° C. and the processing time of 60 minutes. This recovery annealing is performed using, for example, a vertical furnace.

With the processes up to this point, formed over the silicon substrate 10 is a capacitor Q that is formed by stacking the lower electrode 27a, the capacitor dielectric film 28a, and the upper electrode 29a in this order.

Subsequently, as depicted in FIG. 4H, as a second capacitor protection insulating film 33 for protecting the capacitor Q, an alumina film is formed with a thickness of approximately 20 nm on the entire upper surface of the silicon substrate 10 by the sputtering method. This second capacitor protection insulating film 33, together with the first capacitor protection insulating film 31 formed thereunder, functions to prevent reducing materials such as hydrogen and moisture from reaching the capacitor dielectric film 28a, thereby suppressing deterioration of the ferroelectricity of the capacitor dielectric film 28a due to reduction of the capacitor dielectric film 28a.

Films having such a function include a titanium oxide film, a zirconium oxide film, a magnesium oxide film, and a titanium magnesium oxide film in addition to the alumina film. Any one of these films may be formed as the second capacitor protection insulating film 33.

After that, recovery annealing is performed on the capacitor dielectric film 28a in a vertical furnace being filled with an oxygen-containing atmosphere, under conditions of the substrate temperature of 550° C. and the processing time of 60 minutes. The flow rate of oxygen in this recovery annealing is, for example, 20 liters per minute.

Figure 4I:
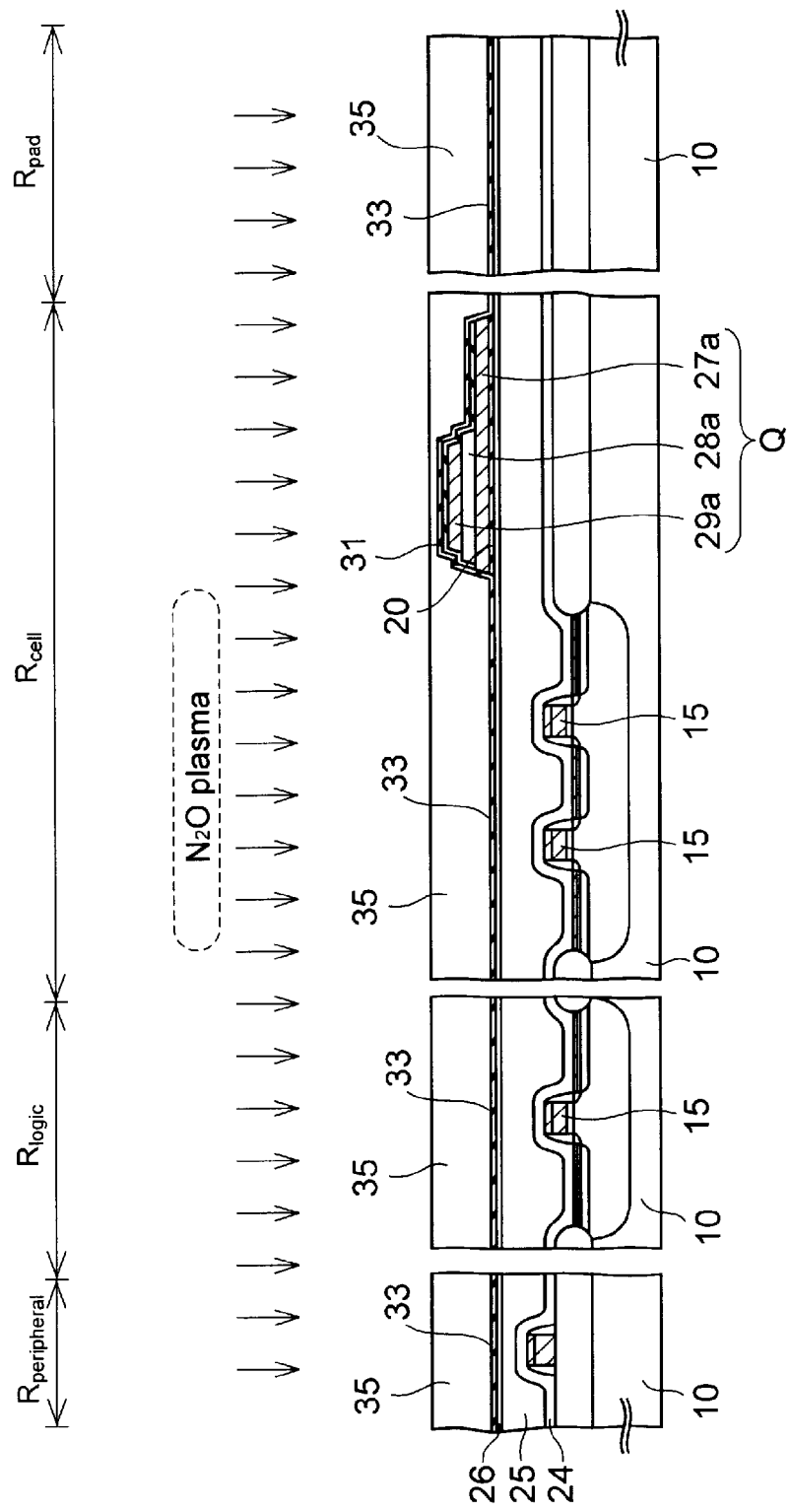
FIGS. 4A to 4Z and FIGS. 5A to 5F are cross-sectional views of a semiconductor device according to a first embodiment during the course of manufacturing.

Next, as depicted in FIG. 4I, a silicon oxide film is formed with a thickness of approximately 1500 nm on the above-described second capacitor protection insulating film 33 by the plasma CVD method using the TEOS gas. The resultant silicon oxide film serves as a first interlayer insulating film 35.

Next, the surface of the interlayer insulating film 35 is planarized by, for example, the CMP processing so as to planarize the upper surface of the first interlayer insulating film 35.

After that, as a dehydration processing for the first interlayer insulating film 35, $N_2O$ plasma processing (a heat treatment) using CVD equipment is performed. In this case, the substrate temperature is set to 350° C. and the processing time is set to 2 minutes.

Such $N_2O$ plasma dehydrates the first interlayer insulating film 35 and the upper surface of the first interlayer insulating film 35 is nitrided to be capable of preventing re-adsorption of moisture.

Note that, in place of the $N_2O$ plasma processing, ammonia ($NH_3$) plasma processing may be performed to dehydrate the first interlayer insulating film 35. This is also the case for the $N_2O$ plasma processings to be described later.

Moreover, this dehydration processing is particularly effective when a target insulating film has a thickness of 100 nm or more. This is because an insulating film with a film thickness of 100 nm or more contains a relatively large amount of moisture. In contrast, when a thickness of an insulating film is less than 100 nm, such dehydration processing may not be performed because an amount of moisture in the insulating film is small.

In the following description, based on such knowledge, an insulating film which requires the dehydration processing is distinguished from an insulating film which does not require the dehydration processing. However, even in the case where a film thickness is less than 100 nm, if it is preferable that an insulating film be sufficiently dried by performing the dehydration processing, the dehydration processing may be performed.

Note that a cover insulating film may be formed on this interlayer insulating film 35. The cover insulating film is formed for filling microscratches formed in the upper surface of the interlayer insulating film 35 during the CMP or voids generated in the interlayer insulating film 35 between the adjacent capacitors Q. By forming such a cover insulating film, a coating capability of a film to be formed thereon is improved. As the cover insulating film, for example, a silicon oxide film with a thickness of approximately 50 nm, which is formed by the plasma CVD method using the TEOS gas, can be employed.

Figure 4J:
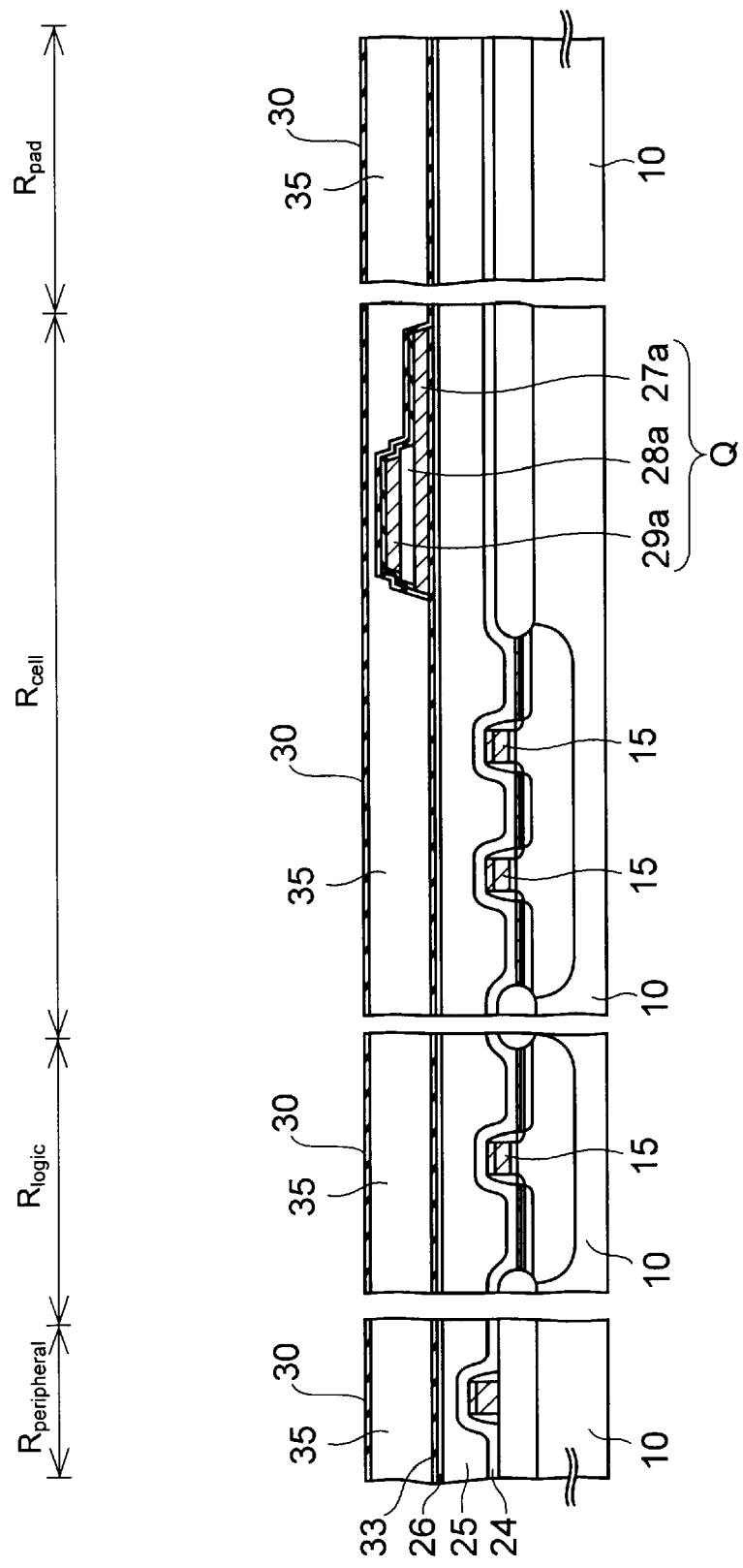

Next, as depicted in FIG. 4J, an alumina film is formed to a thickness of 50 nm to 100 nm on the first interlayer insulating film 35 by the sputtering method. The resultant alumina film serves as a third capacitor protection insulating film 30. The third capacitor protection insulating film 30 is made of alumina, which is excellent in blocking capability against moisture or hydrogen, and plays a role of preventing the capacitor dielectric film 28a from being deteriorated by reducing materials such as moisture and hydrogen.

Note that, in place of the alumina film, a film having blocking capability against moisture or hydrogen, for example, any one of a titanium oxide film, a zirconium oxide film, a magnesium oxide film, and a titanium magnesium oxide film may be formed as the third capacitor protection insulating film 30.

Figure 4K:
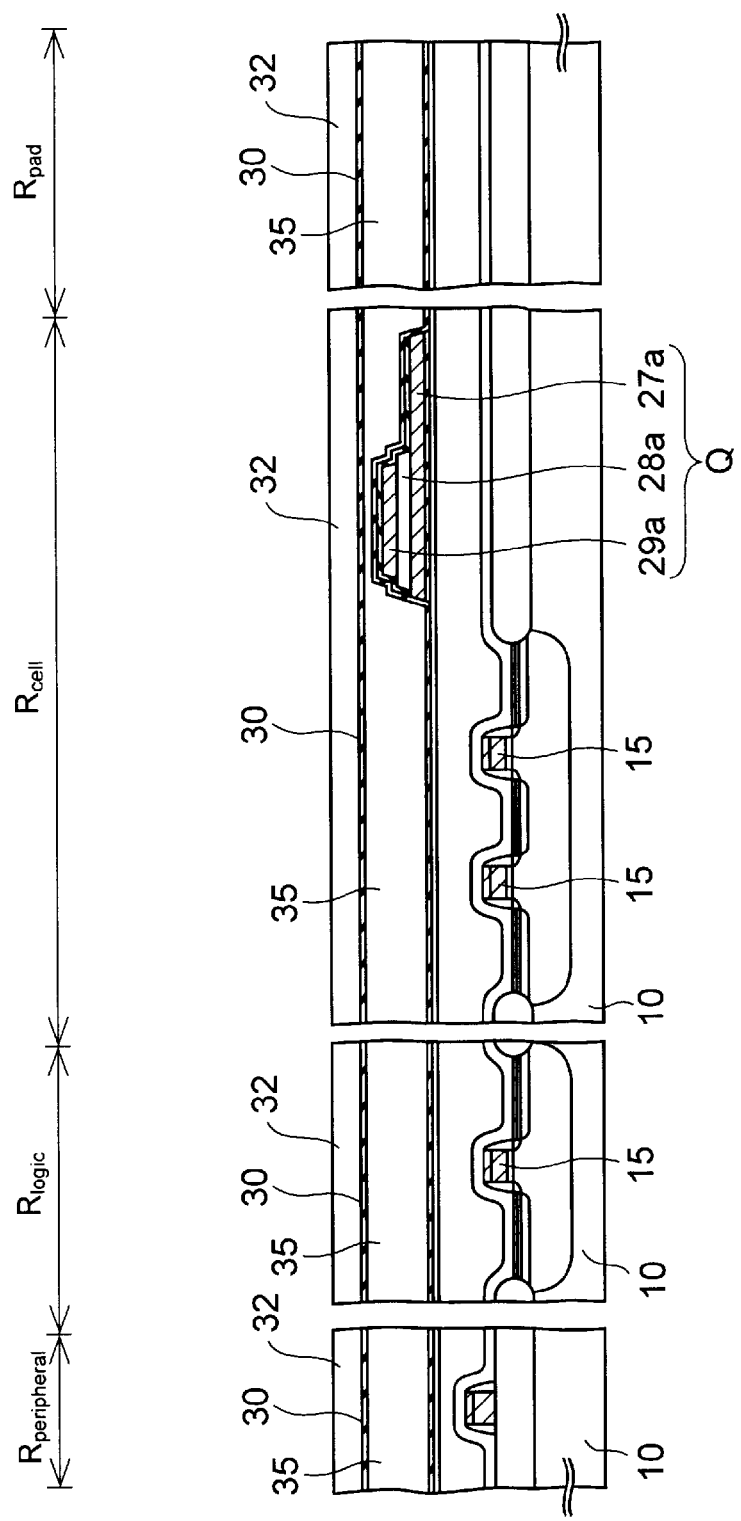

Thereafter, as depicted in FIG. 4K, a silicon oxide film is formed, as a second cap insulating film 32, with a thickness of approximately 200 nm to 300 nm by the plasma CVD method using the TEOS gas.

Figure 4L:
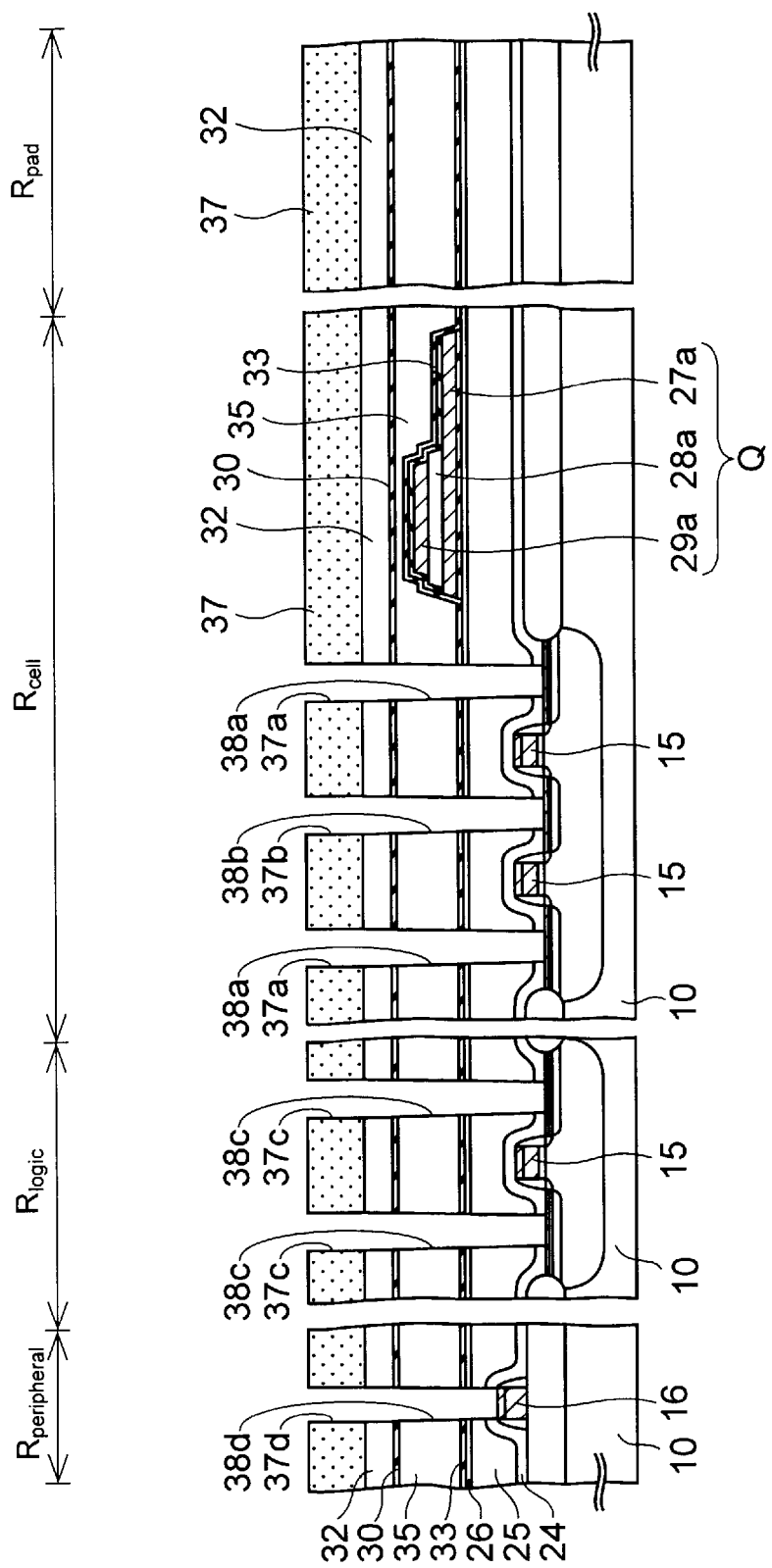

Next, processes for obtaining a cross-sectional structure depicted in FIG. 4L are described.

Firstly, a photoresist is applied on the second cap insulating film 32. The photoresist is then exposed and developed so as to form a first resist pattern 37 including first to fourth hole-shaped windows 37a to 37d.

Subsequently, by using the first resist pattern 37 as a mask, the films from the second cap insulating film 32 to the etching stopper film 24 are dry-etched, so that first to fourth contact holes 38a to 38d are formed in these insulating films under the first to fourth windows 37a to 37d, respectively.

This dry etching is performed by three-step etching in a parallel-plate plasma etching equipment (unillustrated). In the first-step etching, a mixed gas of $C_4F_8$, $O_2$, and Ar is used as an etching gas to etch the films from the second cap insulating film 32 to the base insulating film 25. This etching stops on the etching stopper film 24. Thus, the etching stopper film 24 is not etched.

In the following second step, a mixed gas of $O_2$ and Ar is used as an etching gas to remove, with the sputtering effects of these gases, etching products generated in the holes in the first step.

After that, in the third etching step, a mixed gas of $C_4F_8$, $CF_4$, $O_2$, and Ar is used as an etching gas to etch the etching stopper film 24.

After the above-described etching is finished, the first resist pattern 37 is removed.

Figure 4M:
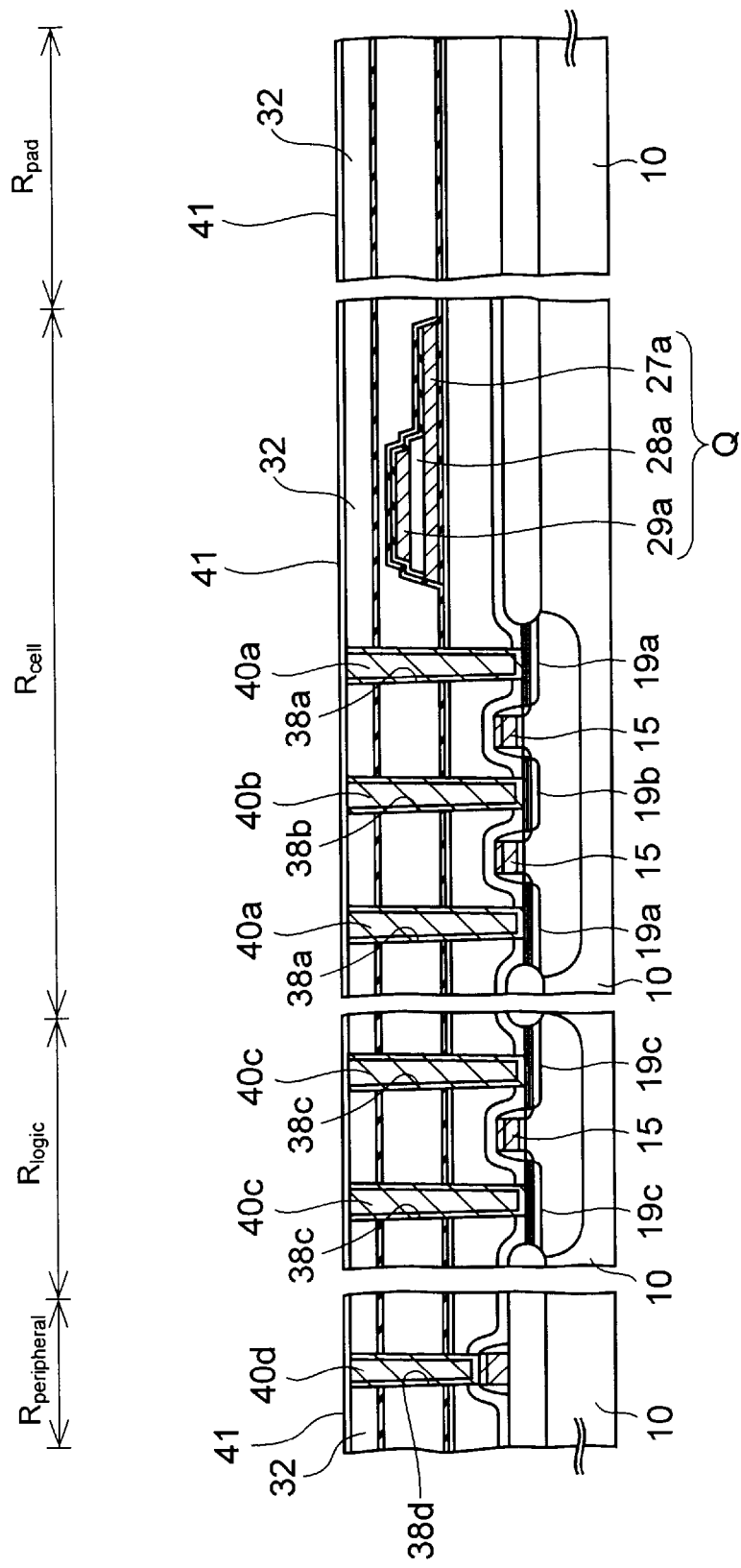

Next, processes for obtaining a cross-sectional structure depicted in FIG. 4M are described.

Firstly, by the sputtering method, a titanium (Ti) film and a titanium nitride (TiN) film are formed respectively with thicknesses of 20 nm and 50 nm on the inner surfaces of the first to fourth contact holes 38a to 38d and on the upper surface of the second cap insulating film 32. These films each serve as a glue film. After that, a tungsten film is formed with a thickness of 500 nm on the glue films by a CVD method using a tungsten hexafluoride gas. The first to fourth contact holes 38a to 38d are completely filled with this tungsten film.

Thereafter, the unnecessary glue film and the tungsten film formed on the second cap insulating film 32 are polished and removed by the CMP method, so that the glue film and the tungsten film are left only inside the first to fourth contact holes 38a to 38d as first to fourth conductive plugs 40a to 40d, respectively.

Among these conductive plugs, the first and second conductive plugs 40a and 40b formed in the cell region $R_{cell}$ are electrically connected to the first and second source/drain regions 19a and 19b, respectively. On the other hand, the third conductive plugs 40c formed in the logic circuit region $R_{logic}$ are electrically connected to the third source/drain regions 19c. In addition, the fourth conductive plug 40d formed in the peripheral circuit region $R_{peripheral}$ is electrically connected to the interconnection 16.

Note that the $N_2O$ plasma processing using CVD equipment may be performed on the second cap insulating film 32 after the formation of the first to fourth conductive plugs 40a to 40d so as to dehydrate the second cap insulating film 32 and to prevent re-adsorption of moisture therein. The dehydration processing is performed under conditions of the substrate temperature of 350° C. and the processing time of 2 minutes, for example.

Meanwhile, the first to fourth conductive plugs 40a to 40d are mainly made of tungsten, which is oxidized very easily, thereby being easily oxidized in an oxygen-containing atmosphere. Thus, there is a possibility of causing contact failure.

To deal with problem, for the purpose of preventing these first to fourth conductive plugs 40a to 40d from being oxidized, a silicon oxynitride film is formed, as an oxidation preventive insulation film 41, by the CVD method with a thickness of approximately 100 nm on each of the upper surfaces of these plugs and the second cap insulating film 32.

Figure 4N:
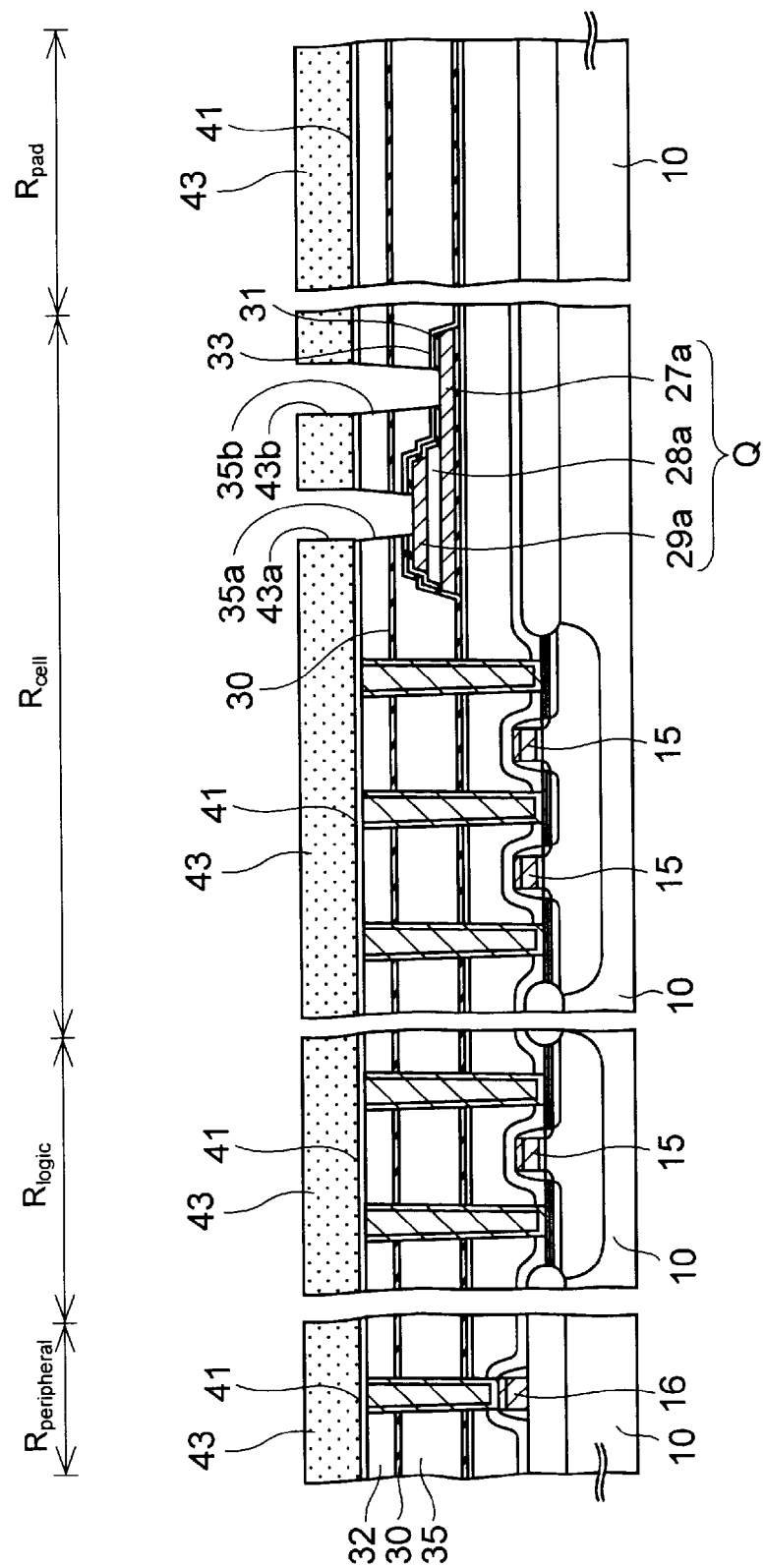
Figure 40:
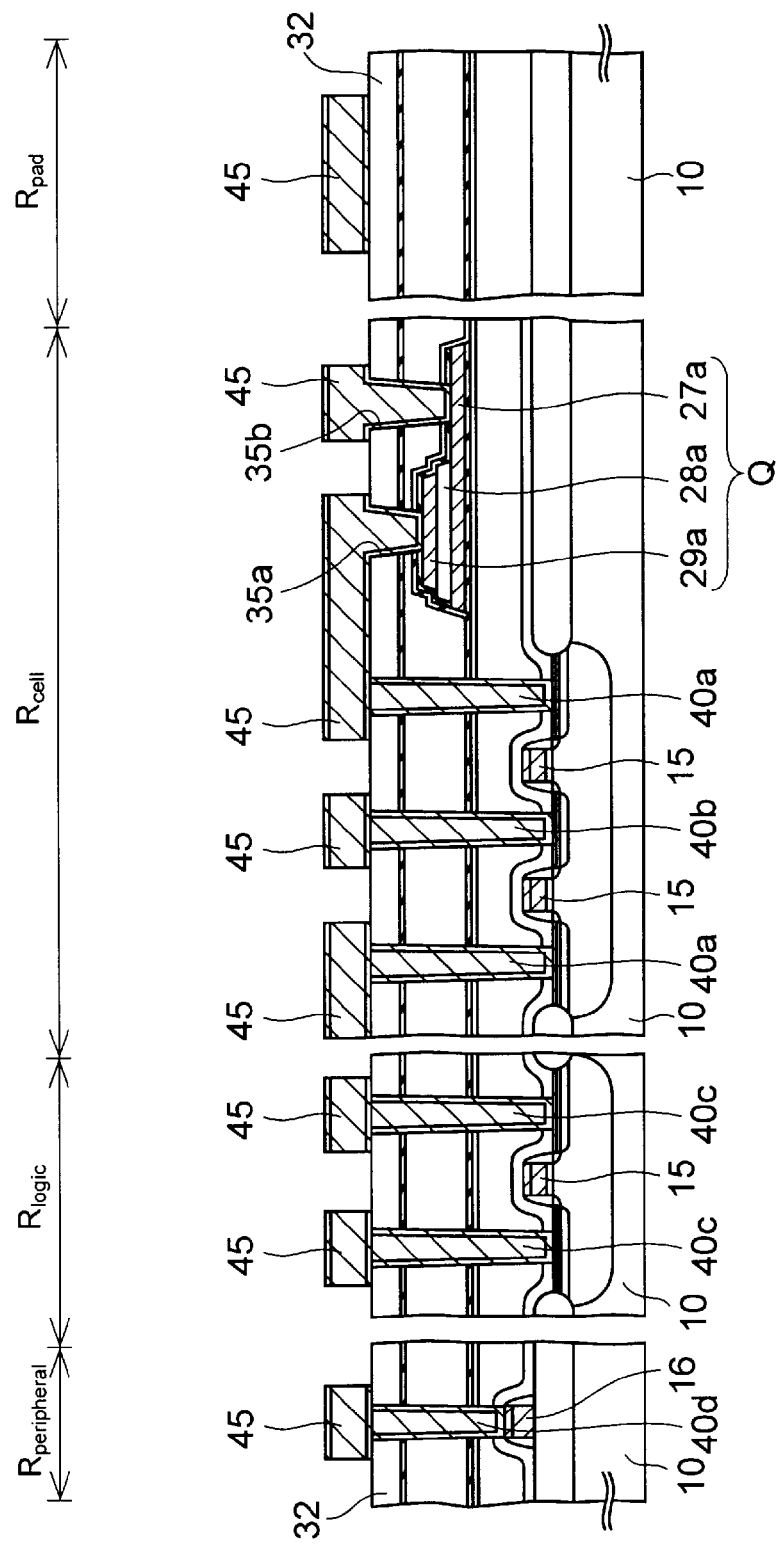

Next, processes for obtaining a cross-sectional structure depicted in FIG. 4N are described.

Firstly, a photoresist is applied on the oxidation preventive insulation film 41. The photoresist is then exposed and developed, so as to form a second resist pattern 43. As depicted in FIG. 4N, in the second resist pattern 43 over each of the upper electrode 29a and the lower electrode 27a, fifth and sixth hole-shaped windows 43a and 43b are formed.

Subsequently, by using the second resist pattern 43 as a mask, the oxidation preventive insulation film 41, the second cap insulating film 32, the first interlayer insulating film 35, and the first to third capacitor protection insulating films 31, 33, and 30 are etched, so that a first hole 35a is formed on the upper electrode 29a and a second hole 35b is formed on the contact region of the lower electrode 27a.

After that, the second resist pattern 43 is removed. Thereafter, to recover damages received by the capacitor dielectric film 28a during the processes so far, recovery annealing is performed on the capacitor dielectric film 28a by putting the silicon substrate 10 in a vertical furnace being filled with an oxygen-containing atmosphere, under the conditions of the substrate temperature of 500° C. and the processing time of 60 minutes. The flow rate of oxygen at that time is set to, for example, 20 liters per minute.

After that, the oxidation preventive insulation film 41 is etched back and removed.

Next, processes for obtaining a cross-sectional structure depicted in FIG. 4O are described.

Firstly, by the sputtering method, a metal stacked film is formed on each of the upper surfaces of the second cap insulating film 32, the first to fourth conductive plugs 40a to 40d, and on the inner surfaces of the first and second holes 35a and 35b. In the present embodiment, as the metal stacked film, a titanium nitride film with a thickness of approximately 150 nm, a copper-containing aluminum film with a thickness of approximately 550 nm, a titanium film with a thickness of approximately 5 nm, and a titanium nitride film with a thickness of approximately 150 nm are formed in this order.

After that, this metal stacked film is patterned by photolithography to form first metal interconnections 45 on the second cap insulating film 32. Among these first metal interconnections 45, ones formed on the capacitor Q are electrically connected to the upper electrode 29a and the lower electrode 27a through the first and second holes 35a and 35b, respectively.

Note that the first metal interconnections 45 formed in the first and second holes 35a and 35b play a role of conductive plugs.

Figure 4P:
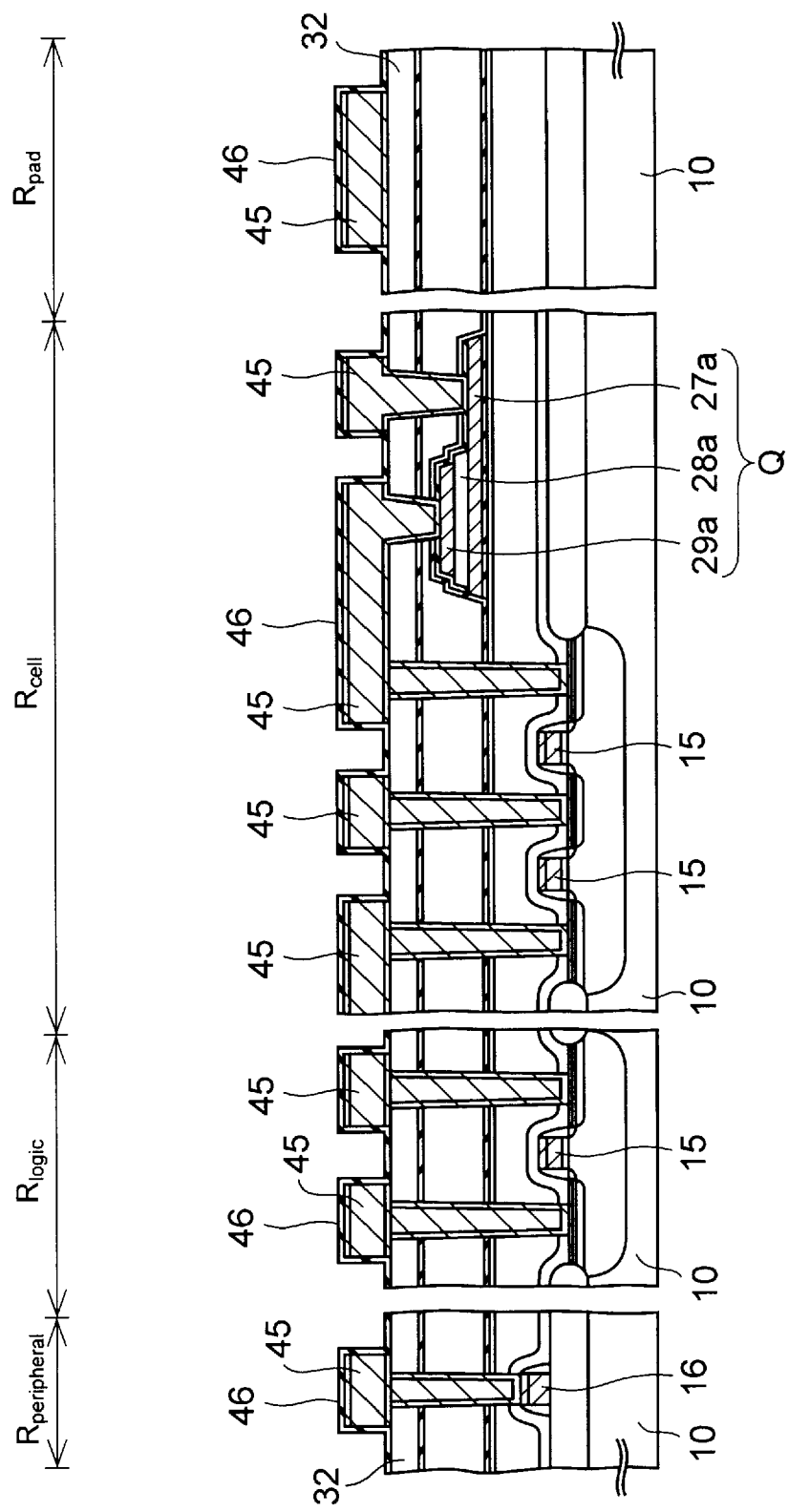

Subsequently, as depicted in FIG. 4P, an alumina film is formed, as a fourth capacitor protection insulating film 46 covering the first metal interconnections 45 and the second cap insulating film 32, by the sputtering method with a thickness of approximately 20 nm.

The fourth capacitor protection insulating film 46 has a function to protect the capacitor dielectric film 28a by blocking reducing materials such as hydrogen and moisture. Films having such a function include a titanium oxide film, a zirconium oxide film, a magnesium oxide film, and a titanium magnesium oxide film in addition to the alumina film. Any one of these films may be formed as the fourth capacitor protection insulating film 46.

Note that, if the capacitor dielectric film 28a is not deteriorated even when the fourth capacitor protection insulating film 46 is not formed, the fourth capacitor protection insulating film 46 may be omitted.

Figure 4Q:
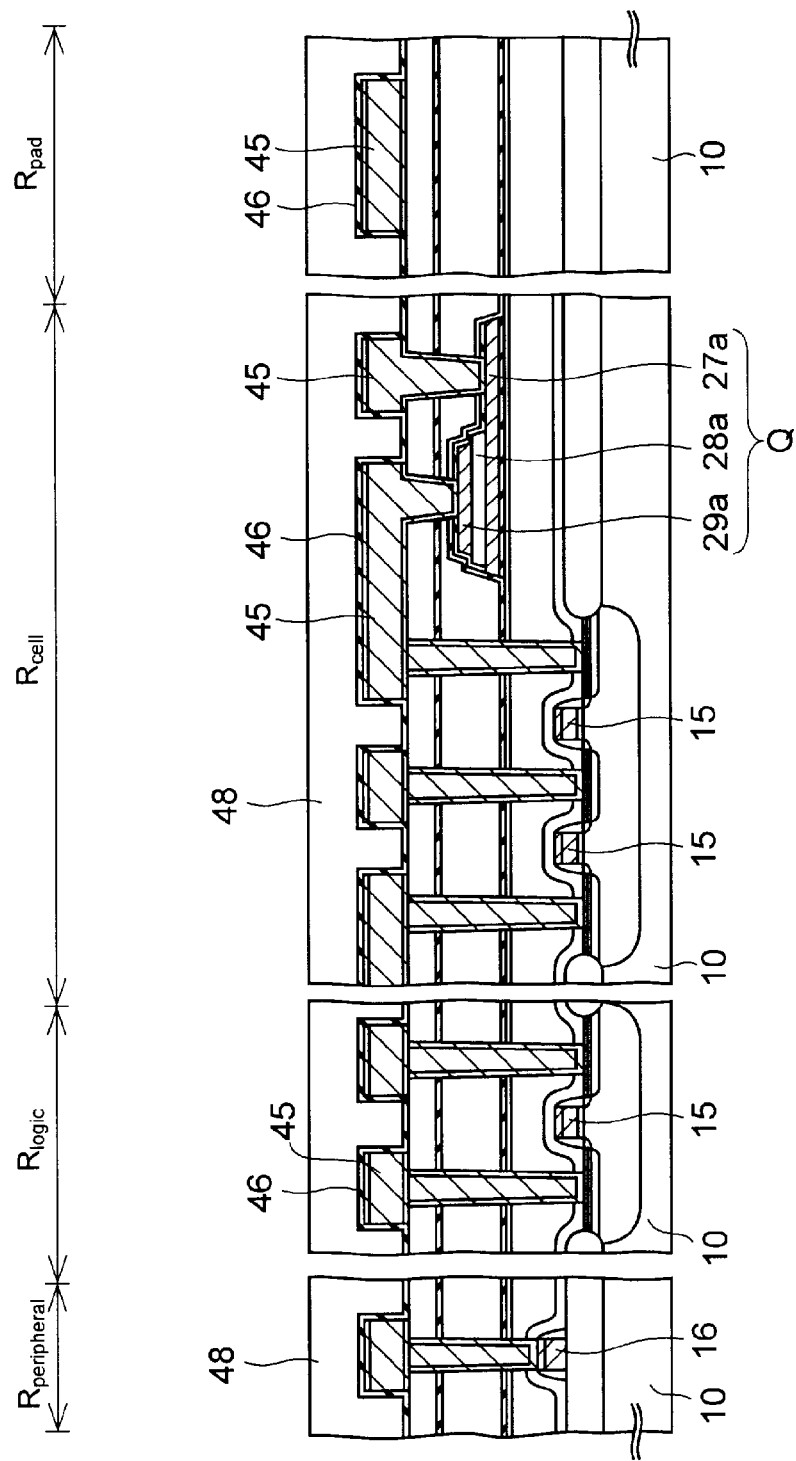

Next, as depicted in FIG. 4Q, by a plasma CVD method using the TEOS gas and oxygen as reaction gases, a silicon oxide film is formed on the fourth capacitor protection insulating film 46. The resultant silicon oxide film serves as a second interlayer insulating film 48. The thickness of this second interlayer insulating film 48 on the first metal interconnection 45 is, for example, approximately 2600 nm.

After that, the upper surface of the second interlayer insulating film 48 is polished by the CMP in order to planarize the upper surface thereof.

Figure 4R:
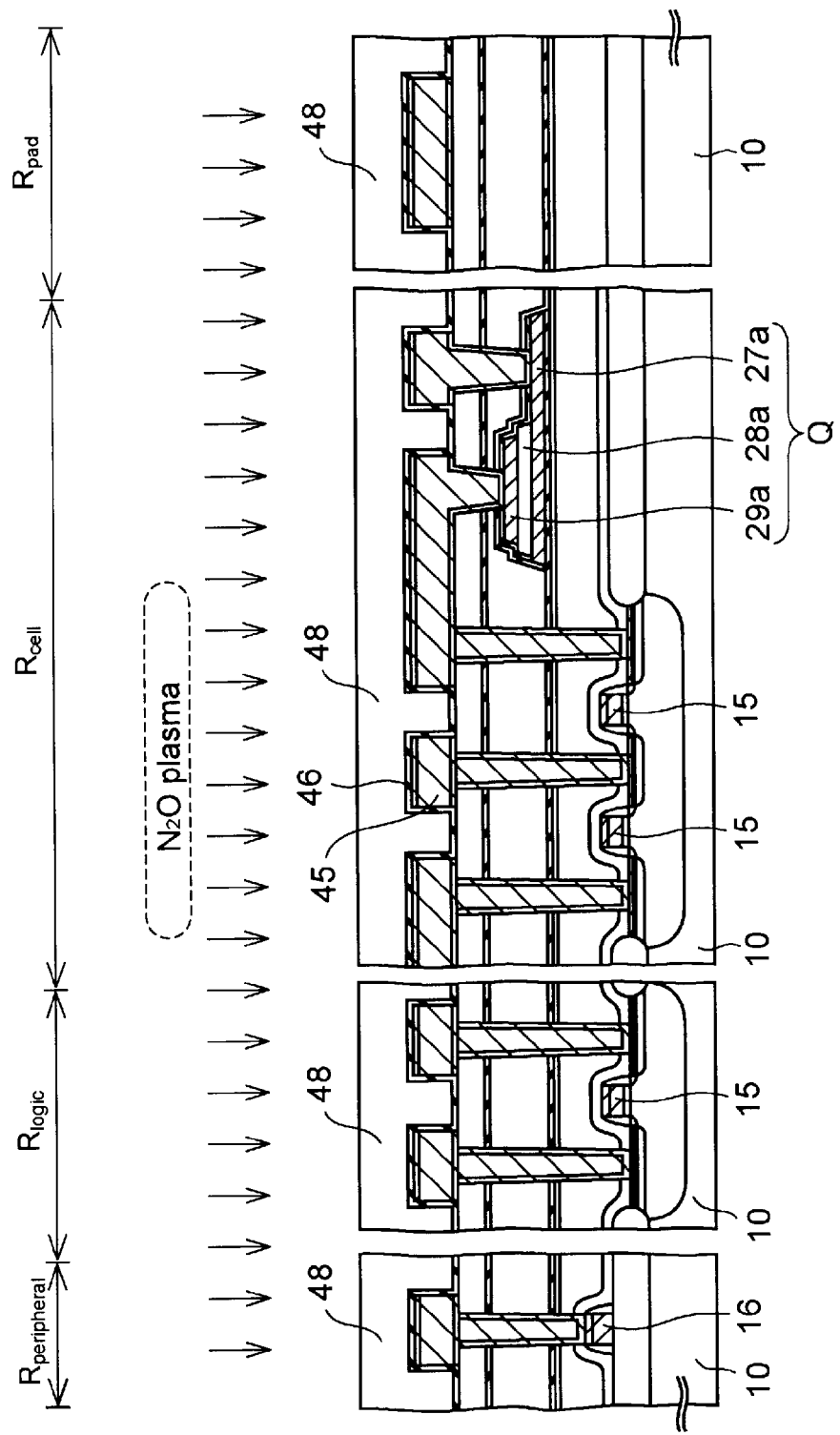

Next, as depicted in FIG. 4R, the $N_2O$ plasma processing is performed on the surface of the second interlayer insulating film 48 in CVD equipment under conditions of the substrate temperature of approximately 350° C. and the processing time of approximately 4 minutes. Such $N_2O$ plasma processing dehydrates the second interlayer insulating film 48 and nitrides the surface thereof. Accordingly, a silicon oxide in the second interlayer insulating film 48 having a high affinity for water is prevented from absorbing moisture.

Note that, in place of the $N_2O$ plasma processing, $NH_3$ plasma processing at the substrate temperature of 350° C. and for the processing time of 10 minutes may be performed.

Figure 4S:
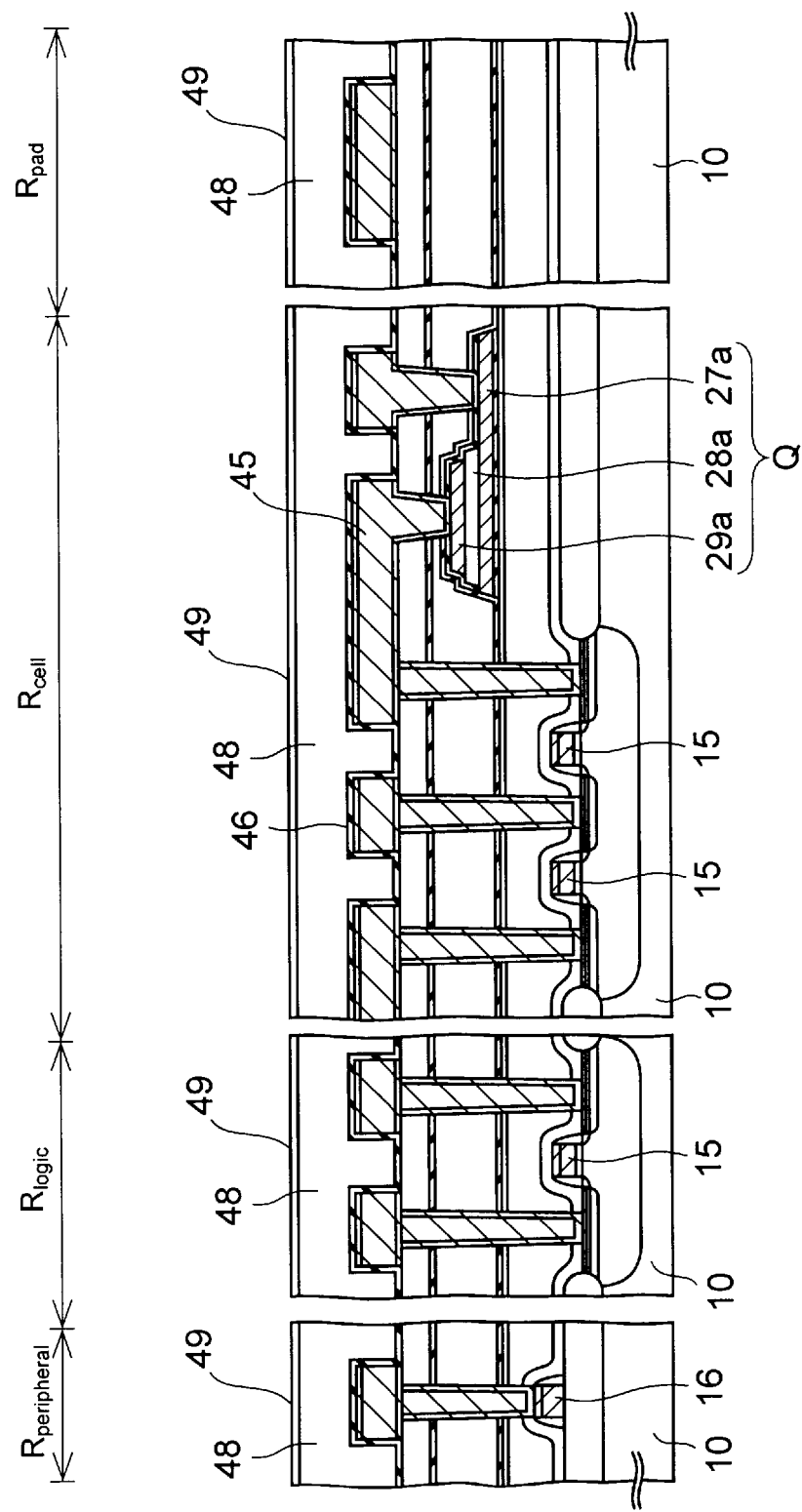

Next, as depicted in FIG. 4S, as a third cap insulating film 49, a silicon oxide film is formed with a thickness of approximately 100 nm on the second interlayer insulating film 48 by the plasma CVD method using the TEOS gas.

Here, microscratches are formed in the upper surface of the second interlayer insulating film 48 during the CMP (see FIG. 4Q) when the upper surface of the second interlayer insulating film 48 comes in contact with a pad in CMP equipment. The above-described third cap insulating film 49 plays a role of filling the microscratches so as to planarize the upper surface of the second interlayer insulating film 48.

Figure 4T:
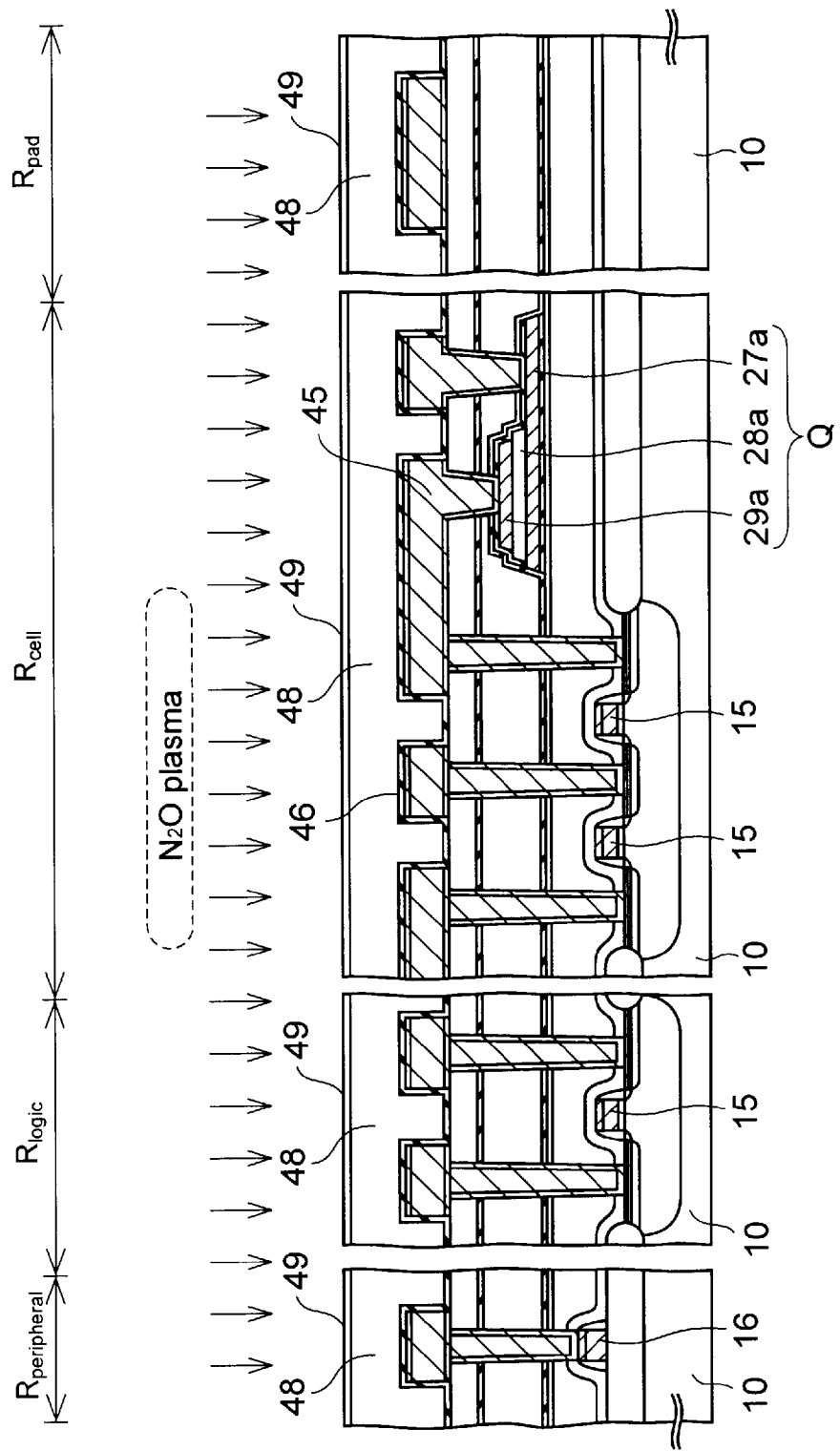

Subsequently, as depicted in FIG. 4T, the $N_2O$ plasma processing is performed on the third cap insulating film 49 in CVD equipment, so that the cap insulating film 49 is dehydrated and the surface thereof is nitrided to prevent moisture from being re-adsorbed. This $N_2O$ plasma processing is performed under conditions of, for example, the substrate temperature of 350° C. and the processing time of 2 minutes.

Figure 4U:
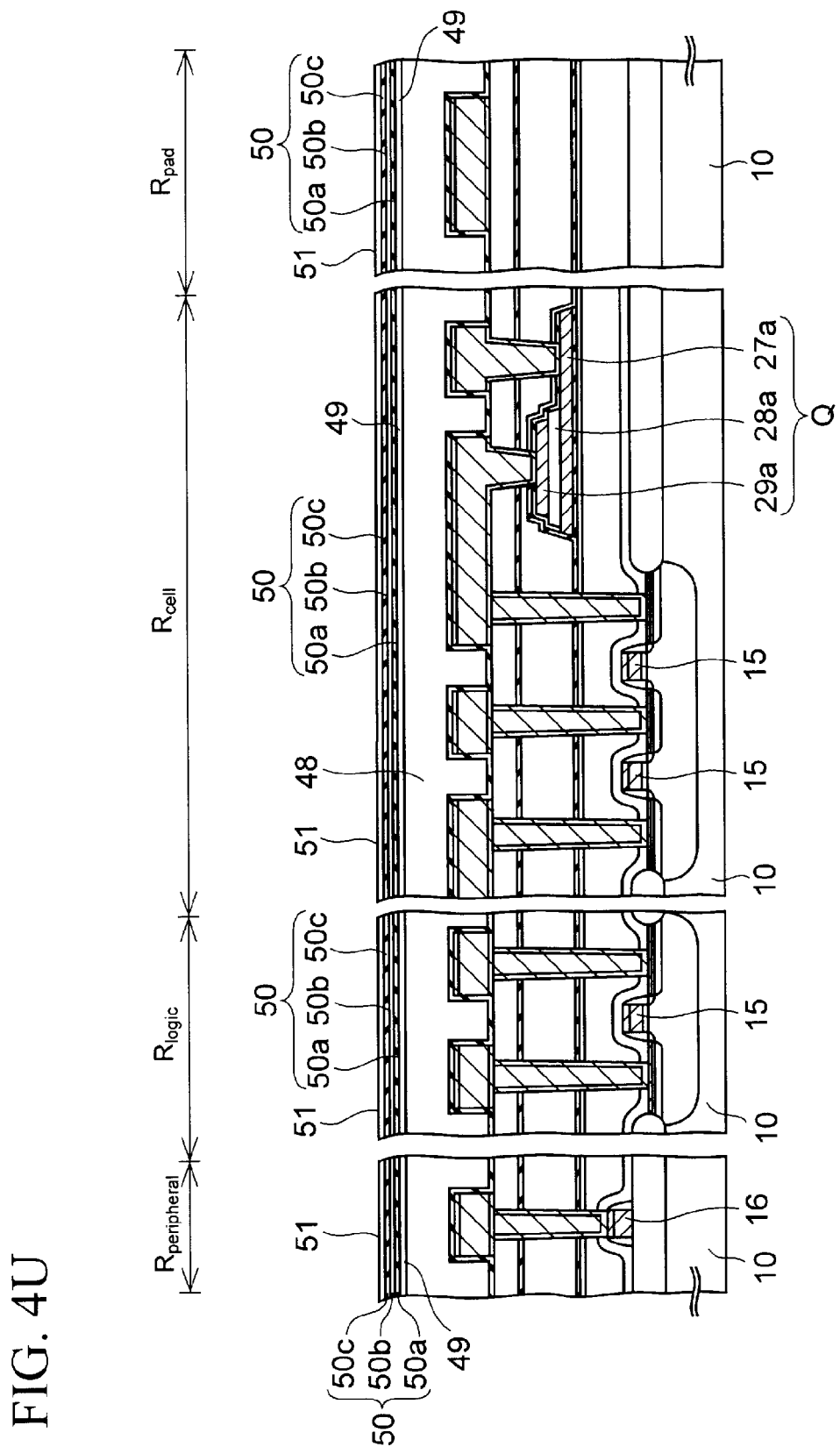

Next, processes for obtaining a cross-sectional structure depicted in FIG. 4U are described.

Firstly, as a first insulating metal oxide film 50a for protecting the capacitor dielectric film 28a from reducing materials, an alumina film which is excellent in blocking against the reducing materials such as hydrogen and moisture, is formed with a thickness of approximately 20 nm on the third cap insulating film 49.

Note that the first insulating metal oxide film 50a is not limited to the alumina film as long as it is an insulating film having properties to block hydrogen and moisture. Such insulating films include a titanium oxide film, a zirconium oxide film, a magnesium oxide film, and a titanium magnesium oxide film in addition to the alumina film.

The cap insulating film 49 is already sufficiently dehydrated by the $N_2O$ plasma processing as described above. Accordingly, when the first insulating metal oxide film 50a is formed by the sputtering method, the capacitor Q is not steamed by moisture contained in the cap insulating film 49, and thus the capacitor dielectric film 28a can be prevented from being deteriorated by the moisture.

Next, an intermediate insulating film 50b having a low dielectric constant is formed with a thickness of approximately 50 nm on the first insulating metal oxide film 50a.

This intermediate insulating film 50b is made of a material having a relative dielectric constant lower than that of silicon oxide constituting the second interlayer insulating film 48 whose relative dielectric constant is approximately 3.8 to 4.2.

As such a material having a low dielectric constant, there is nano-clustering silica (NCS) being a porous silica-based material which can be formed by a coating method, for example. The relative dielectric constant of nano-clustering silica is approximately 2.25, which is lower than the relative dielectric constant (3.8 to 4.2) of the second interlayer insulating film 43. Also, the coating method as a method for forming an insulating film is sometimes referred to as SOD (spin on dielectric) method.

Silicon oxide-based "Black Diamond" which is developed by Applied Materials Inc. can be also employed as a material for the intermediate insulating film 50b. The "Black Diamond" is formed by a CVD method using trimethylsilane as a film-forming gas and has a low relative dielectric constant of approximately 2.7.

Furthermore, the intermediate insulating film 50b may be made of porous MSQ (methyl silses quioxane) whose relative dielectric constant is 2.5 or less. This porous MSQ can be also formed in a film form by the coating method.

After that, as a second insulating metal oxide film 50c, an alumina film is formed with a thickness of approximately 20 nm on the intermediate insulating film 50b. Similar to the first insulating metal oxide film 50a, the second insulating metal oxide film 50c plays a role of stopping reducing materials such as hydrogen and moisture from entering the capacitor dielectric film 28a, thereby preventing the capacitor dielectric film 28a from being deteriorated.

Note that, in place of the alumina film, any one of a titanium oxide film, a zirconium oxide film, a magnesium oxide film, and a titanium magnesium oxide film may be formed as the second insulating metal oxide film 50c.

With the processes described above, a fifth capacitor protection insulating film 50 formed of the first and second insulating metal oxide films 50a and 50c and the intermediate insulating film 50b is formed on the third interlayer insulating film 49.

The intermediate insulating film 50b constituting the fifth capacitor protection insulating film 50 is made of a material having a relative dielectric constant lower than that of the second interlayer insulating film 48. Accordingly, the intermediate insulating film 50b has a smaller film stress and a smaller tensile stress than the silicon oxide films 221 and 223 (see FIG. 3) formed by the plasma CVD method. For this reason, the warpage of the silicon substrate 10 caused by the film stress as described in FIG. 3 can be prevented. Consequently, the capacitor Q, which is a piezoelectric element, can be prevented from being deteriorated by the stress.

In addition, the intermediate insulating film 50b has the thickness of approximately 50 nm, which is thinner than the second interlayer insulating film 48. Thus, the amount of moisture contained in the intermediate insulating film 50b at the time of film forming is very small. Accordingly, the intermediate insulating film 50b does not need the $N_2O$ plasma processing for dehydration (see FIG. 4R), which is performed on the second interlayer insulating film 48. Because the $N_2O$ plasma processing is omitted in this manner, there can be obtained an advantage that can reduce the number of processes as compared with the case where the $N_2O$ plasma processing is performed on the intermediate insulating film 50b.

However, when the intermediate insulating film 50b is exposed to an atmosphere for a long period of time, the amount of moisture in the intermediate insulating film 50b increases by moisture absorption. Accordingly, to prevent the intermediate insulating film 50b from absorbing moisture, it is preferable that a subsequent process be performed within 12 hours as much as possible after the intermediate insulating film 50b is formed.

Figure 10:
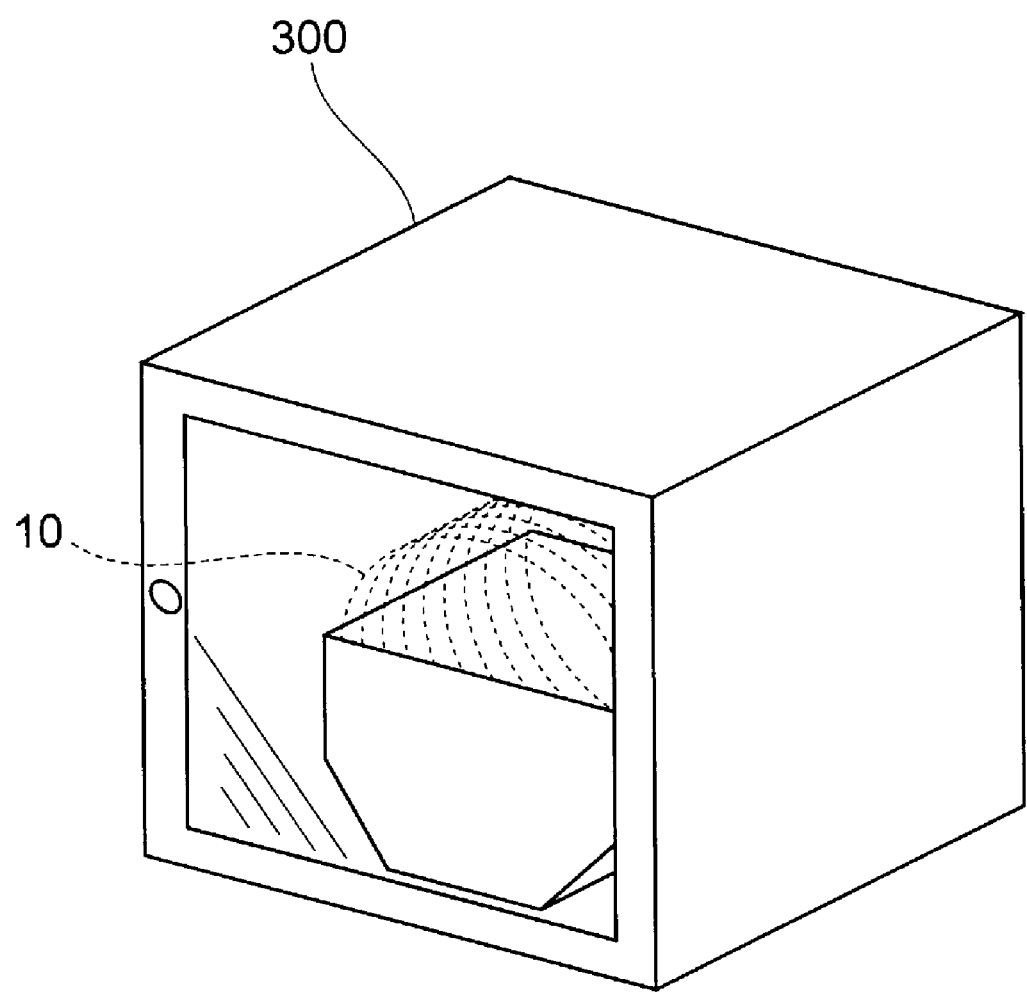
FIG. 10 is a perspective view of a sealed container used in each embodiment of the present invention.

Note that, if it takes a predetermined period of time, for example, 12 hours or longer before the subsequent process is performed due to manufacturing reasons, it is preferable that the silicon substrate 10 be stored in a sealed container depicted in FIG. 10 after the intermediate insulating film 50b is formed.

In the sealed container 300, the substrate temperature is maintained so as to be higher than the room temperature. In addition, an inert gas, such as nitrogen, whose pressure is higher than the atmospheric pressure is supplied into the container. By setting the substrate temperature to be high as described above, the intermediate insulating film 50b can be prevented from absorbing moisture. Furthermore, the container has a higher pressure therein than the atmospheric pressure, and thus an outer atmosphere does not enter the inside of the container. For this reason, there is no chance for the intermediate insulating film 50b to come in contact with moisture contained in the atmosphere.

Thereafter, by the plasma CVD method using the TEOS gas, a silicon oxide film is formed, as a cover insulating film 51, with a thickness of approximately 100 nm on the fifth capacitor protection insulating film 50. The amount of moisture in the cover insulating film 51 is small because the cover insulating film 51 has the small thickness of approximately 100 nm. Therefore, there is no need to perform the dehydration processing using $N_2O$ plasmas on the cover insulating film 51 so that the capacitor Q may not be unnecessarily damaged. When the $N_2O$ plasma processing is omitted in this manner, the number of processes can be reduced as compared with the case where the $N_2O$ plasma processing is performed on the cover insulating film 51.

However, similar to the intermediate insulating film 50b, when the cover insulating film 51 is left in an atmosphere over a long period of time, the cover insulating film 51 absorbs moisture. For this reason, in order to prevent the cover insulating film 51 from absorbing moisture, it is preferable that the subsequent process be performed within 12 hours as much as possible after the cover insulating film 51 is formed.

Note that, if it is required to take 12 hours or longer before the subsequent process is performed due to manufacturing reasons, it is preferable that the silicon substrate 10 be stored in the sealed container 300 described in FIG. 10 after the cover insulating film 51 is formed, in order to prevent the cover insulating film 51 from absorbing moisture.

Figure 4V:
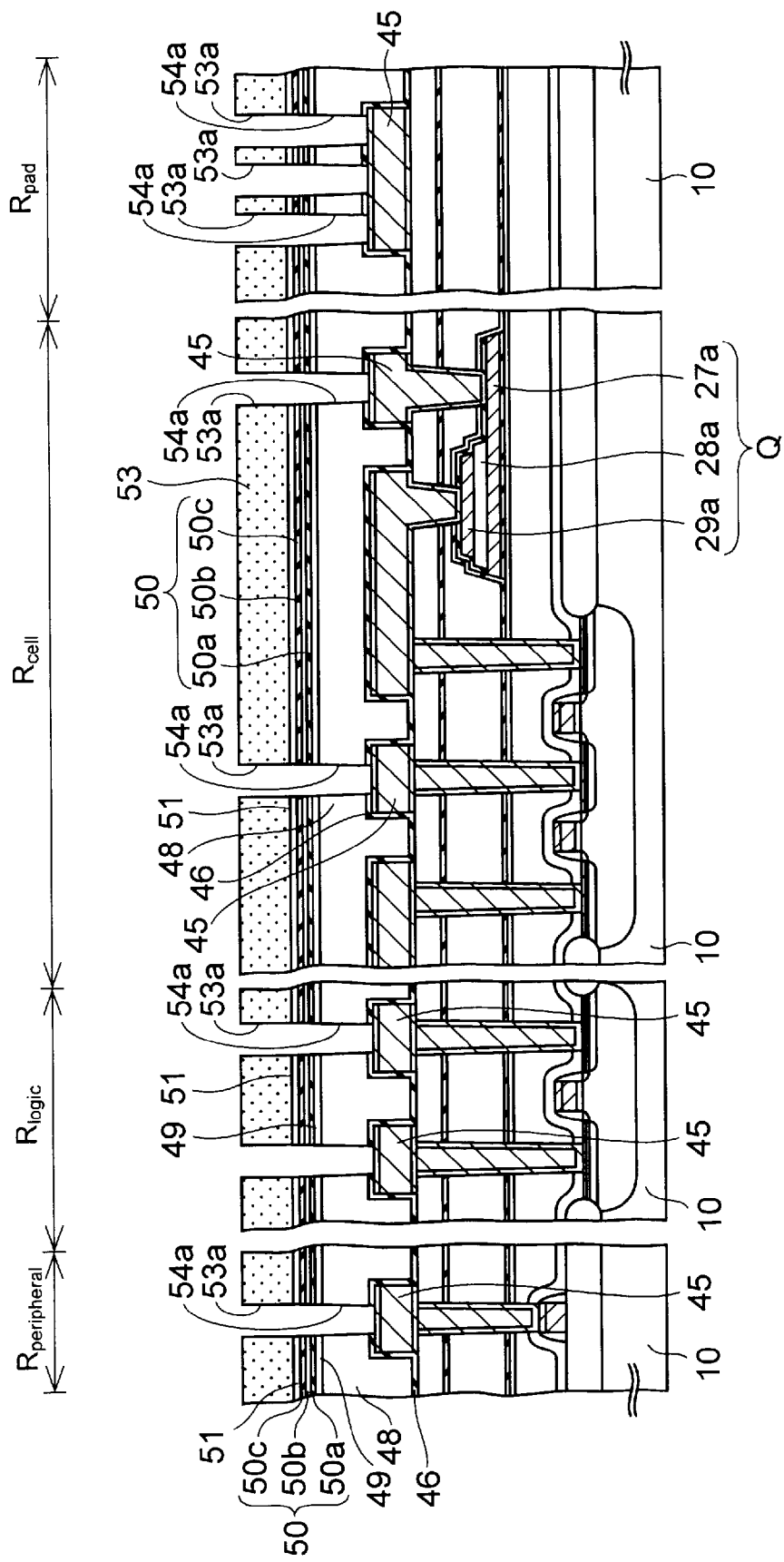

Next, processes for obtaining a cross-sectional structure depicted in FIG. 4V are described.

Firstly, a photoresist is applied on the cover insulating film 51. The photoresist is then exposed and developed, so as to form a third resist pattern 53 including seventh hole-shaped windows 53a over first metal interconnections 45.

Subsequently, the individual insulating films 46 and 48 to 51 under the seventh windows 53a are etched by using a parallel-plate plasma etching chamber (unillustrated) using the mixed gas of $C_4F_8$, Ar, and $O_2$ as an etching gas, so that third holes 54a are formed on the first metal interconnections 45.

Here, similar to the second interlayer insulating film 48, the intermediate insulating film 50b constituting the fifth capacitor protection insulating film 50 is made of a silicon oxide-based material. Accordingly, in this etching, there is not generated a substantial difference in etching rate between the intermediate insulating film 50b and the second interlayer insulating film 48. Thus, as compared with the example of FIG. 1 in which a silicon nitride film functioning as a stopper during the etching of the silicon oxide film is used as a capacitor protection insulating film, third holes 54a can be opened in a short period of time. In addition, there is hardly generated a difference between the upper-end and lower-end diameters of each third hole 54a. Thus, each third hole 54a can be formed in a fine circular planer shape.

After the etching is finished, the third resist pattern 53 is removed.

Note that the first and second insulating metal oxide films 50a and 50c are etched by the sputtering effect, rather than the chemical reaction of the etching gas. Thus, if the total film thickness of these insulating metal oxide films 50a and 50c is too thick, the etching of the third holes 54a becomes difficult.

For this reason, to facilitate the formation of the third holes 54a by etching, it is preferable that the total film thicknesses of the first and second insulating metal oxide films 50a and 50c be less than 100 nm, and more preferably at least 20 nm but no more than 50 nm. Here, the reason why the lower limit of the total film thickness is set to 20 nm is that, if it is thinner than 20 nm, the blocking capability of the first and second insulating metal oxide films 50a and 50c against the reducing materials cannot sufficiently exhibit.

Figure 4W:
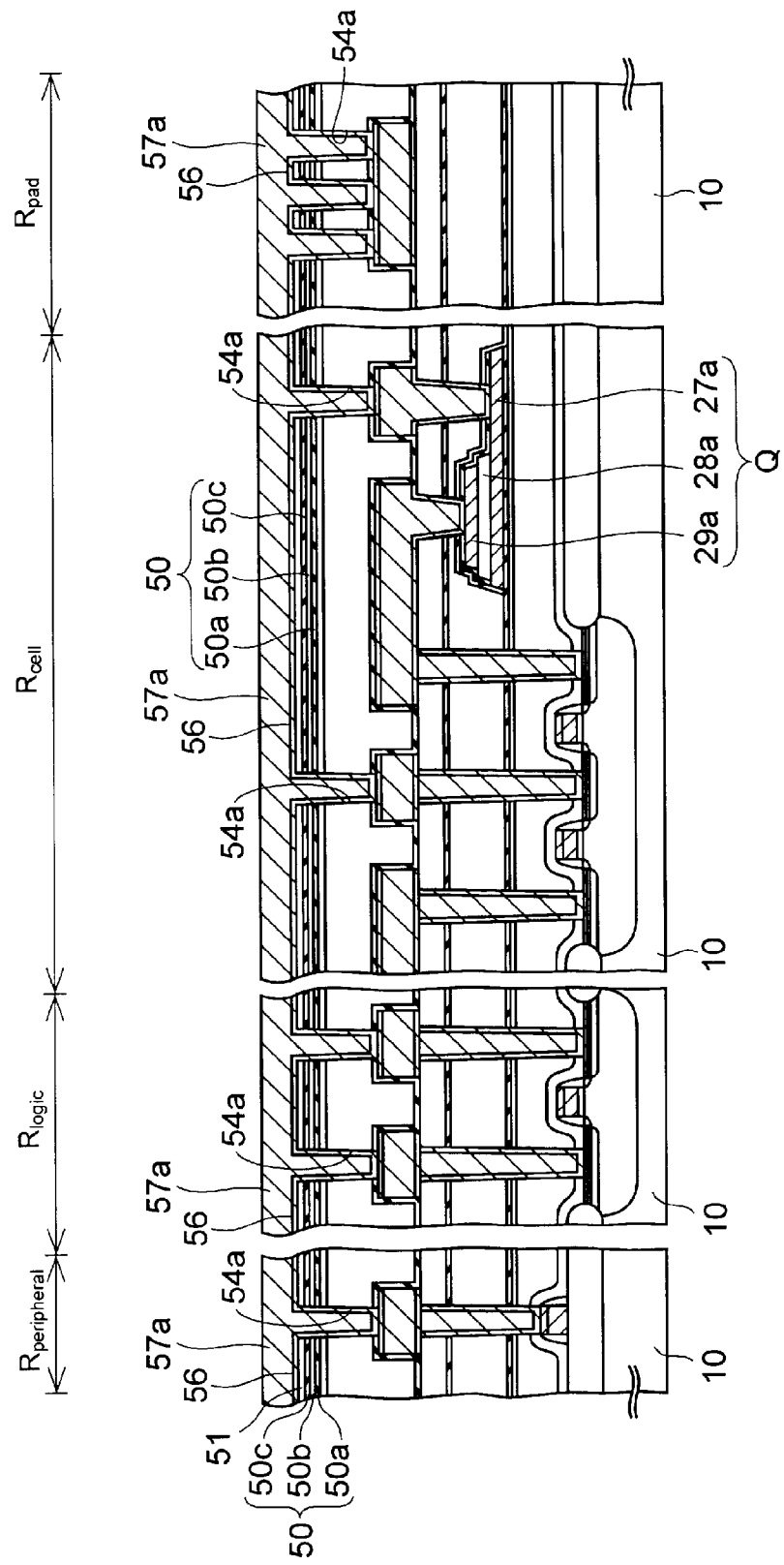

Next, as depicted in FIG. 4W, with the substrate temperature maintained at approximately 200° C., a titanium nitride film is formed with a thickness of approximately 150 nm on the inner surface of each third hole 54a and on the upper surface of the cover insulating film 51 by the sputtering method. The resultant film serves as a first glue film 56.

Subsequently, by the plasma CVD method using the tungsten hexafluoride gas, a tungsten film 57a is formed on the first glue film 56 with a thickness large enough to completely fill the third holes 54a, for example, with a thickness of approximately 650 nm.

Figure 4X:
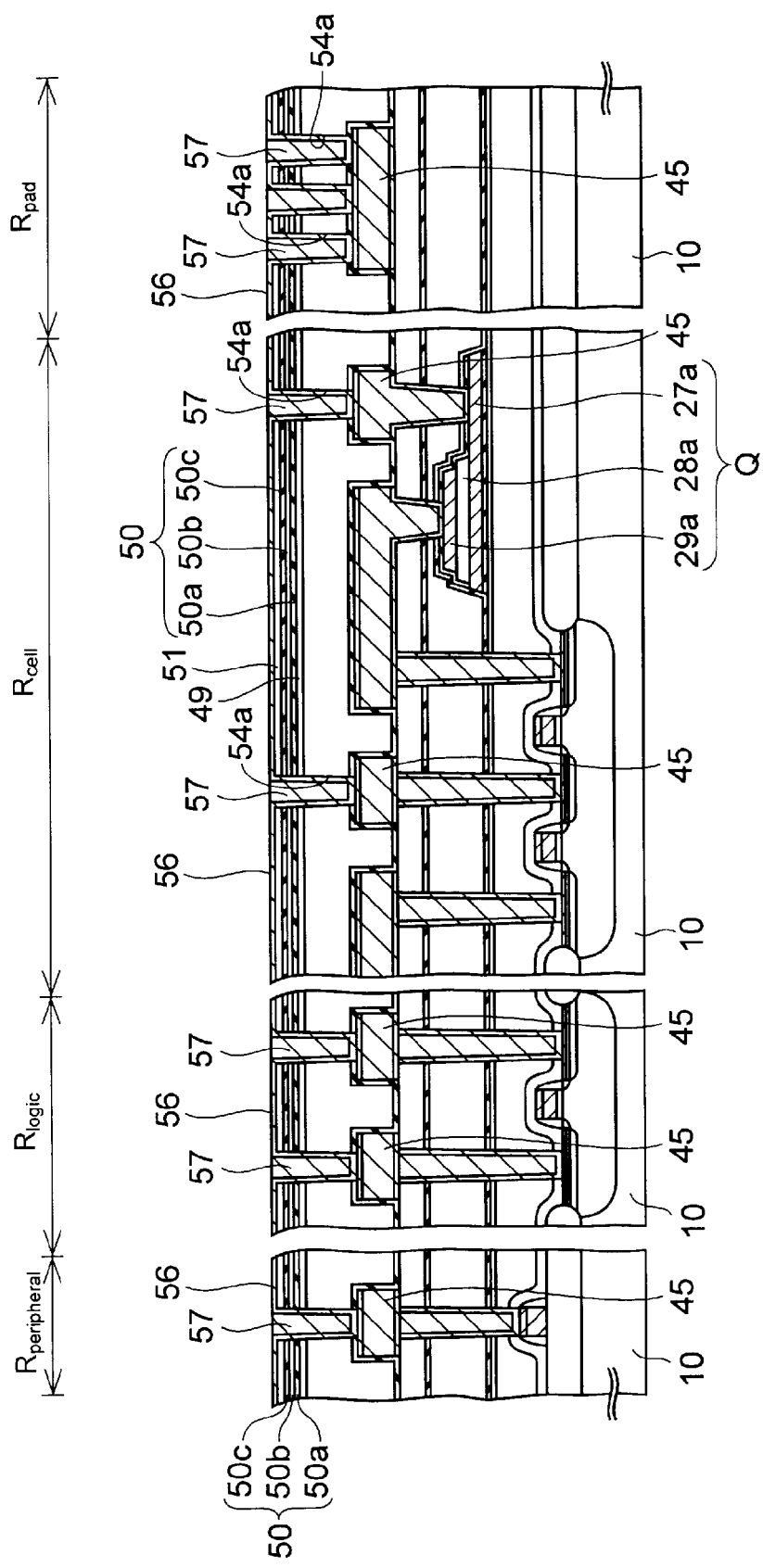

After that, as depicted in FIG. 4X, the tungsten film 57a is etched back to be removed from the upper surface of the cover insulating film 51 and be left only in the third holes 54a. Consequently, fifth conductive plugs 57, which are electrically connected to the first metal interconnections 45 and are mainly made of tungsten, are formed respectively in the third holes 54a.

Incidentally, in this example, the tungsten film is etched back. However, in place of the etching-back, the CMP may be employed.

As described above, each third hole 54a can be opened in a fine shape during the etching process in FIG. 4V. Accordingly, the fifth conductive plugs 57 are connected, at the lower ends of the respective holes 54a, to the first metal interconnections 45 in wide contact areas, so that a contact resistance of each fifth conductive plug 57 can be stabilized.

Figure 4Y:
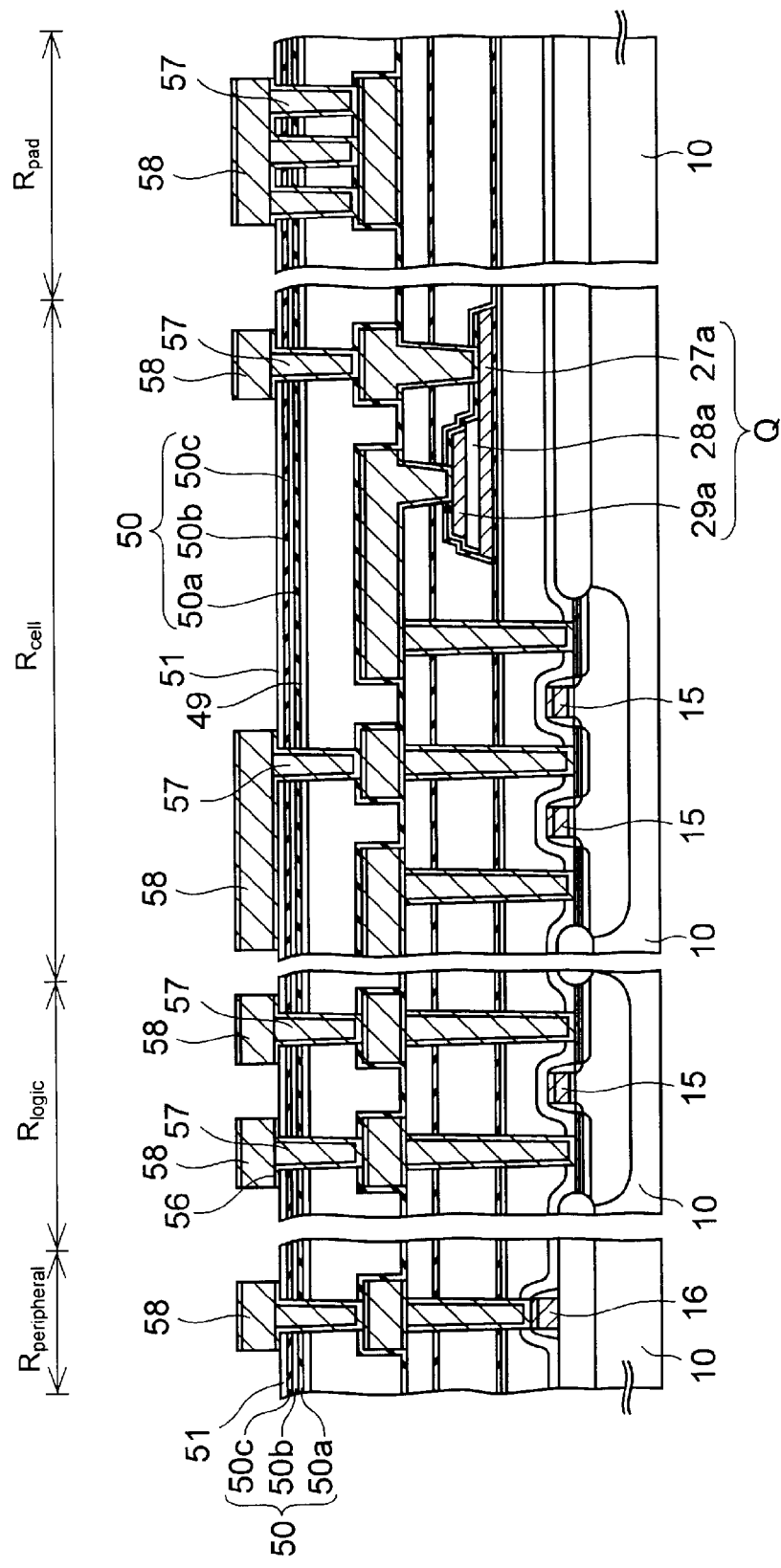

Next, processes for obtaining a cross-sectional structure depicted in FIG. 4Y are described.

Firstly, a metal stacked film is formed by the sputtering method on each of the upper surfaces of the fifth conductive plugs 57 and the first glue film 56. The metal stacked film includes, for example, from the bottom thereof, a copper-containing aluminum film with a thickness of approximately 550 nm, a titanium film with a thickness of approximately 5 nm, and a titanium nitride film with a thickness of approximately 150 nm.

After that, the metal stacked film and the first glue film 56 are patterned by photolithography to form second metal interconnections 58 each formed of these films, on the cover insulating film 51.

In this patterning, over etching is performed for the metal stacked film and the first glue film 56, so that a residual film is not generated on the cover insulating film 51.

Even if the over etching is performed in this manner, the film thickness of the fifth capacitor protection insulating film 50 is prevented from becoming thin by being etched during the patterning because the fifth capacitor protection insulating film 50 is covered with the cover insulating film 51. For this reason, the thickness of the fifth capacitor protection insulating film 50 can be sufficiently maintained even after the above patterning is finished. Thus, the fifth capacitor protection insulating film 50 can effectively block a reducing material such as hydrogen.

Figure 4Z:
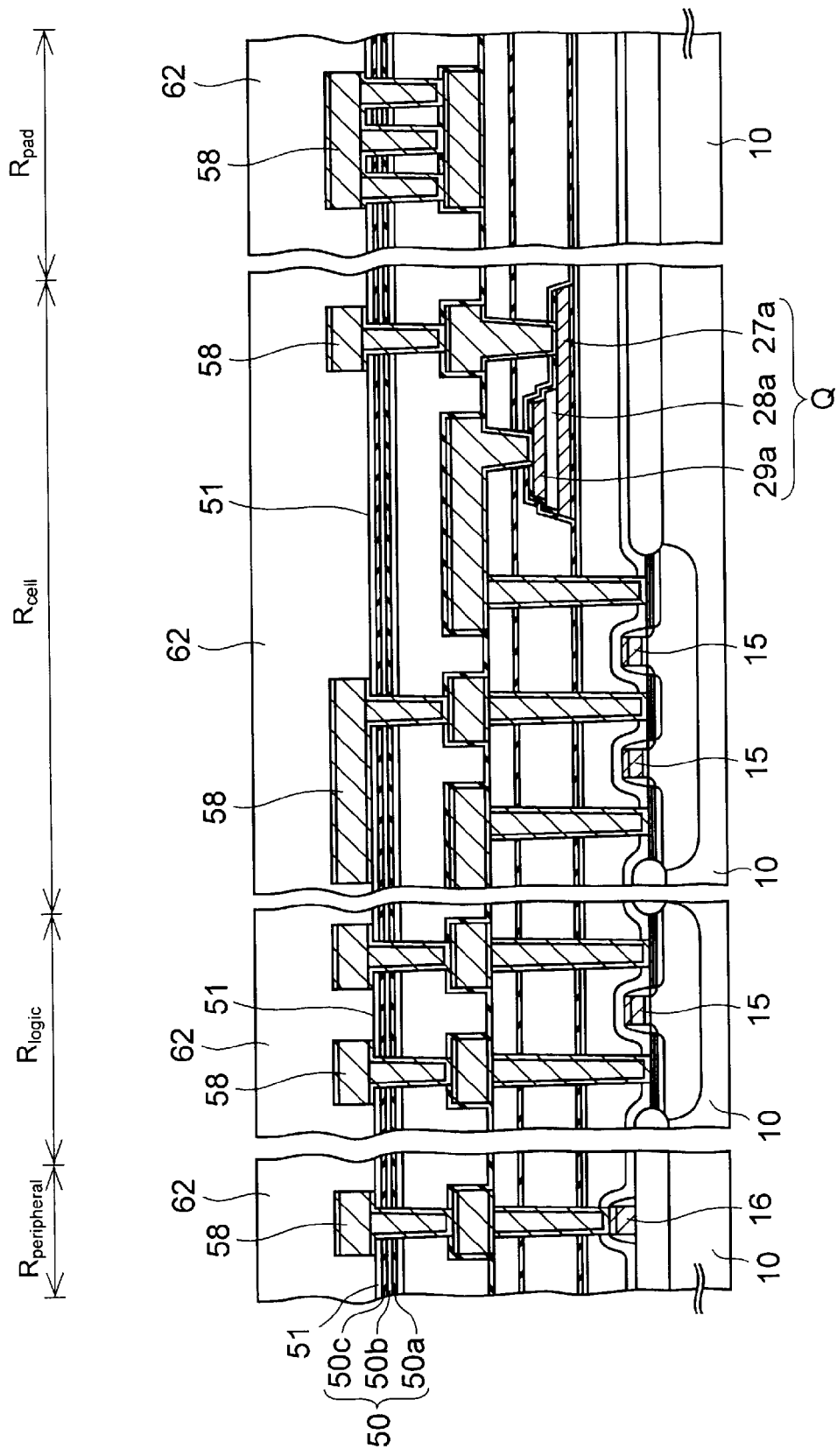

Subsequently, as depicted in FIG. 4Z, by the plasma CVD method using the mixed gas of the TEOS gas and oxygen, a silicon oxide film is formed with a thickness of approximately 2200 nm on each of the cover insulating film 51 and the second metal interconnections 58. The resultant silicon oxide film serves as a third interlayer insulating film 62.

After that, the upper surface of the third interlayer insulating film 62 is polished and planarized by the CMP.

Figure 5A:
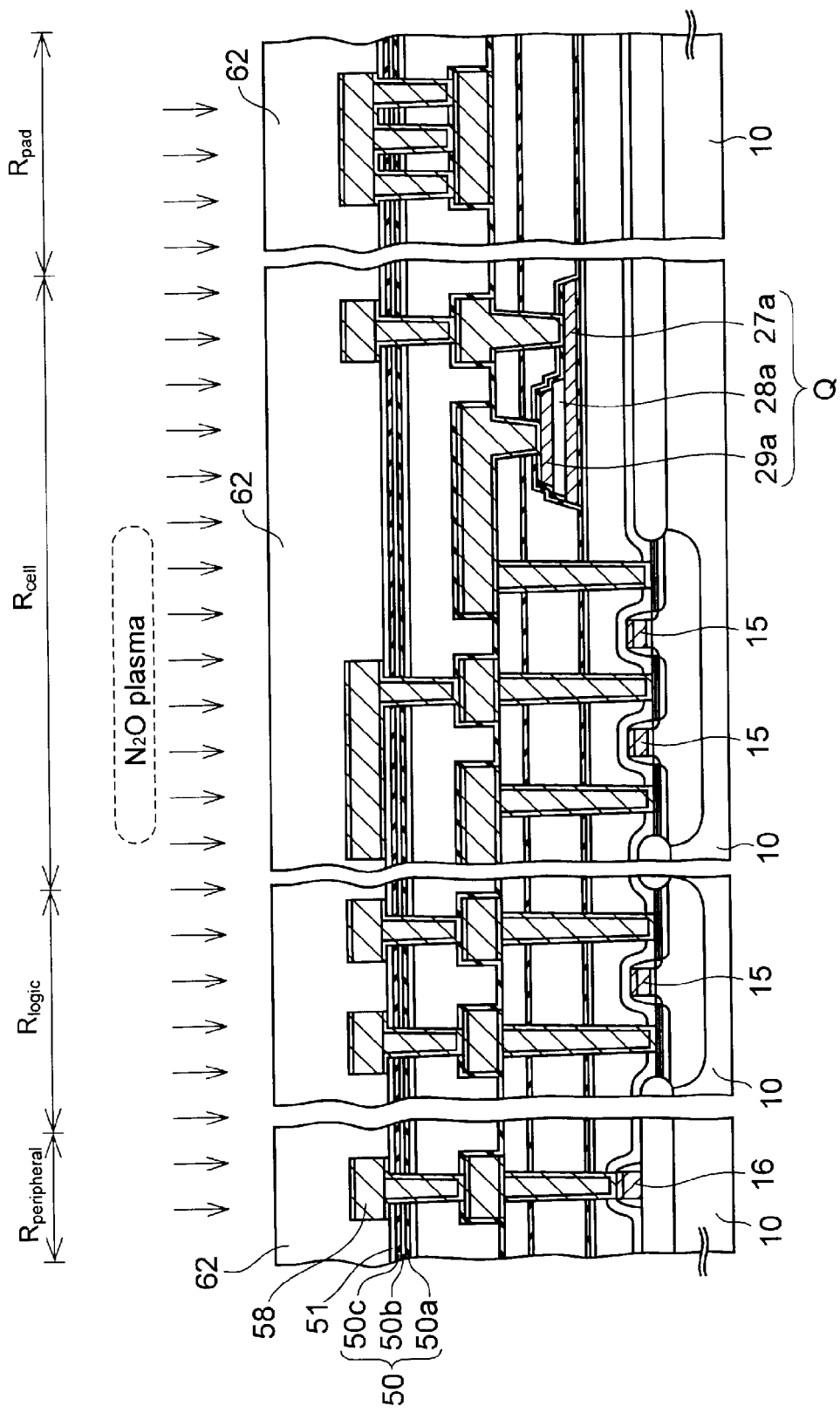

Subsequently, as depicted in FIG. 5A, the $N_2O$ plasma processing is performed on the third interlayer insulating film 62 under conditions of the substrate temperature of 350° C. and the processing time of 4 minutes so as to dehydrate the third interlayer insulating film 62 and to nitride the surface thereof to prevent moisture from being re-adsorbed. The $N_2O$ plasma processing is performed by using, for example, CVD equipment.

Figure 5B:
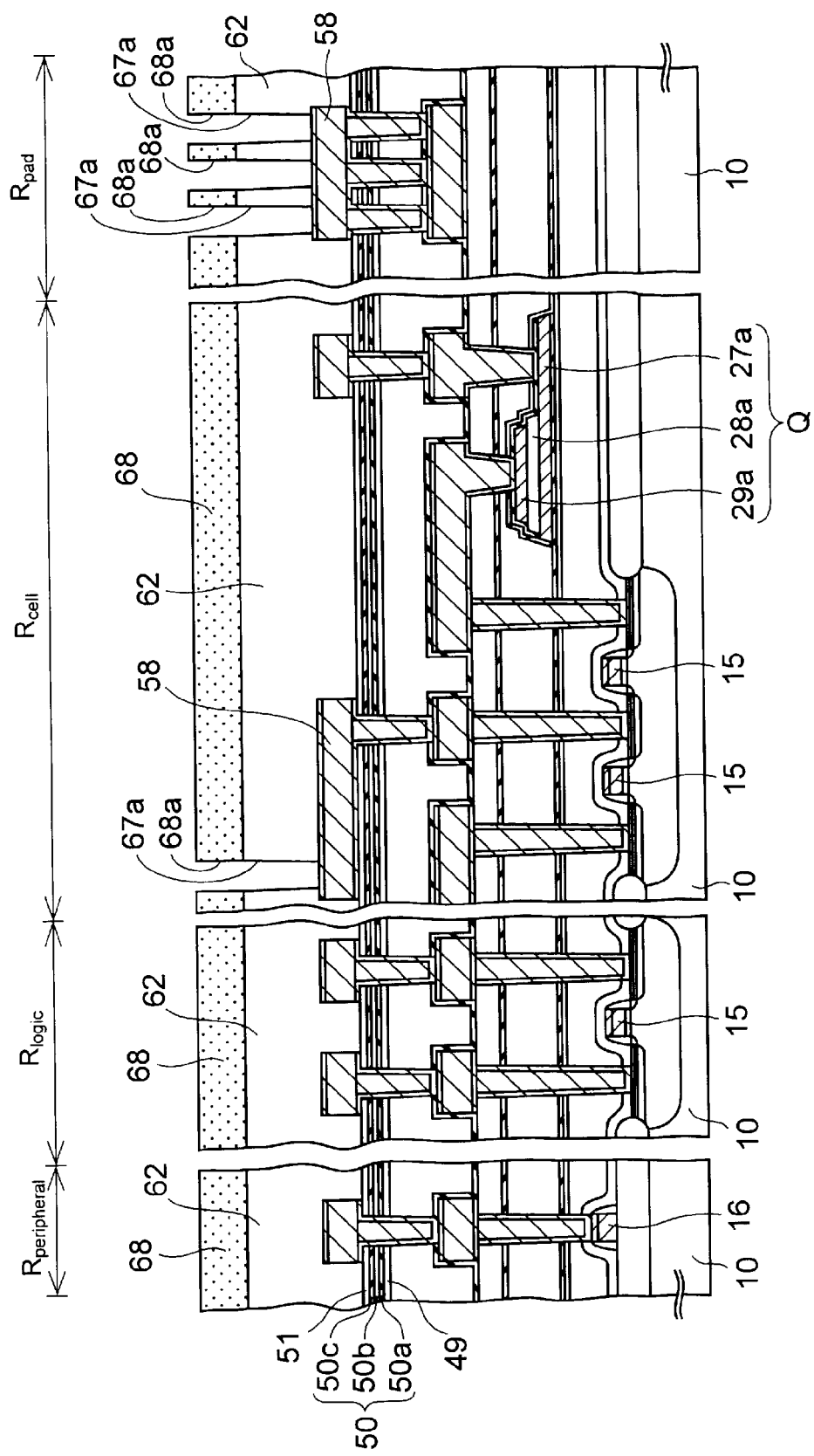

Next, processes for obtaining a cross-sectional structure depicted in FIG. 5B are described.

Firstly, a photoresist is applied on the third interlayer insulating film 62. The photoresist is then exposed and developed, so as to form a fourth resist pattern 68 including eighth hole-shaped windows 68a over the second metal interconnections 58.

After that, in a parallel-plate plasma etching chamber, the third interlayer insulating film 62 is etched by using the fourth resist pattern 68 as a mask, so that fourth holes 67a are formed in the third interlayer insulating film 62 on the second metal interconnection 58. In the etching, the mixed gas of, for example, $C_4F_8$, Ar, and $O_2$ is used as an etching gas.

After the etching is finished, the fourth resist pattern 68 is removed.

Figure 5C:
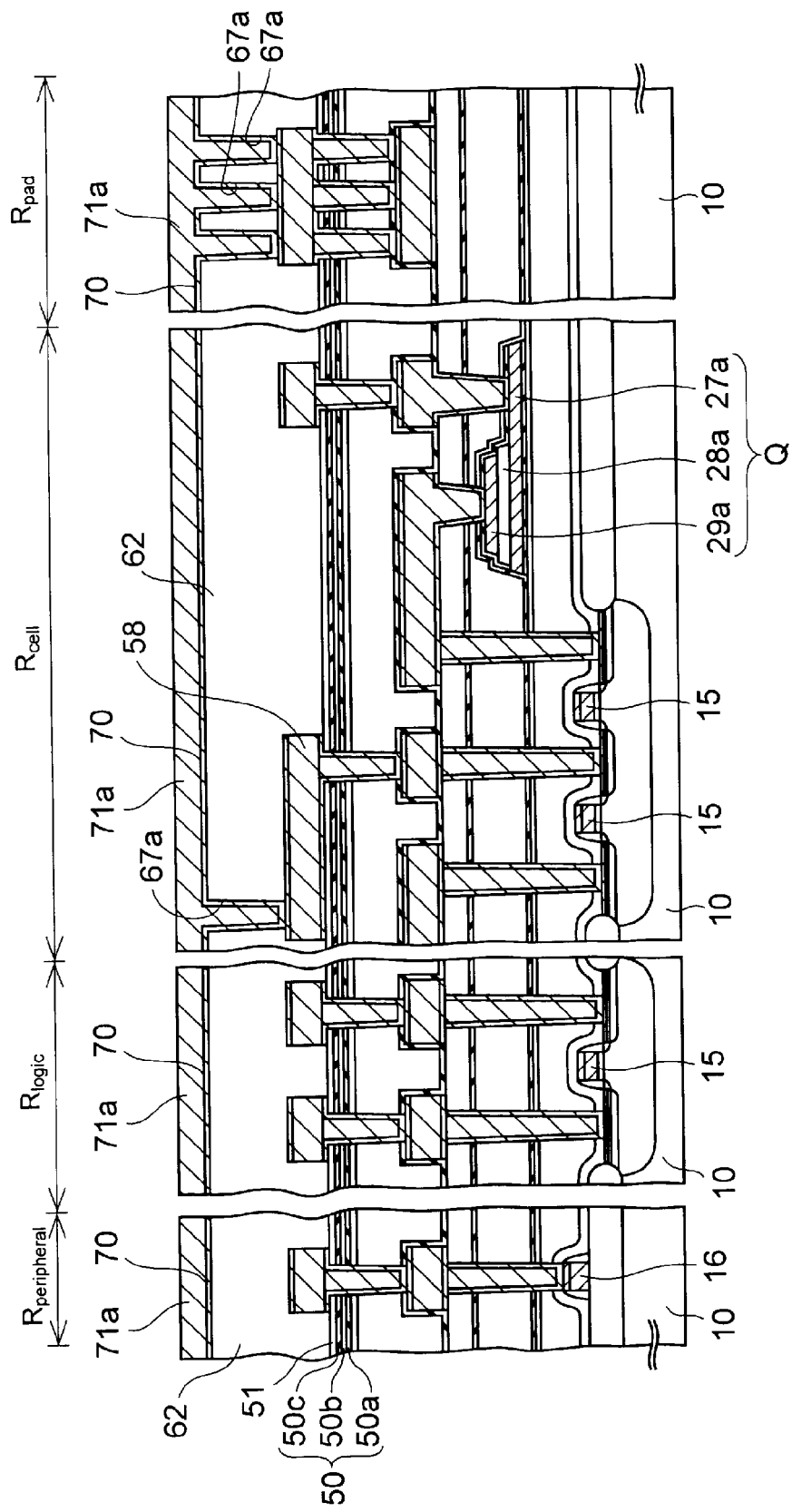

Subsequently, as depicted in FIG. 5C, as a second glue film, a titanium nitride film is formed with a thickness of approximately 50 nm on the inner surfaces of the fourth holes 67a and on the upper surface of the third interlayer insulating film 62 by the sputtering method. After that, a tungsten film 71a is formed by the CVD method on the second glue film 70, so that the fourth holes 67a are completely filled with the tungsten film 71a. The tungsten film 71a is formed with a thickness of, for example, approximately 650 nm.

Figure 5D:
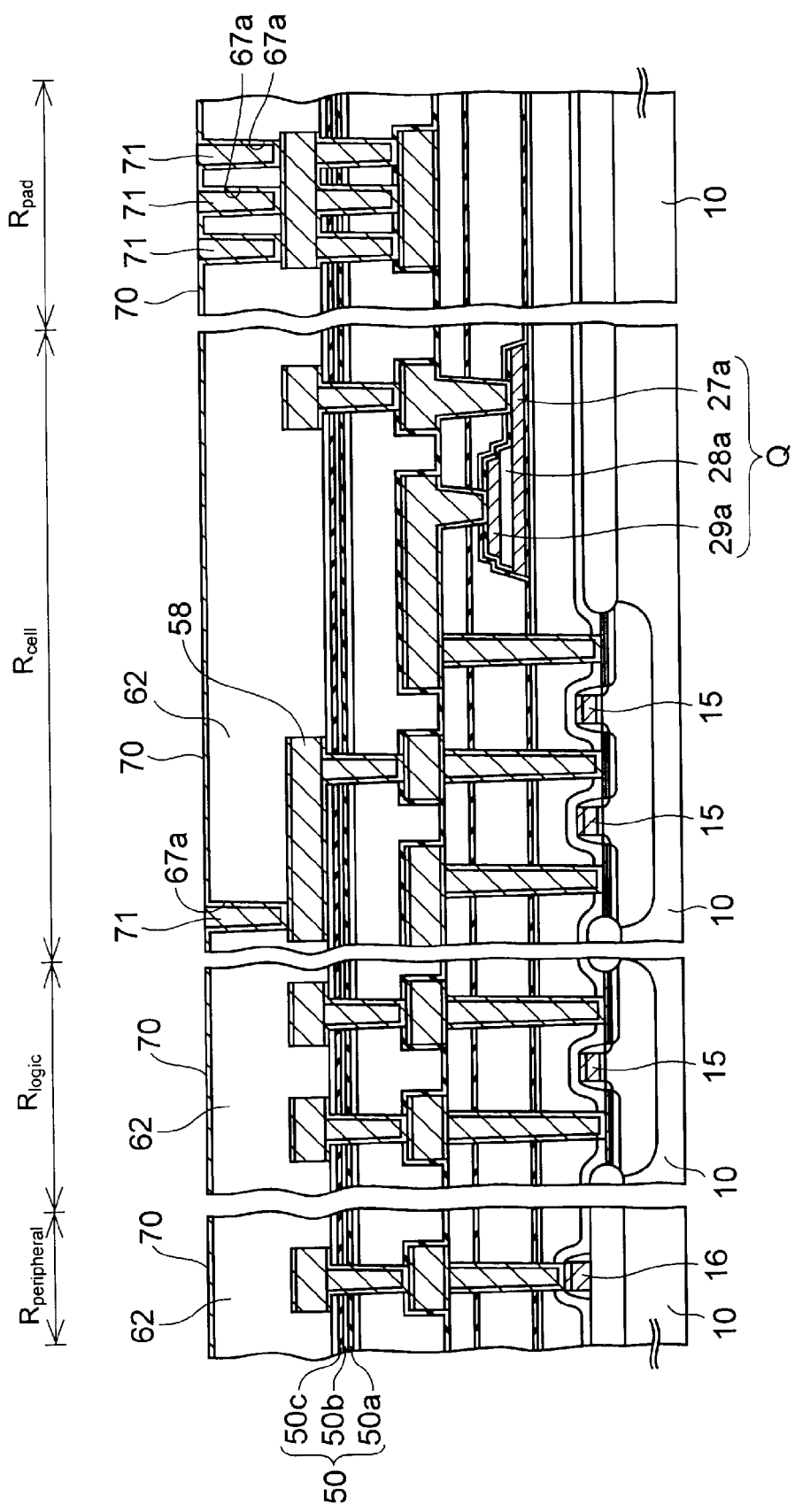

Next, as depicted in FIG. 5D, the unnecessary tungsten film 71a on the third interlayer insulating film 62 is etched back and removed, so that the tungsten film 71a is left only in the fourth holes 67a as sixth conductive plugs 71. Note that the tungsten film 71a may be removed by the CMP method in place of the etching back.

Figure 5E:
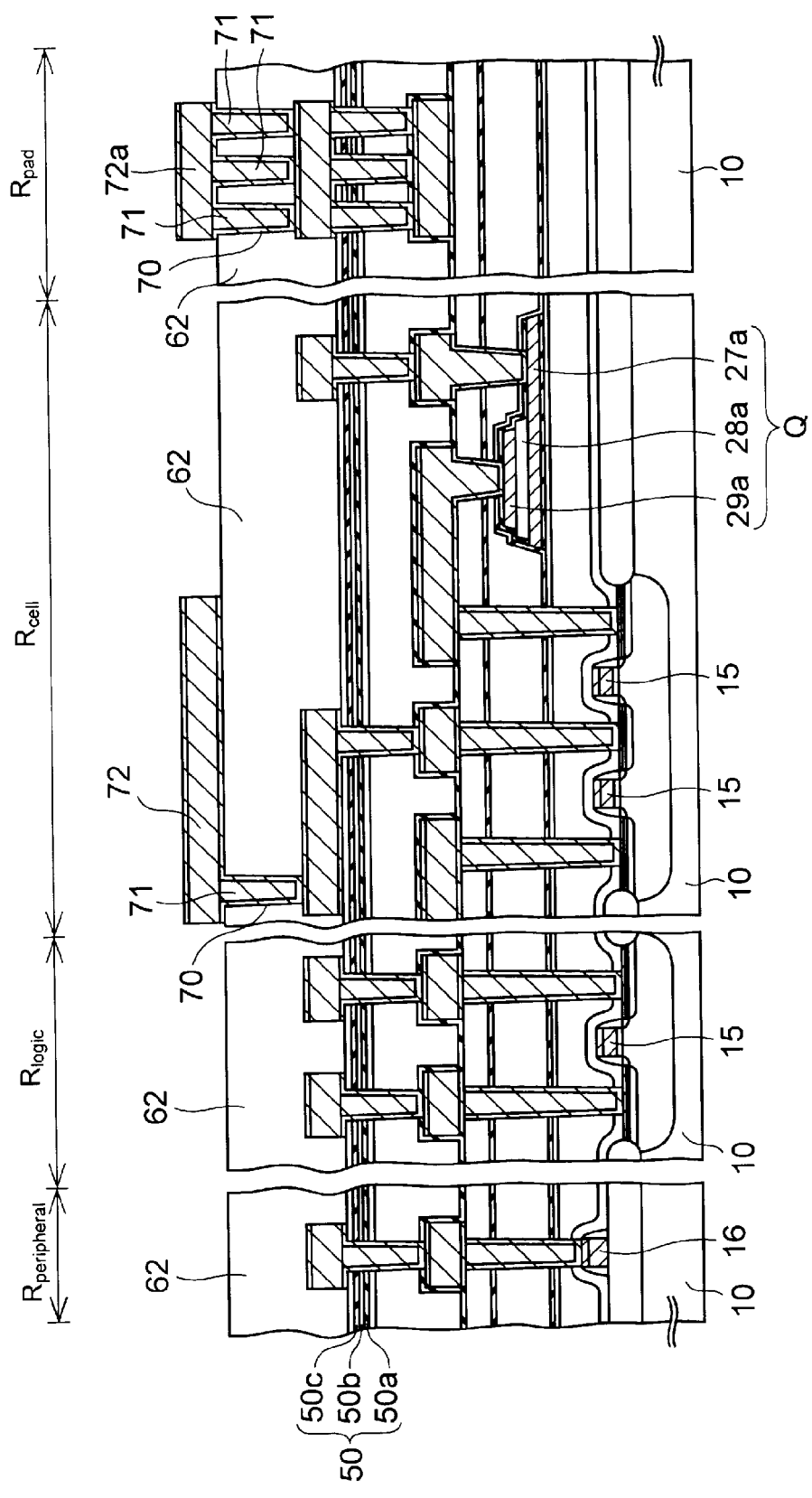

Next, processes for obtaining a cross-sectional structure depicted in FIG. 5E are described.

Firstly, on each of the upper surfaces of the second glue film 70 and the sixth conductive plugs 71, a copper-containing aluminum film with a thickness of approximately 500 nm and a titanium nitride film with a thickness of approximately 150 nm are formed in this order from below by the sputtering method. After that, this metal stacked film and the second glue film 70 formed thereunder are patterned by photolithography to form a third metal interconnection 72 in the cell region $R_{cell}$ and a bonding pad 72a in the pad region $R_{pad}$.

Figure 5F:
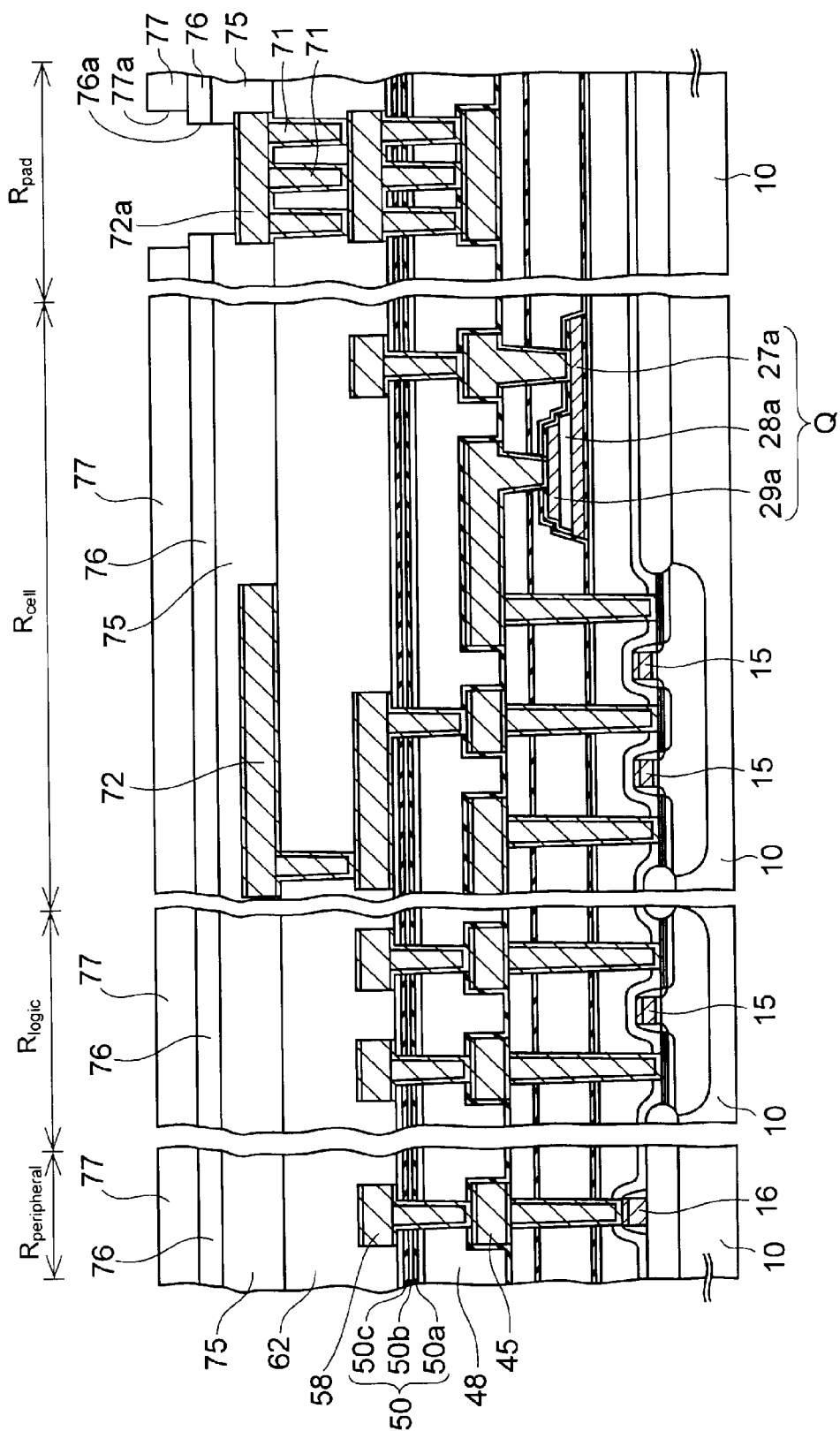

Next, processes for obtaining a cross-sectional structure depicted in FIG. 5F are described.

Firstly, on each of the third interlayer insulating film 62 and the third metal interconnection 72, a silicon oxide film is formed with a thickness of approximately 100 nm by the CVD method as a first passivation film 75.

Note that the $N_2O$ plasma processing for dehydration processing and for moisture absorption prevention processing may be performed on the first passivation film 75. The $N_2O$ plasma processing is performed, for example, in CVD equipment under processing conditions of the substrate temperature of 350° C. and the processing time of 2 minutes.

Furthermore, as a second passivation film 76, a silicon nitride film is formed with a thickness of approximately 350 nm on the first passivation film 75 by the CVD method.

After that, these first and second passivation films 75 and 76 are patterned to form a first opening 76a through which the bonding pad 72a in the pad region $R_{pad}$ is exposed.

Thereafter, photosensitive polyimide is formed with a thickness of approximately 3 μm on the entire upper surface of the silicon substrate 10 so as to form a protection layer 77 formed of a polyimide coating film. After that, the protection layer 77 is exposed and developed, so that a second opening 77a through which the bonding pad 72a is exposed is formed in the protection layer 77. Then, the protection layer 77 is cured by heat under conditions of the substrate temperature of 310° C., the $N_2$ flow rate of 100 liters per minute, and the processing time of 40 minutes.

Figure 6:
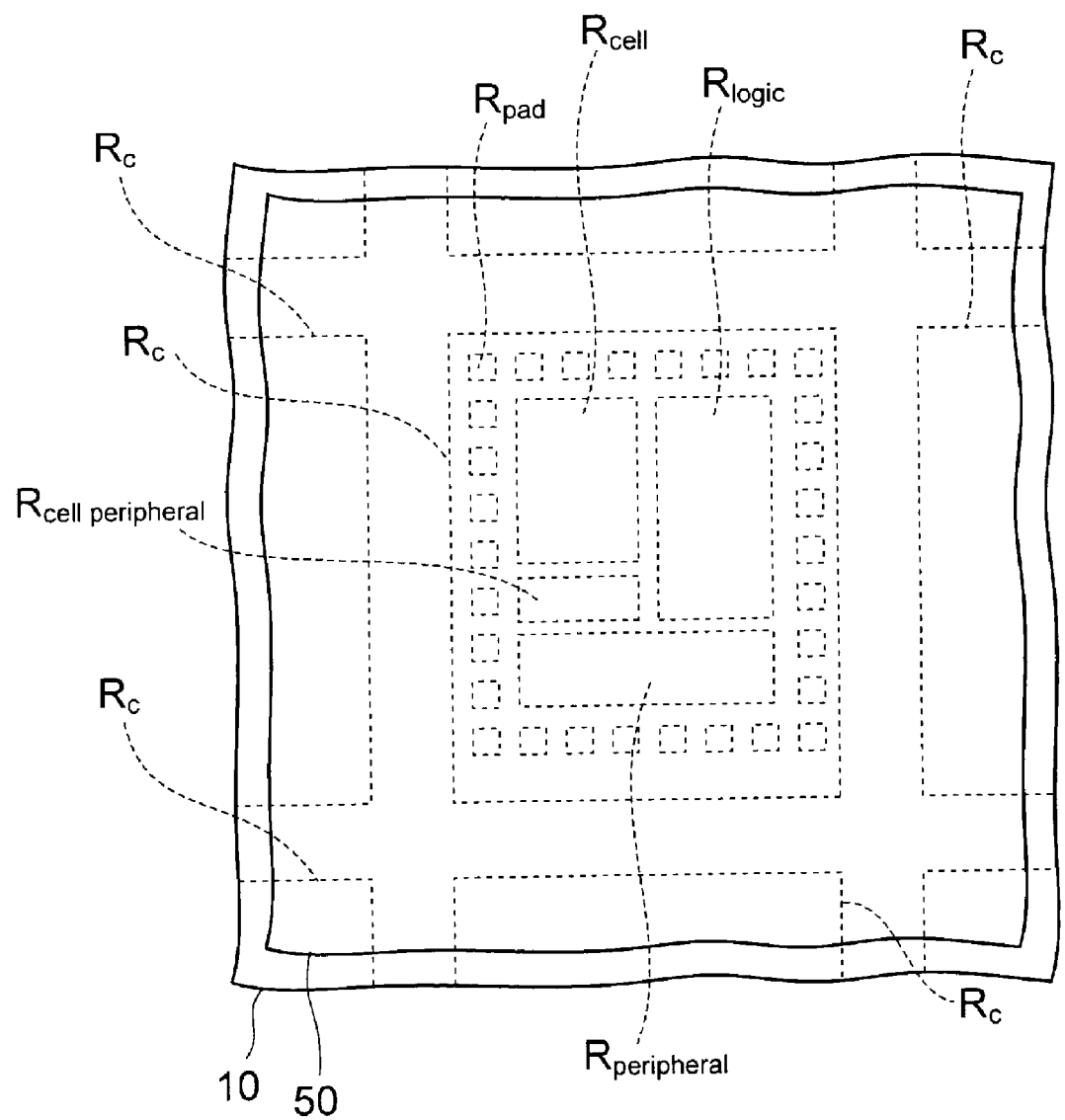
FIG. 6 is an enlarged plan view of the semiconductor device according to the first embodiment of the present invention.

FIG. 6 is an enlarged plan view of the silicon substrate 10 after the processes up to this point are finished.

As depicted in FIG. 6, multiple chip regions $R_C$ are defined in the silicon substrate 10. In each of the multiple chip regions $R_C$, the above-described peripheral circuit region $R_{peripheral}$, logic circuit region $R_{logic}$, cell region $R_{cell}$, and pad region $R_{pad}$ are further defined. Additionally, other than these regions, a cell peripheral circuit region $R_{cell\ peripheral}$ in which input and output of signals from and to the cell region $R_{cell}$ are controlled is also defined in each chip region $R_c$.

Furthermore, in the present embodiment, the above-described fifth capacitor protection insulating film 50 is formed on the entire surfaces of the chip regions $R_c$.

Figure 7:
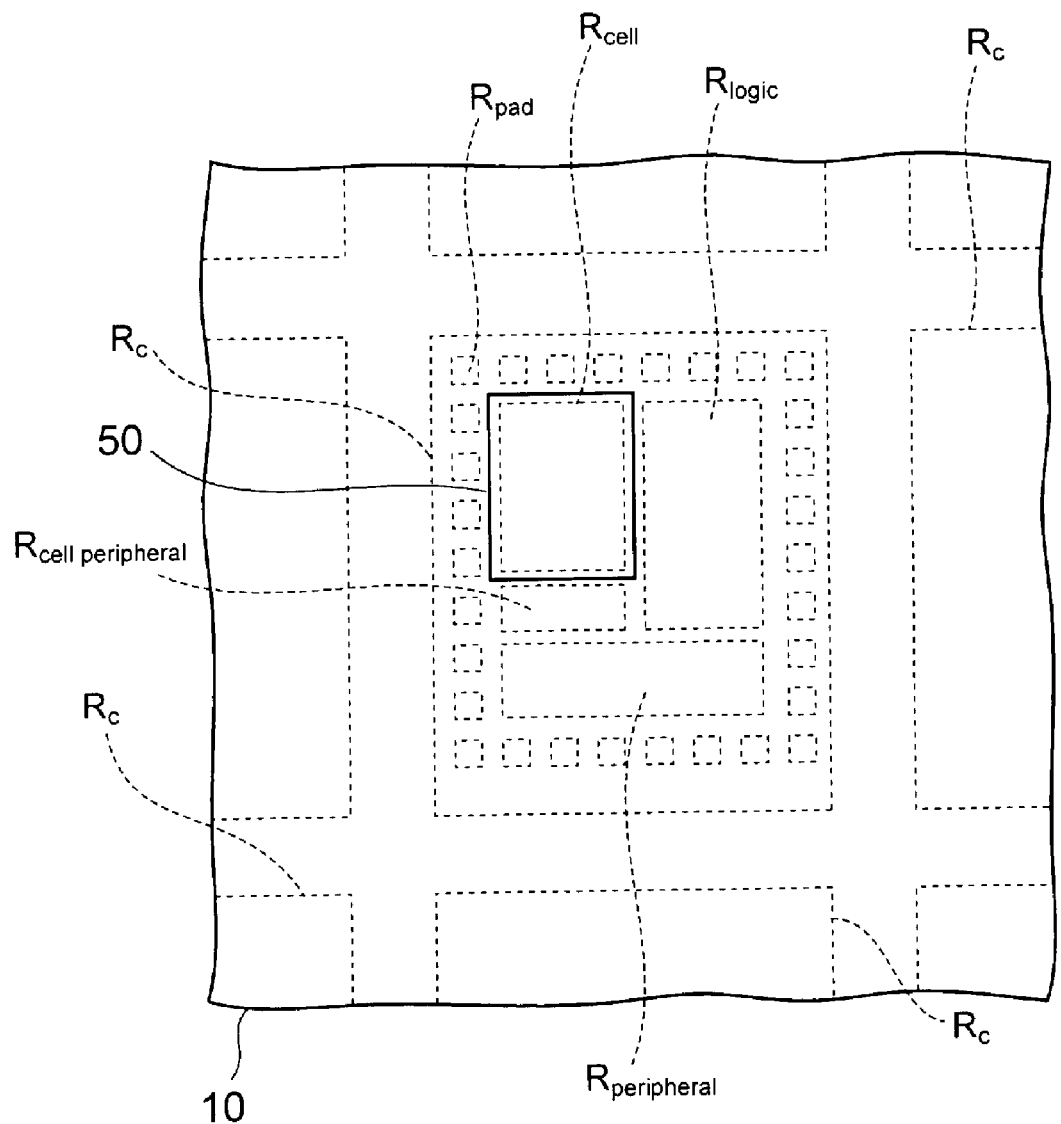
FIG. 7 is a plan view depicting a case where a fifth capacitor protection insulating film is formed only in a cell region in the first embodiment of the present invention.

Note that, the plan layout of the fifth capacitor protection insulating film 50 is not limited to this. For example, as long as the entry of moisture or hydrogen to the capacitor Q can be blocked, the fifth capacitor protection insulating film 50 may be formed only on the cell region $R_{cell}$ as depicted in FIG. 7.

In the subsequent process, the silicon substrate 10 is subjected to dicing along the scribe region between the chip regions $R_c$, so that multiple semiconductor chips (semiconductor devices) are cut out from the silicon substrate 10. The main processes according to the present embodiment are then finished.

According to the present embodiment described above, as depicted in FIG. 5F, there is employed, as the fifth capacitor protection insulating film 50, the stacked film that is obtained by forming the first insulating metal oxide film 50a, the intermediate insulating film 50b, and the second insulating metal oxide film 50c in this order.

In this manner, the two layers of the first insulating metal oxide film 50a and the second insulating metal oxide film 50c are used as the films to block the entry of moisture and hydrogen. Accordingly, as compared with the case where only one of these layers is formed, the blocking capability against hydrogen and moisture is increased.

Note that, to obtain a blocking capability equal to that of the present embodiment, it is also considered to form a single-layered insulating metal oxide film having a thickness equal to the total film thickness of the first insulating metal oxide film 50a and the second insulating metal oxide film 50c, instead of forming the fifth capacitor protection insulating film 50.

However, according to a investigation carried out by the inventor of the present application, it is found that a defect is less likely to occur in the semiconductor chip of the present embodiment as compared with the case where such a single-layered insulating metal oxide film is formed. This is because, in a defected semiconductor chip, only a single pinhole in the single-layered insulating metal oxide film allows the entry of hydrogen and moisture from the pinhole, which in turn deteriorates the capacitor dielectric film 28a.

Figure 8:
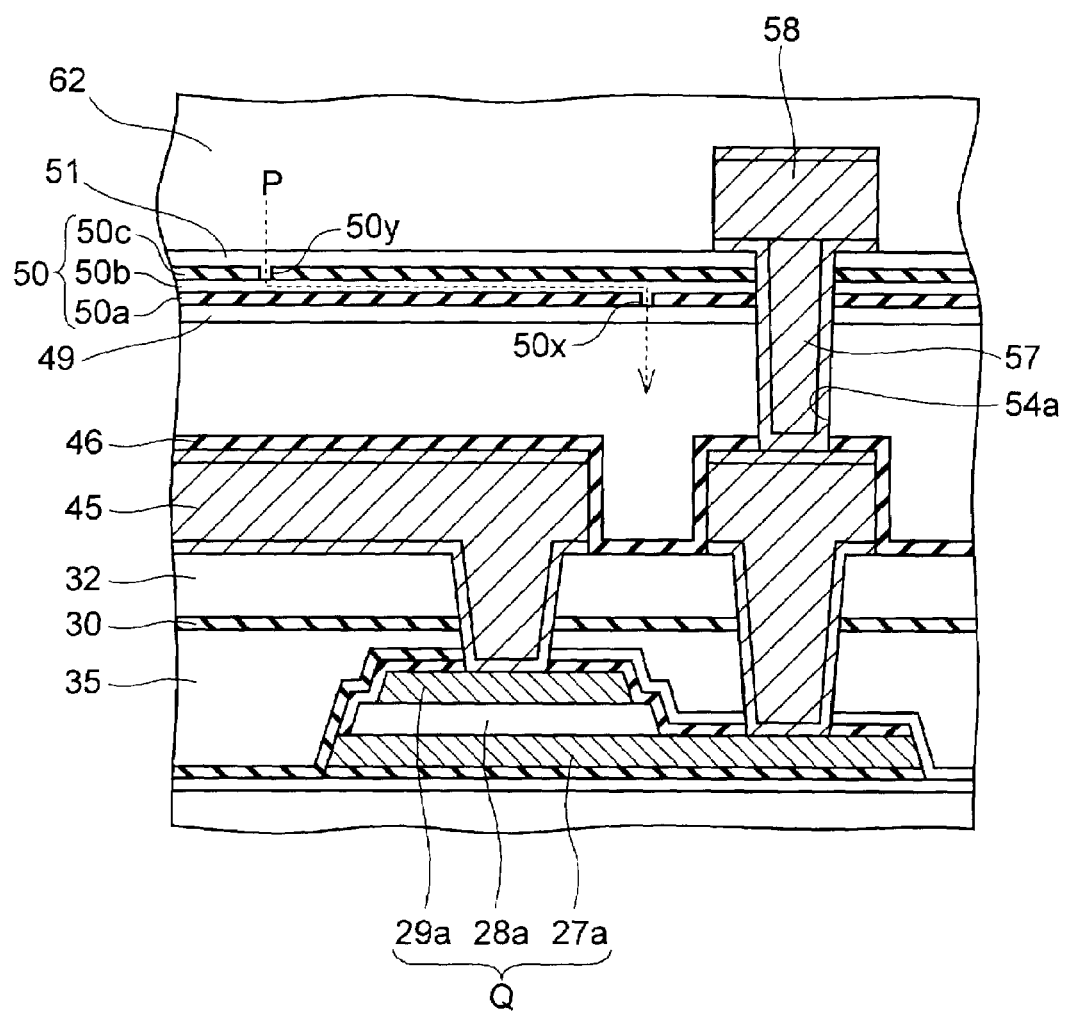
FIG. 8 is a cross-sectional view for explaining advantages which can be achieved by forming two layers of a first insulating metal oxide film and a second insulating metal oxide film in the first embodiment of the present invention.

In contrast, in the present embodiment, as depicted in an enlarged sectional view of FIG. 8, even if pinholes 50x and 50y are formed respectively in both of the first insulating metal oxide film 50a and the second insulating metal oxide film 50c, there is a low possibility that these pinholes 50x and 50y are formed close to each other. In general, the pinholes 50x and 50y are formed separated from each other. Accordingly, a reducing material P such as moisture or hydrogen requires a long period of time for moving from the one pinhole 50y to the other pinhole 50x, which in turn delays the time until the capacitor dielectric film 28a is deteriorated by the reducing material P. As a result, a life of the semiconductor chip can be prolonged.

Figure 9:
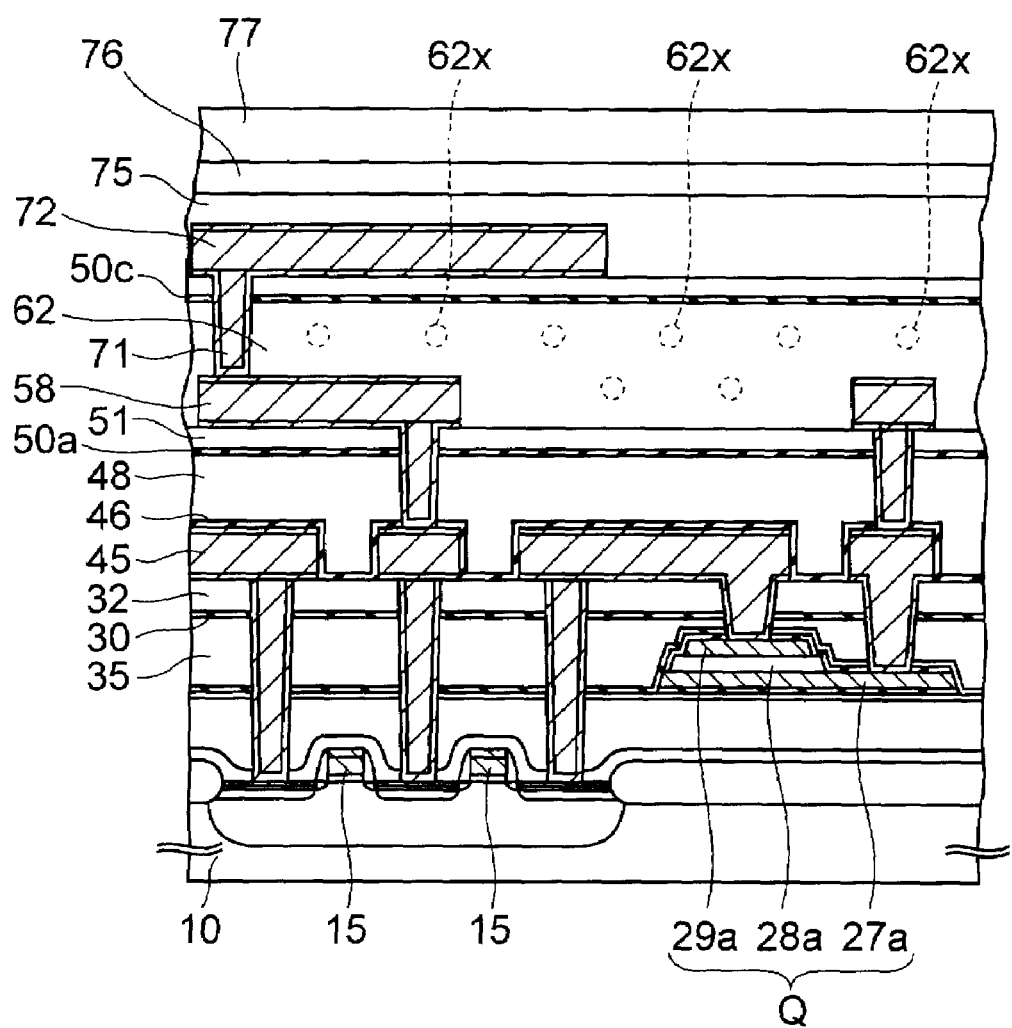
FIG. 9 is a cross-sectional view of a semiconductor device according to a comparative example.

If it is only needed to form the first insulating metal oxide film 50a and the second insulating metal oxide film 50c, it is also considered that the individual films 50a and 50c are formed in different layers like a comparative example of FIG. 9, without forming these films between the layers of the first metal interconnection 45 and the second metal interconnection 58 as described in the present embodiment.

In this comparative example, the first insulating metal oxide film 50a is formed between the layers of the first metal interconnection 45 and the second metal interconnection 58, whereas the second insulating metal oxide film 50c is formed between the layers of the second metal interconnection 58 and the third metal interconnection 72.

If the individual films 50a and 50c are formed in different layers in this manner, the first insulating metal oxide film 50a and the second insulating metal oxide film 50c are respectively formed, for example, under and over the voids 68x formed when the third interlayer insulating film 62 is formed.

However, in some cases, moisture is kept in the voids 62x. Accordingly, the moisture is evaporated by heat generated when the third metal interconnection 72 or the like is formed. As a result, the moisture having nowhere to go due to the films 50a and 50c finally penetrates the first insulating metal oxide film 50a, thereby deteriorating the capacitor dielectric film 28a.

To prevent the voids 62x from being generated, it is also considered that the third interlayer insulating film 62 having an excellent filling capability is formed by the HDPCVD (high density plasma CVD) method using a silane ($SiH_4$) gas, in place of the general plasma CVD method using the TEOS gas as used in the present embodiment. However, when the HDPCVD method is used, hydrogen plasmas are present in a film-forming atmosphere at a high concentration. Furthermore, the hydrogen plasmas are attracted to the capacitor Q by the plasmas applied to the silicon substrate 10 side. Accordingly, the capacitor dielectric film 28a is exposed to hydrogen, thereby being easily deteriorated. Thus, the HDPCVD method is unsuitable for the manufacturing processes for FeRAMs.

In contrast, in the present embodiment, the first and second insulating metal oxide films 50a and 50c are formed between the first metal interconnection 45 and the second metal interconnection 58. Accordingly, the intermediate insulating film 50b formed between these films 50a and 50c can be thinned. For this reason, there is no room for the above-described voids to be formed in the intermediate insulating film 50b. Thus, the capacitor dielectric film 28a can be prevented from being deteriorated by moisture kept in the void.

Furthermore, the intermediate insulating film 50b in the fifth capacitor protection insulating film 50 is made of a silicon oxide-based material, similar to the second interlayer insulating film 48 made of a silicon oxide. In other words, the intermediate insulating film 50b is mainly formed of a material which is made of silicon and oxygen and is free from nitride. For this reason, as described by referring to FIG. 4V, when the third holes 54a are formed by the etching, there is not generated a substantial difference in etching rate between the intermediate insulating film 50b and the second interlayer insulating film 48. Accordingly, as compared with the example of FIG. 1 in which silicon nitride difficult to be etched is used as the capacitor protection insulating film, the third holes 54a can be opened in a short period of time and the third hole 54a can be also formed in fine shapes. Thus, a contact resistance of each fifth conductive plug 57 formed in the corresponding third hole 54a can be stabilized.

Modifications of First Embodiment

Next, modifications of the first embodiment are described below by referring to FIGS. 11 and 12. Note that, in these figures, same reference numerals are given to denote components same as those described in the first embodiment, and the descriptions thereof are omitted below.

First Modification

Figure 11:
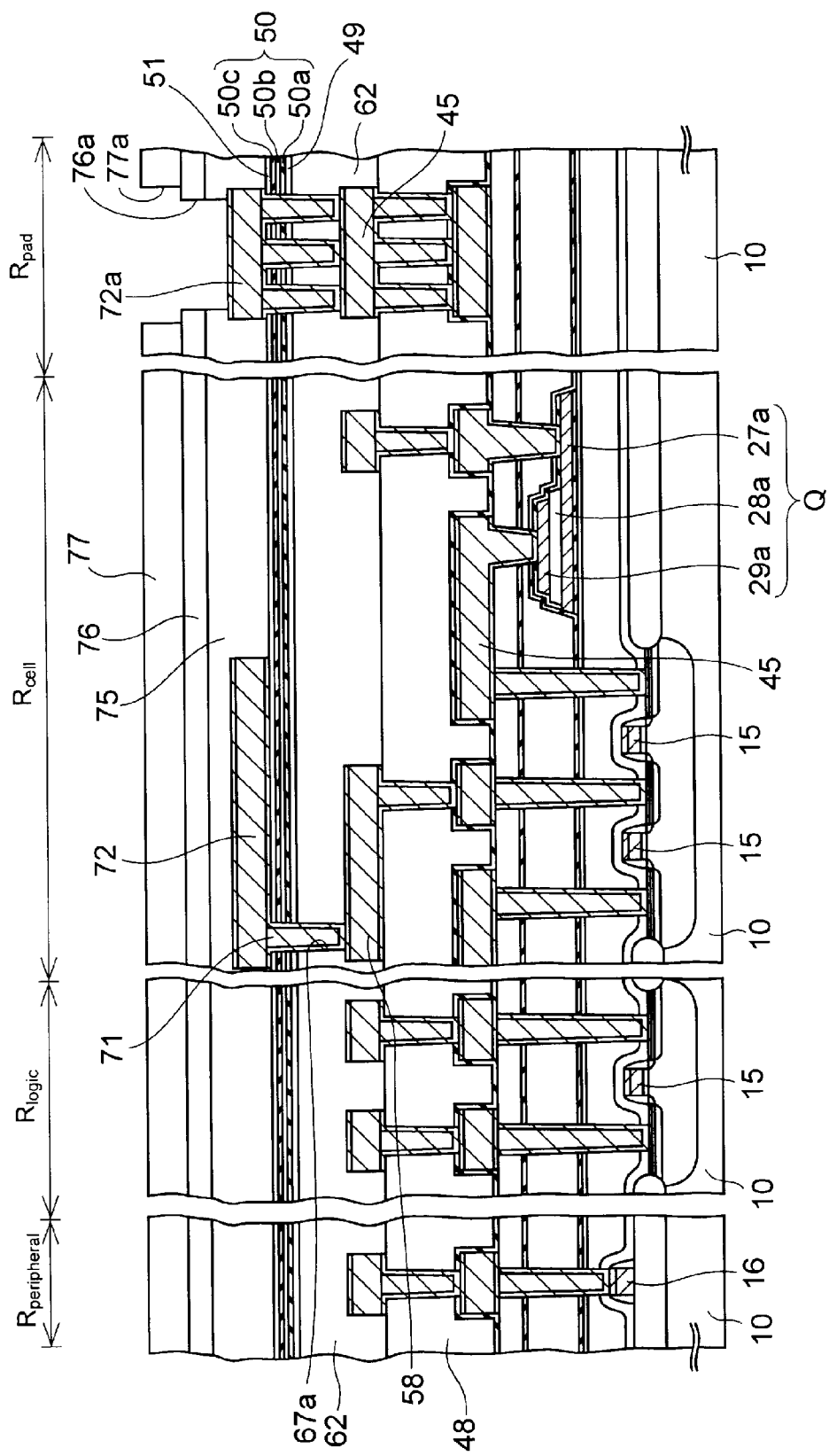
FIG. 11 is a cross-sectional view of a semiconductor device according to a first modification of the first embodiment.

FIG. 11 is a cross-sectional view of a semiconductor device according to a first modification of the first embodiment.

In the first modification, the third cap insulating film 49, the fifth capacitor protection insulating film 50, and the cover insulating film 51 are formed between the third interlayer insulating film 62 and the third metal interconnection 72.

In this case, the fourth holes 67a are also formed in these insulating films 49 to 51.

The intermediate insulating film 50b constituting the fifth capacitor protection insulating film 50 is made of a silicon oxide-based material, similar to the third interlayer insulating film 62. Accordingly, when the fourth holes 67a are formed by the etching, there is not generated a substantial difference in etching rate between the intermediate insulating film 50b and the third interlayer insulating film 62.

For this reason, in this modification, the diameter of the lower end of the fourth hole 67a becomes nearly equal to the diameter of the upper end thereof. Thus, a contact resistance of the sixth conductive plug 71 can be stabilized.

Second Modification

Figure 12:
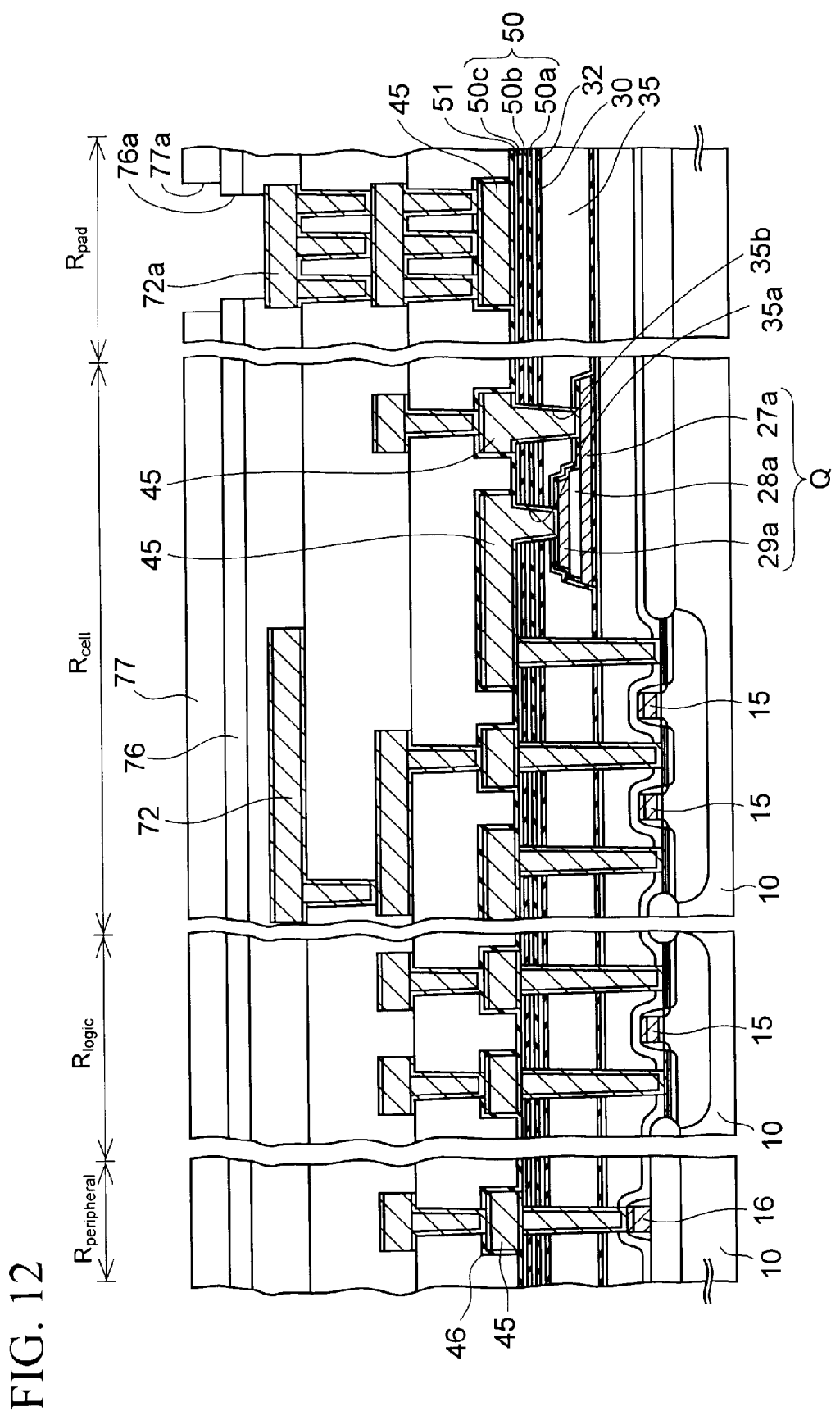
FIG. 12 is a cross-sectional view of a semiconductor device according to a second modification of the first embodiment.

FIG. 12 is a cross-sectional view of a semiconductor device according to a second modification of the first embodiment.

In the second modification, the fifth capacitor protection insulating film 50 and the cover insulating film 51 are formed between the first interlayer insulating film 35 and each first metal interconnection 45.

By this configuration, the first and second holes 35a and 35b in the first interlayer insulating film 35 are formed also in the insulating films 50 and 51. Note that the intermediate insulating film 50b in the fifth capacitor protection insulating film 50 and the first interlayer insulating film 35 are both made of a silicon oxide-based material. Accordingly, when the first and second holes 35a and 35b are formed by the etching, there is not generated a substantial difference in etching rate between the intermediate insulating film 50b and the first interlayer insulating film 35. Thus, the bottoms of the first and second holes 35a and 35b can be formed substantially large, so that contact resistances of the first metal interconnections 45 filled in the respective holes 35a and 35b can be stabilized.

When the total film thickness of the third capacitor protection insulating film 30 and the first and second insulating metal oxide films 50a and 50c, which are etched by the sputtering effect of an etching gas, is too thick when the first and second holes 35a and 35b are formed by the etching, the etching of these holes 35a and 35b becomes difficult. For this reason, it is preferable that the total film thickness of the third capacitor protection insulating film 30 and the first and second insulating metal oxide films 50a and 50c be set to less than 100 nm so as to facilitate the formation of the first and second holes 35a and 35b by the etching.

Figure 19:
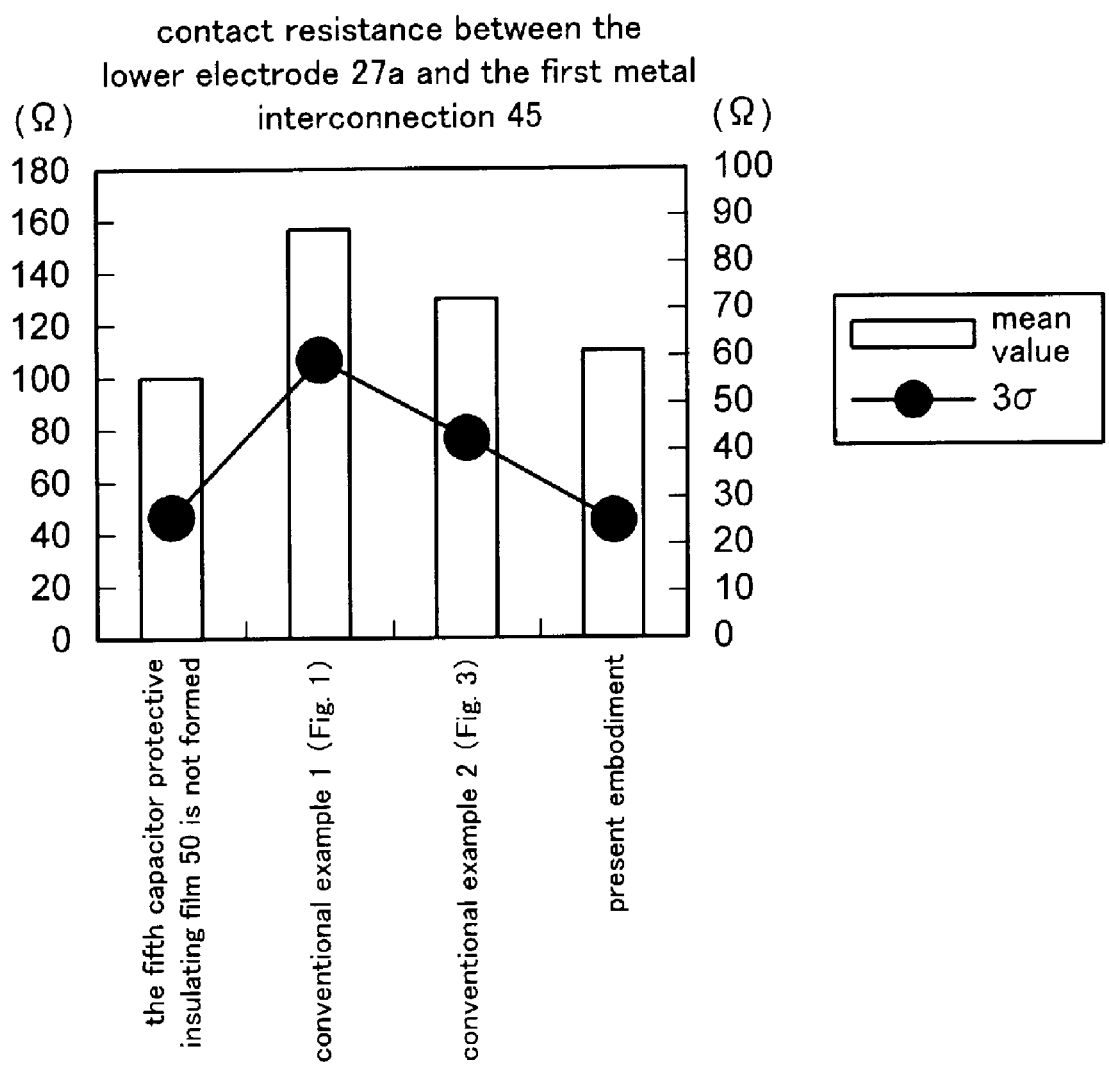
FIG. 19 is a graph obtained by examining a contact resistance between a lower electrode and a first metal interconnection in the semiconductor device according to the second modification of the first embodiment.

FIG. 19 is a graph depicting examination results of the contact resistance between the lower electrode 27a and the first metal interconnection 45 in the present embodiment.

In this graph, the vertical axis on the left side depicts a mean value of contact resistances of 100 capacitors Q and the vertical axis on the right side depicts $3\sigma$ thereof (i.e., three times of standard deviation $\sigma$).

Figure 3:
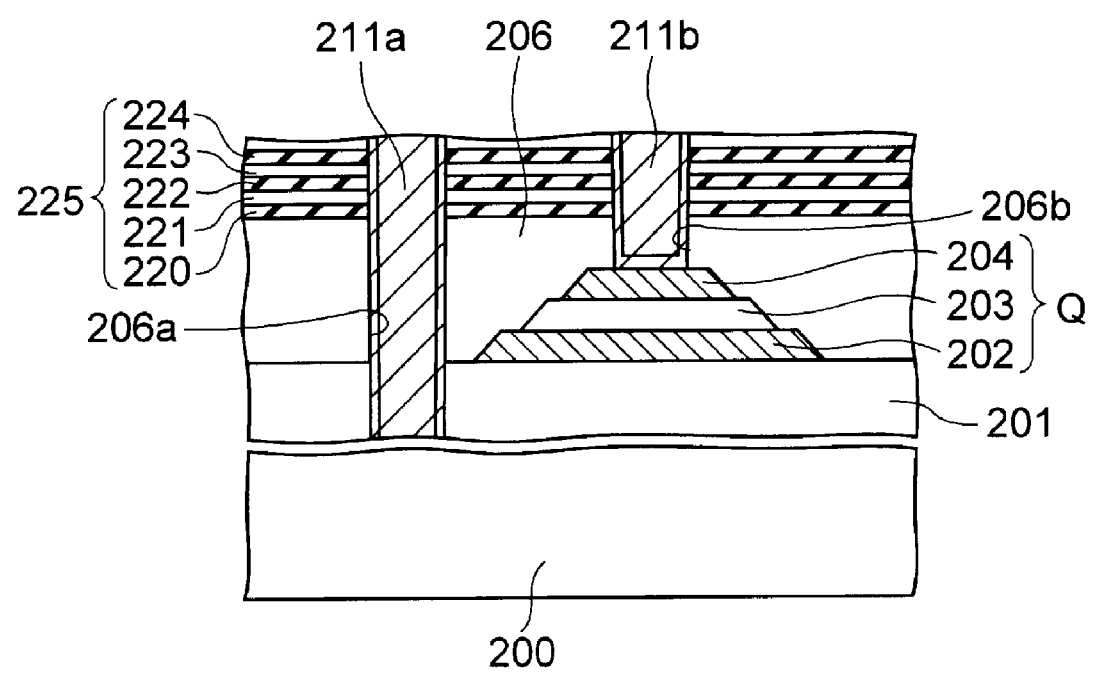
FIG. 3 is an enlarged cross-sectional view of an essential part of a semiconductor device of another example, disclosed in Patent Document 1.

In addition, in the graph, results of Conventional Example 1, which is described in FIG. 1, and Conventional Example 2, which is described in FIG. 3, are also depicted for comparison. Furthermore, an examination result of the case where the fifth capacitor protection insulating film 50 is not formed is also depicted in the graph.

As depicted in FIG. 19, the contact resistance of the present embodiment is smaller than those of the both Comparative Examples 1 and 2. The reason for this is that an insulating film made of a silicon oxide-based material which is a similar material to that of the first interlayer insulating film 35 is formed as the intermediate insulating film 50b.

Figure 20:
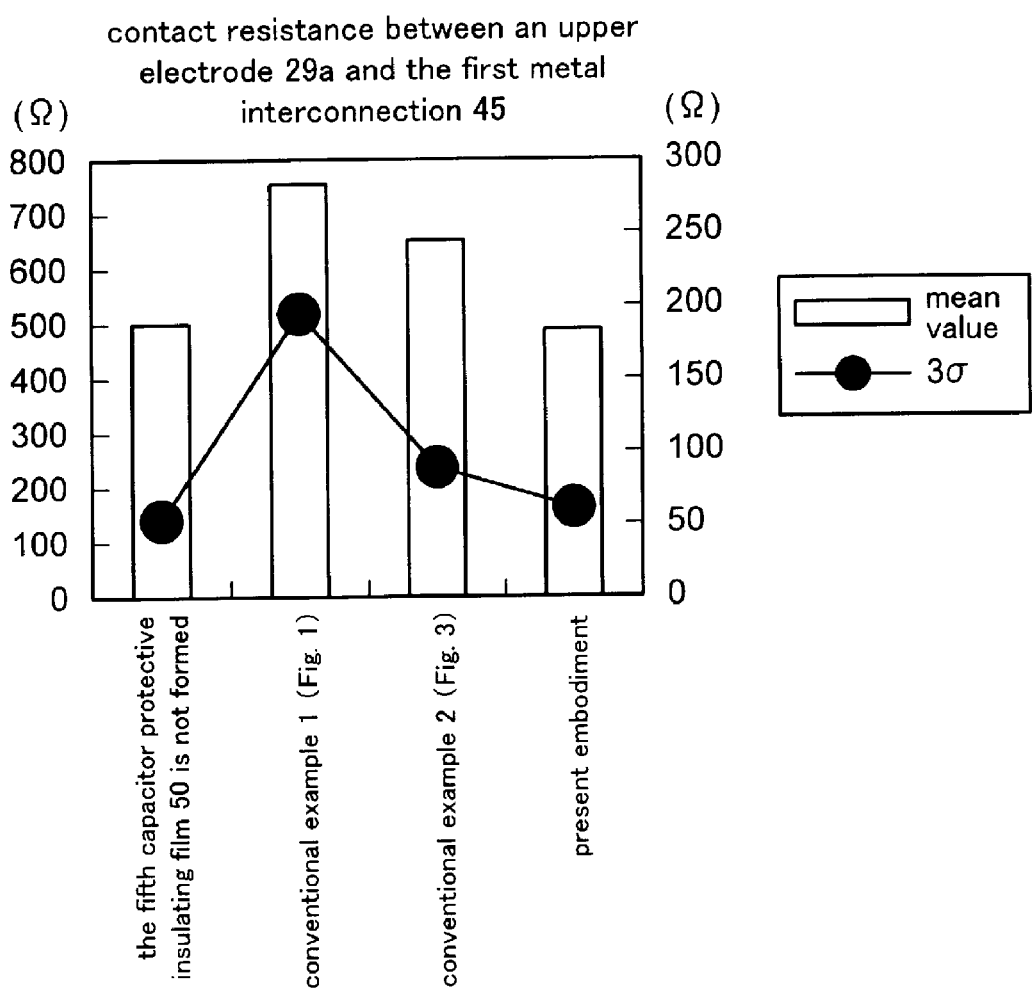
FIG. 20 is a graph obtained by examining a contact resistance between an upper electrode and a first metal interconnection in the semiconductor device according to the second modification of the first embodiment.

FIG. 20 is a graph depicting examination results of the contact resistance between an upper electrode 29a and the first metal interconnection 45 in the present embodiment. The definitions of the vertical axes in FIG. 20 are similar to those of FIG. 19, and thus the descriptions thereof are omitted.

As depicted in FIG. 20, the constant resistance between the upper electrode 29a and the first metal interconnection 45 is also smaller in the present embodiment than in the Conventional Examples 1 and 2.

Figure 21:
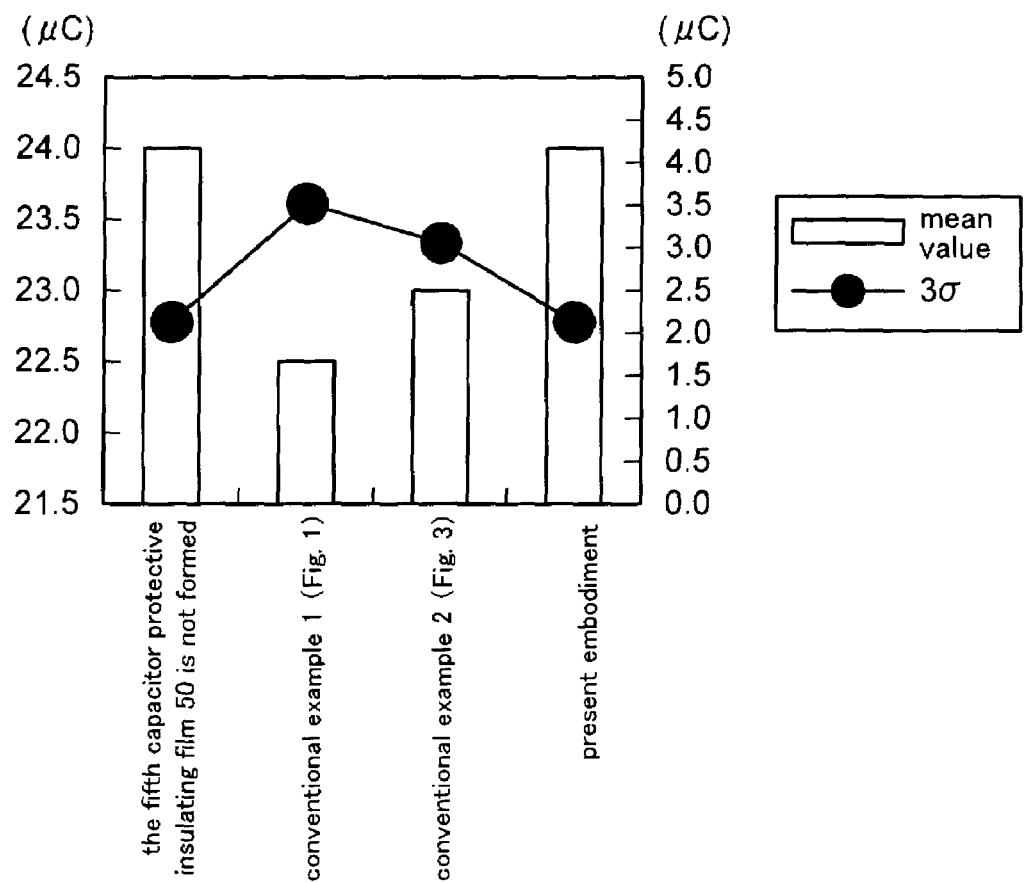
FIG. 21 is a graph obtained by separately forming multiple capacitors according to the second modification of the first embodiment, and by examining residual polarization charge amounts (Qsw) of the capacitors.

FIG. 21 is a graph obtained by: separately forming multiple capacitors Q each having a plan shape of 50 μm×50 μm square according to the present embodiment; and then examining the amounts of residual polarization charges (Qsw) of the capacitors Q. In this graph, the vertical axis on the left side depicts a mean value of the residual polarization charge amounts of 80 capacitors Q in a wafer and the vertical axis on the right side depicts $3\sigma$ thereof.

As depicted in FIG. 21, the residual polarization charge amount (Qsw) becomes larger in the present embodiment than in the Conventional Examples 1 and 2.

Figure 22:
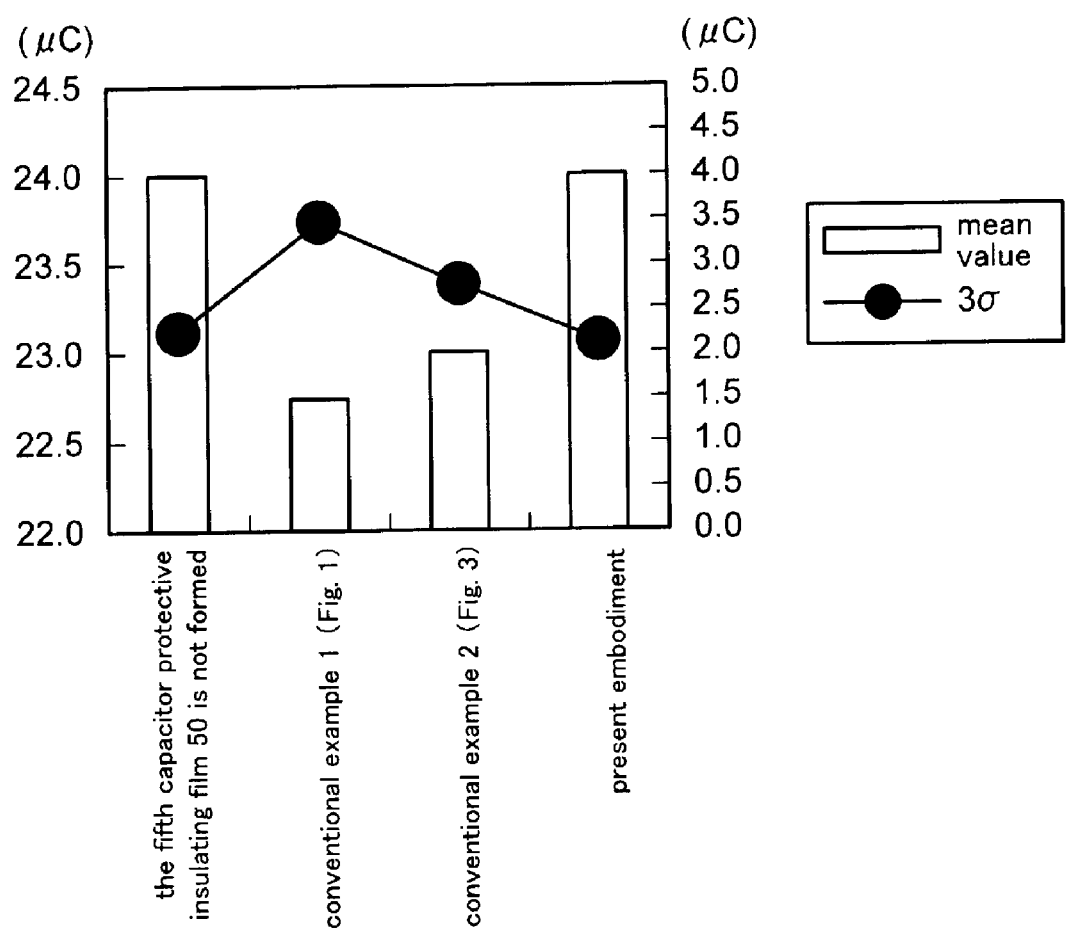
FIG. 22 is a graph obtained by examining a residual polarization charge amount (Qsw) of the capacitor formed in a cell region according to the second modification of the first embodiment.

FIG. 22 is a graph obtained by examining a mean residual polarization charge amount (Qsw) of 80 capacitors Q in the wafer among 1200 capacitors formed in the cell region $R_{cell}$ in the present embodiment. The definitions of the vertical axes are similar to those of FIG. 21.

As depicted in FIG. 22, the residual polarization charge amounts (Qsw) of the capacitors Q in the cell region $R_{cell}$ also become larger in the present embodiment than in the Conventional Examples 1 and 2.

FIG. 23 is examination results of the percent defective of the semiconductor device according to the present embodiment.

It is generally required to guarantee the life of a semiconductor device for 10 years. Accordingly, if the percent defective is 0% at the elapsed time of 336 hours in FIG. 69, this requirement is satisfied.

When the fifth capacitor protection insulating film 50 is not formed, the percent defective becomes 50% at the elapsed time of 168 hours and 80% at the elapsed time of 336 hours. Thus, the above requirement cannot be satisfied.

In contrast, in the present embodiment, similar to Conventional Examples 1 and 2, the percent defective is 0% even after 336 hours have past. Accordingly, the guarantee period of the semiconductor device can be set to 10 years in the present embodiment.

From the results of FIGS. 19 to 23, the present embodiment can reduce the contact resistance between the interconnection metal interconnection 45 and each of the electrodes 27a and 29a, while maintaining long-term reliability equivalent to those of Conventional Examples 1 and 2.

Second Embodiment

Next, a semiconductor device according to a second embodiment is described.

FIGS. 13A to 13H are cross-sectional views of a semiconductor device according to the present embodiment during the manufacturing thereof. In these figures, same reference numerals are given to denote components same as those described in the first embodiment, and the descriptions thereof are omitted below.

Figure 13A:
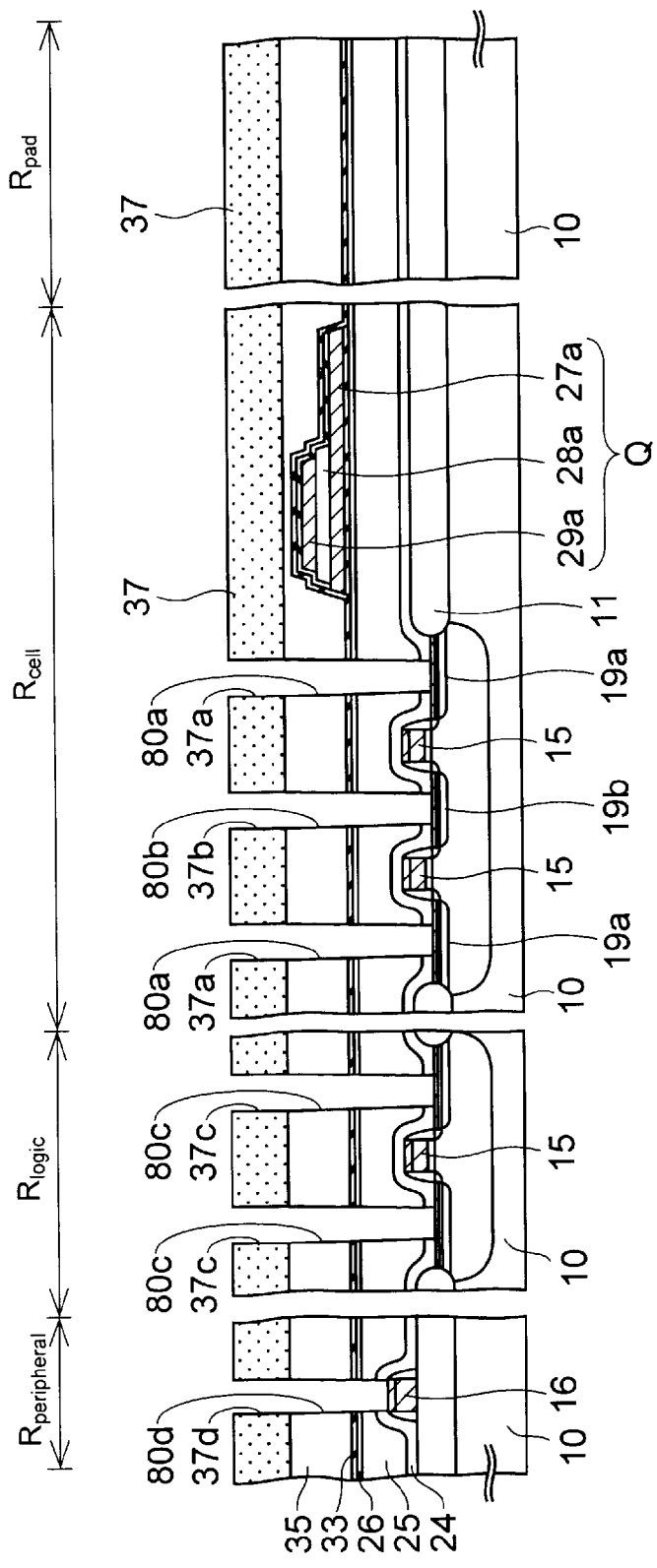
FIGS. 13A to 13H are cross-sectional views of a semiconductor device according to a second embodiment during the course of manufacturing.

Firstly, processes for obtaining a cross-sectional structure depicted in FIG. 13A are described.

Firstly, after performing the processes of FIGS. 4A to 4I described in the first embodiment, a photoresist is applied on a first interlayer insulating film 35. The photoresist is then exposed and developed, so as to form a first resist pattern 37.

Subsequently, films from the first interlayer insulating film 35 to an etching stopper film 24 are dry-etched through first to fourth windows 37a to 37d formed in the first resist pattern 37, so that first to fourth lower contact holes 80a to 80d are formed in these insulating films.

This dry etching is performed by three-step etching in a parallel-plate plasma etching equipment (unillustrated). In the first-step etching, a mixed gas of $C_4F_8$, $O_2$, and Ar is used as an etching gas to etch the films from the first interlayer insulating film 35 to the base insulating film 25. This etching stops on the etching stopper film 24, and hence the etching stopper film 24 is not etched.

In the following second step, a mixed gas of $O_2$ and Ar is used as an etching gas to remove, with the sputtering effects of these gases, etching products generated in the holes in the first step.

After that, in the third etching step, a mixed gas of $C_4F_8$, $CF_4$, $O_2$, and Ar is used as an etching gas to etch the etching stopper film 24.

After finishing the above-described etching, the first resist pattern 37 is removed.

Figure 13B:
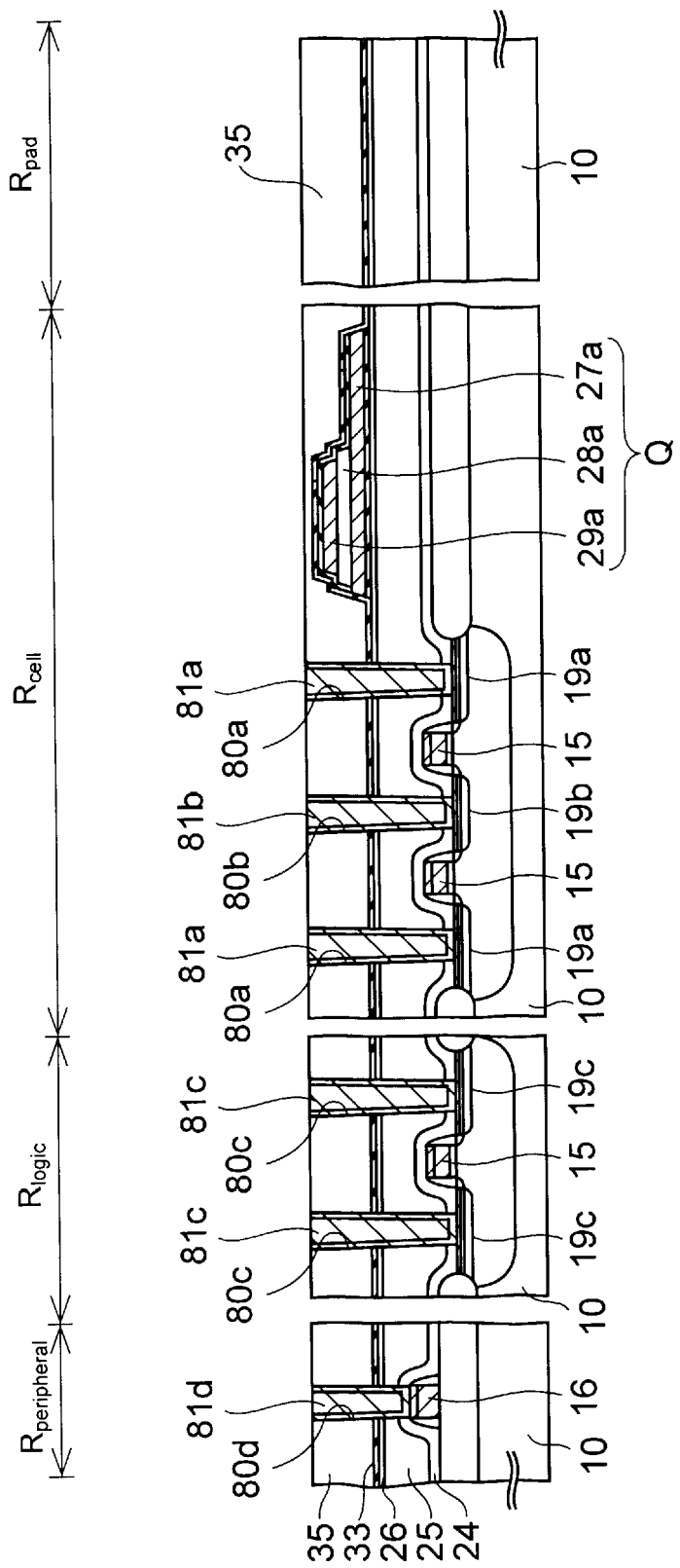

Next, processes for obtaining a cross-sectional structure depicted in FIG. 13B are described.

Firstly, by the sputtering method, a titanium film and a titanium nitride film are formed respectively with thicknesses of 20 nm and 50 nm on the inner surfaces of the first to fourth lower contact holes 80a to 80d and on the upper surface of the first interlayer insulating film 35. These films each serve as a glue film. After that, a tungsten film is formed on this glue film by a CVD method using a tungsten hexafluoride gas. The first to fourth lower contact holes 80a to 80d are completely filled with this tungsten film.

Thereafter, the unnecessary glue film and the tungsten film formed on the first interlayer insulating film 35 are polished and removed by the CMP method, so that the glue film and the tungsten film are left only in the first to fourth lower contact holes 80a to 80d as first to fourth lower conductive plugs 81a to 81d, respectively.

Among these conductive plugs, the first and second lower conductive plugs 81a and 81b formed in the cell region $R_{cell}$ are electrically connected to first and second source/drain regions 19a and 19b, respectively. On the other hand, the third lower conductive plugs 81c formed in the logic circuit region $R_{logic}$ are electrically connected respectively to third source/drain regions 19c. In addition, the fourth lower conductive plug 81d formed in the peripheral circuit region $R_{peripheral}$ is electrically connected to the interconnection 16.

Figure 13C:
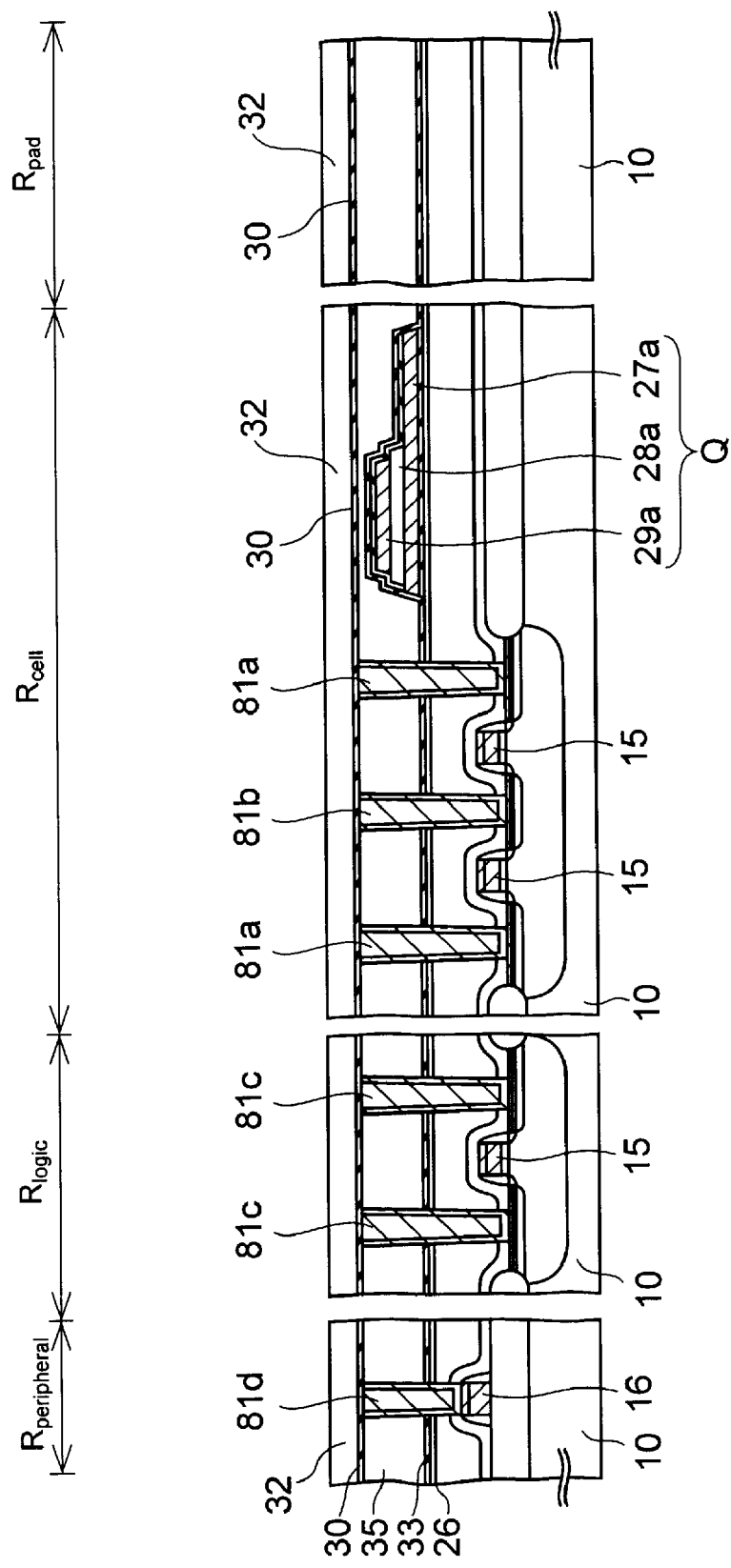

Next, as depicted in FIG. 13C, by the sputtering method, an alumina film is formed, as a third capacitor protection insulating film 30, with a thickness of 50 nm to 100 nm on each of the upper surfaces of the first interlayer insulating film 35 and the first to fourth lower conductive plugs 81a to 81d.

As described in the first embodiment, the third capacitor protection insulating film 30 play a role to block reducing materials such as moisture and hydrogen, thereby preventing a capacitor dielectric film 28a from being deteriorated by these materials.

Furthermore, on the third capacitor protection insulating film 30, a silicon oxide film is formed, as a second cap insulating film 32, with a thickness of approximately 200 nm to 300 nm by a plasma CVD method using a TEOS gas.

Figure 13D:
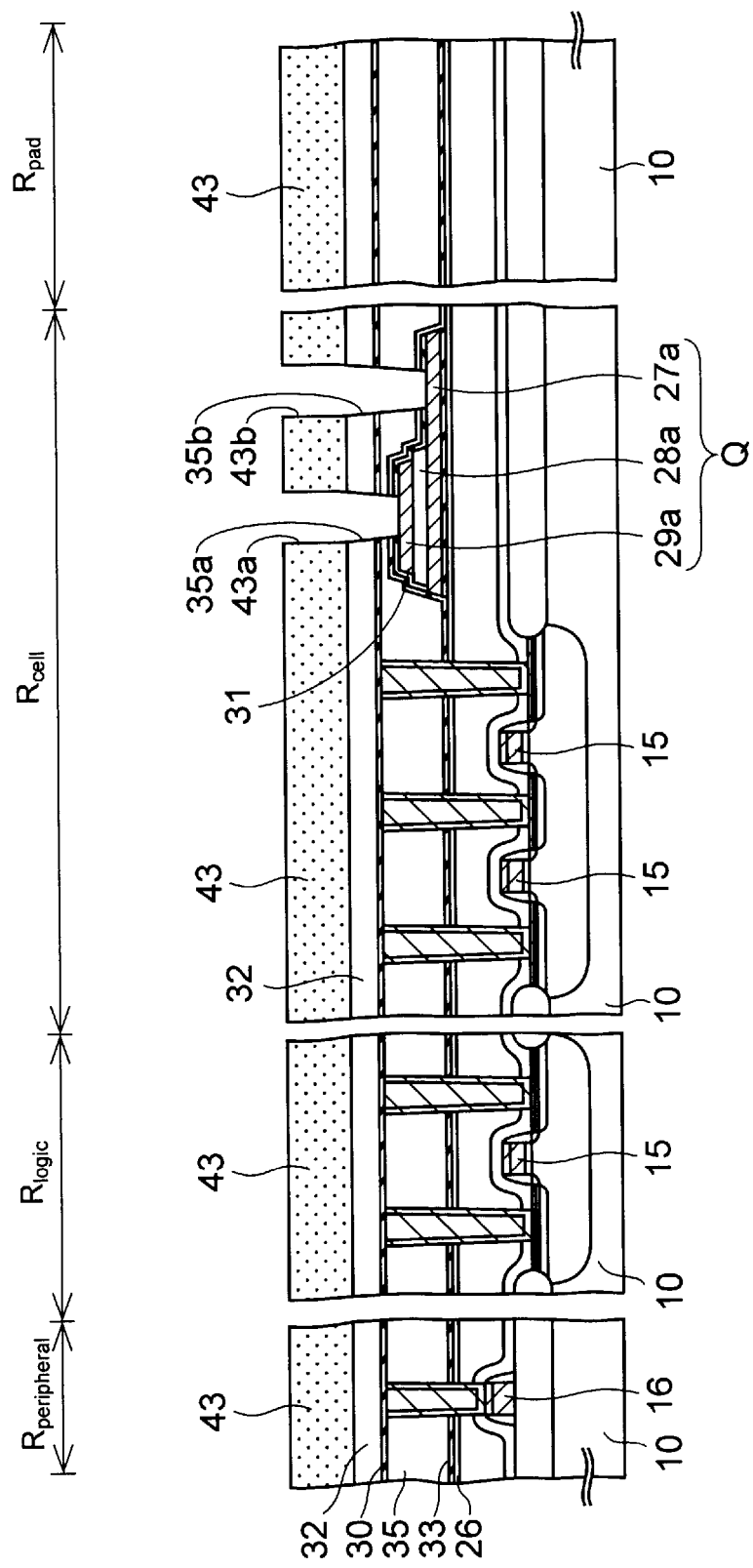

Subsequently, as depicted in FIG. 13D, a photoresist is applied on the second cap insulating film 32. The photoresist is then exposed and developed, so as to form a second resist pattern 43 including fifth and sixth hole-shaped windows 43a and 43b over an upper electrode 29a and a lower electrode 27a.

Next, by using the second resist pattern 43 as a mask, the second cap insulating film 32, the first interlayer insulating film 35, and the first to third capacitor protection insulating films 31, 33, and 30 are etched, so that a first hole 35a is formed on the upper electrode 29a and a second hole 35b is formed on the contact region of the lower electrode 27a.

After that, the second resist pattern 43 is removed. Thereafter, to recover damages received in the capacitor dielectric film 28a during the processes so far, recovery annealing is performed on the capacitor dielectric film 28a by putting a silicon substrate 10 in a vertical furnace being filled with an oxygen-containing atmosphere, under the conditions of the substrate temperature of 500° C. and the processing time of 60 minutes. The flow rate of oxygen at that time is set to, for example, 20 liters per minute.

Even when the annealing is performed in the oxygen atmosphere in this manner, the first to fourth lower conductive plugs 81a to 81d are prevented from being oxidized because the third capacitor protection insulating film 30 prevents oxygen from entering the plugs 81a to 81d.

Figure 13E:
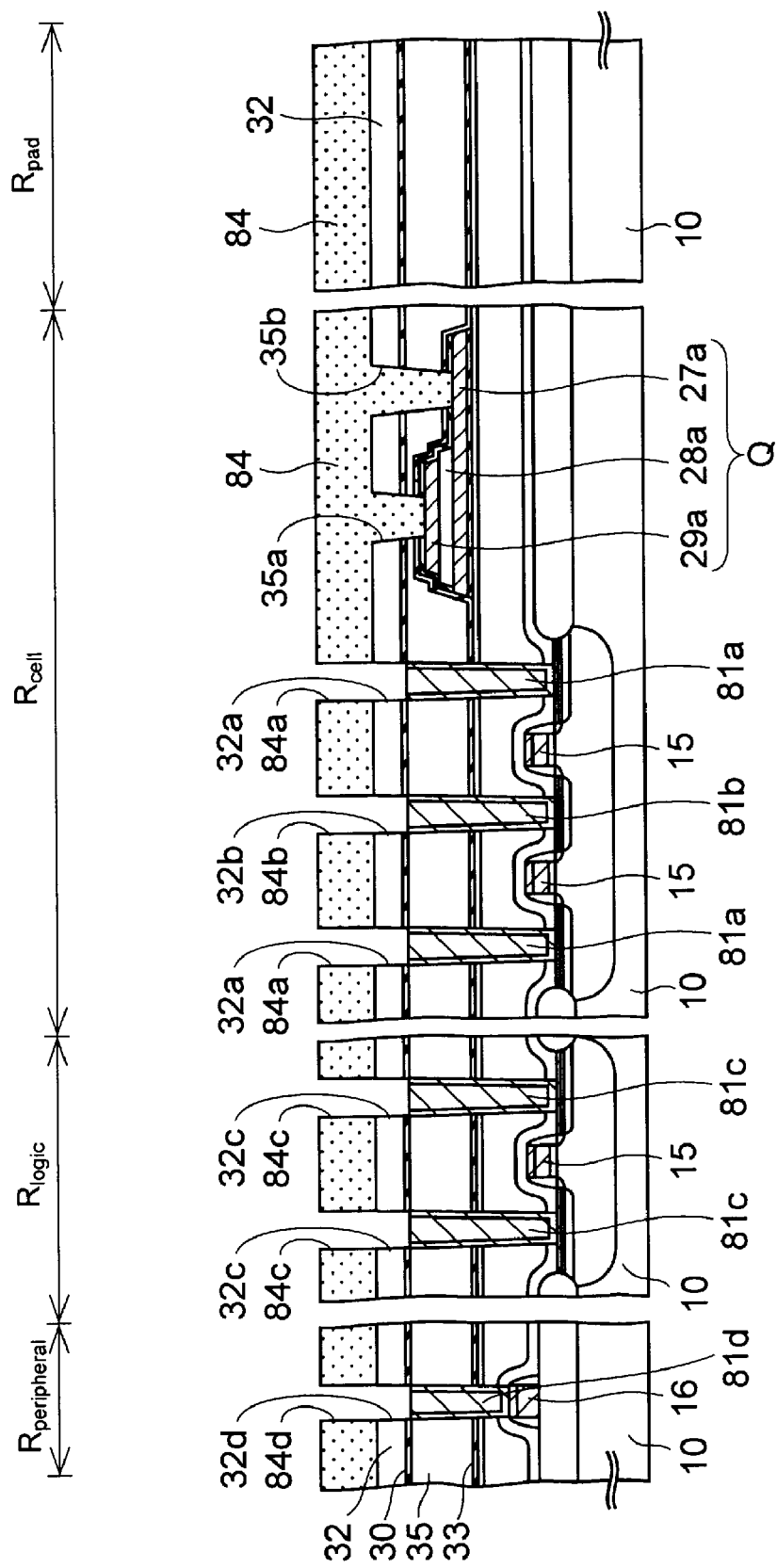

Next, as depicted in FIG. 13E, a photoresist is applied on the second cap insulating film 32 and in the first and second holes 35a and 35b. The photoresist thus applied is then exposed and developed so as to form a fifth resist pattern 84.

As depicted in FIG. 13E, the fifth resist pattern 84 includes ninth and twelfth windows 84a to 84d over the first to fourth lower conductive plugs 81a to 81d, respectively.

After that, by using the fifth resist pattern 84 as a mask, the second cap insulating film 32 and the third capacitor protection insulating film 30 are etched to form first to fourth upper contact holes 32a to 32d in these insulating films on the first to fourth lower conductive plugs 81a to 81d respectively.

After this etching is finished, the fifth resist pattern 84 is removed.

In the present embodiment, the third capacitor protection insulating film 30 is formed directly on the first to fourth lower conductive plugs 81a to 81d. Accordingly, the third capacitor protection insulating film 30 protects these conductive plugs 81a to 81d from the oxygen atmosphere. Thus, the generation of contact failure due to the oxidation of the individual conductive plugs 81a to 81d can be suppressed until this etching is performed.

Figure 13F:
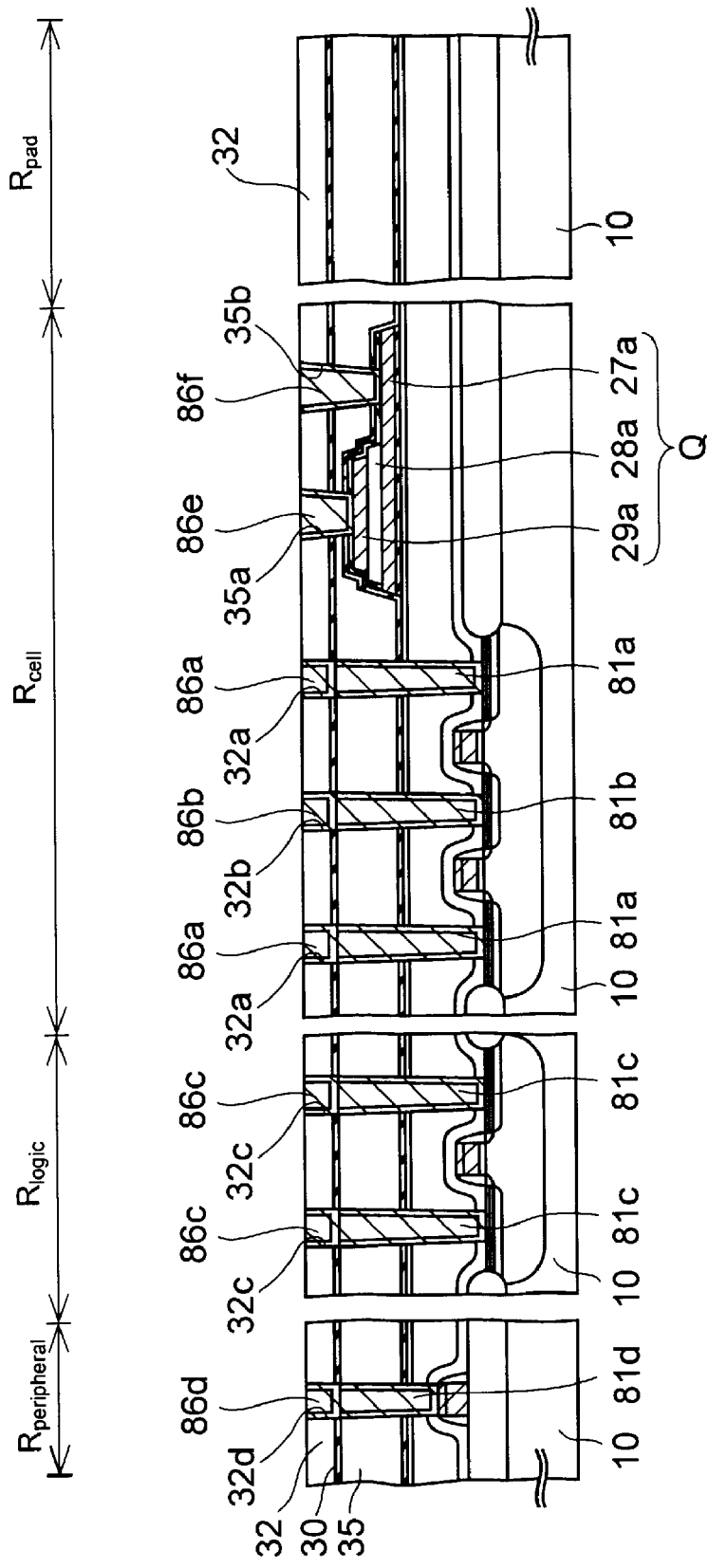

Subsequently, as depicted in FIG. 13F, first to fourth upper conductive plugs 86a to 86d are respectively formed in the first to fourth upper contact holes 32a to 32d. Additionally, an upper-electrode conductive plug 86e and a lower-electrode conductive plug 86f are respectively formed in the first and second holes 35a and 35b.

These conductive plugs 86a to 86f are formed in such a manner that, for example, a glue film such as a titanium nitride film and a tungsten film are formed in the upper contact holes 32a to 32d and in the first and second holes 35a and 35b, and then the unnecessary glue film and the tungsten film on the second cap insulating film 32 are polished and removed by the CMP method.

In addition, the first to fourth upper conductive plugs 86a to 86d are electrically connected to the first to fourth lower conductive plugs 81a to 81d formed thereunder respectively. The upper-electrode conductive plug 86e and the lower-electrode conductive plug 86f are electrically connected to the upper electrode 29a and the lower electrode 27a, respectively.

Figure 13G:
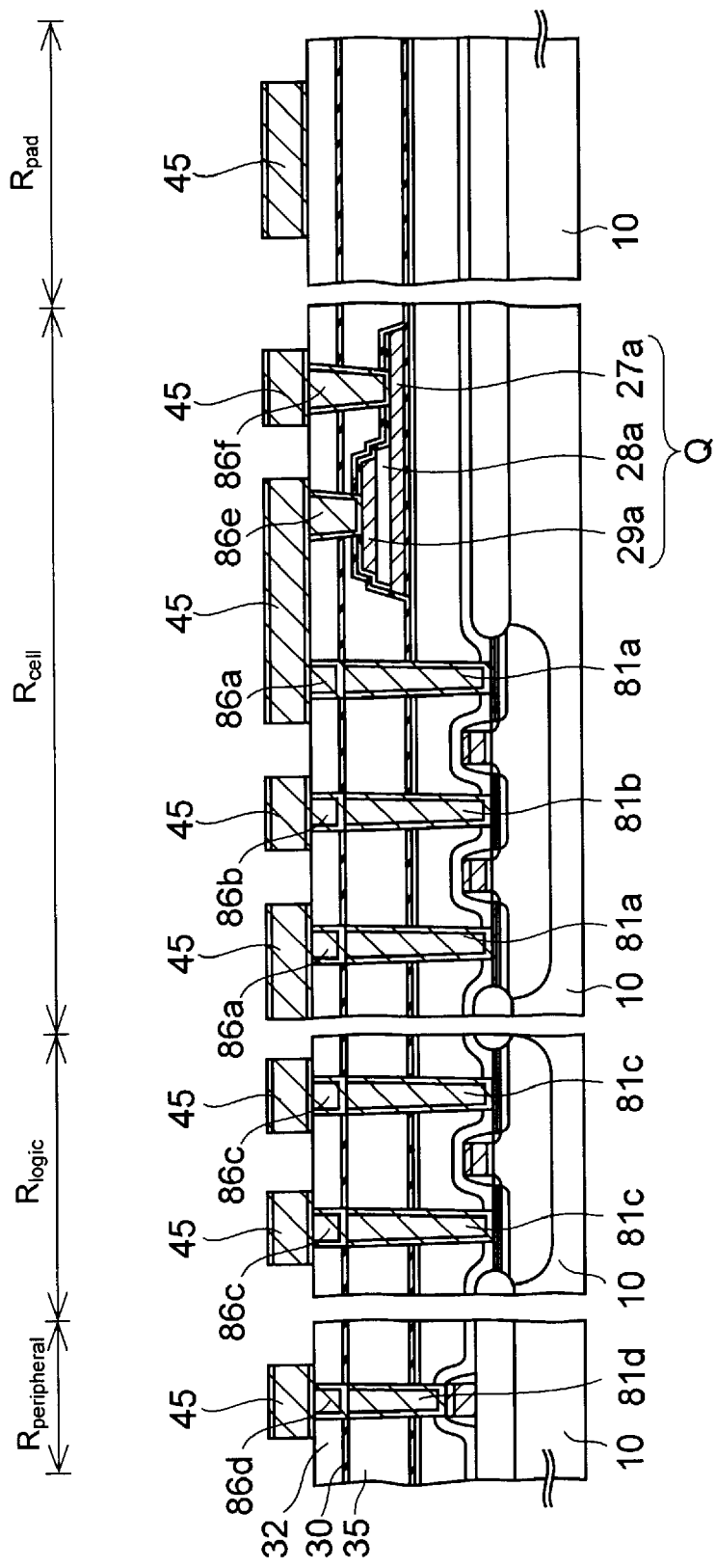

Next, as depicted in FIG. 13G, a metal stacked film is formed on each of the second cap insulating film 32 and the conductive plugs 86a to 86f. The metal stacked film is then patterned to form first metal interconnections 45. As the metal stacked film, for example, a titanium nitride film with a thickness of approximately 150 nm, a copper-containing aluminum film with a thickness of approximately 550 nm, a titanium film with a thickness of approximately 5 nm, and a titanium nitride film with a thickness of approximately 150 nm are formed in this order.

Figure 13H:
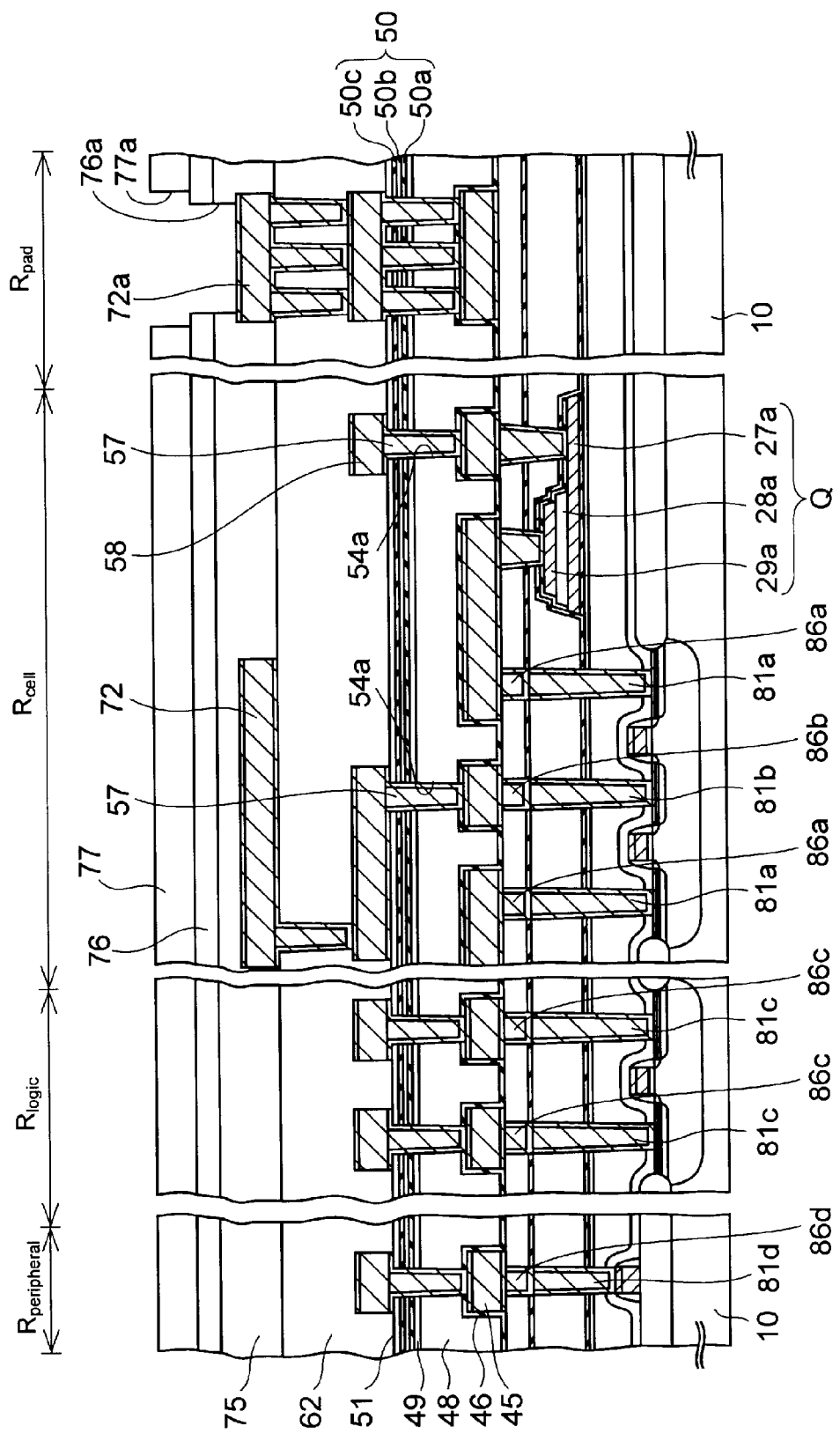

After that, the processes of FIGS. 4P to 5F described in the first embodiment are performed to complete a basic structure of the semiconductor device according to the present embodiment as depicted in FIG. 13H.

In the above-described present embodiment, as depicted in FIG. 13H, the conductive plugs on the first to third source/drain regions 19a to 19c are formed in two separate steps constituted of the first to fourth lower conductive plugs 81a to 81d and the first to fourth upper conductive plugs 86a to 86d, respectively.

According to this structure, as compared with the case where the contact holes 38a to 38d are formed by the simultaneous etching like the process of FIG. 4L in the first embodiment, an etching amount at the time of forming the first to fourth lower contact holes 80a to 80d in FIG. 13A becomes small.

For this reason, in the process of FIG. 13A, the over etching performed for completely opening the first to fourth lower contact holes 80a to 80d is prevented from being excessive. Thus, even when the first contact holes 80a, for example, are formed on a device isolation insulating film 11 by being misaligned from the first source/drain regions 19a, it is possible to reduce a risk that the first contact holes 80a pass through the device isolation insulating film 11 and reach the silicon substrate 10.

Moreover, similar to the first embodiment, two layers of first and second insulating metal oxide films 50a and 50c for preventing the entry of reducing materials such as hydrogen and moisture are formed in the fifth capacitor protection insulating film 50 (see FIG. 13H). Accordingly, the capacitor dielectric film 28a can be effectively prevented from being deteriorated by the reducing materials.

Furthermore, an intermediate insulating film 50b constituting the fifth capacitor protection insulating film 50 is made of a silicon oxide-based material having a low dielectric constant, and this material is similar to that for the second interlayer insulating film 48. Accordingly, the intermediate insulating film 50b and the second interlayer insulating film 48 have a substantially same etching rate. Thus, third holes 54a can be formed in fine shapes in these insulating films 48a and 50b by the etching. As a result, the fifth conductive plugs 57 in the third holes 54a are connected to the first metal interconnections 45 at wider contact areas, so that the contact resistance of the fifth conductive plug 57 can be stabilized.

Modifications of Second Embodiment

Next, modifications of the second embodiment are described below by referring to FIGS. 14 and 15. Note that, in these figures, same reference numerals are given to denote components same as those described in the second embodiment, and the descriptions thereof are omitted below.

First Modification

Figure 14:
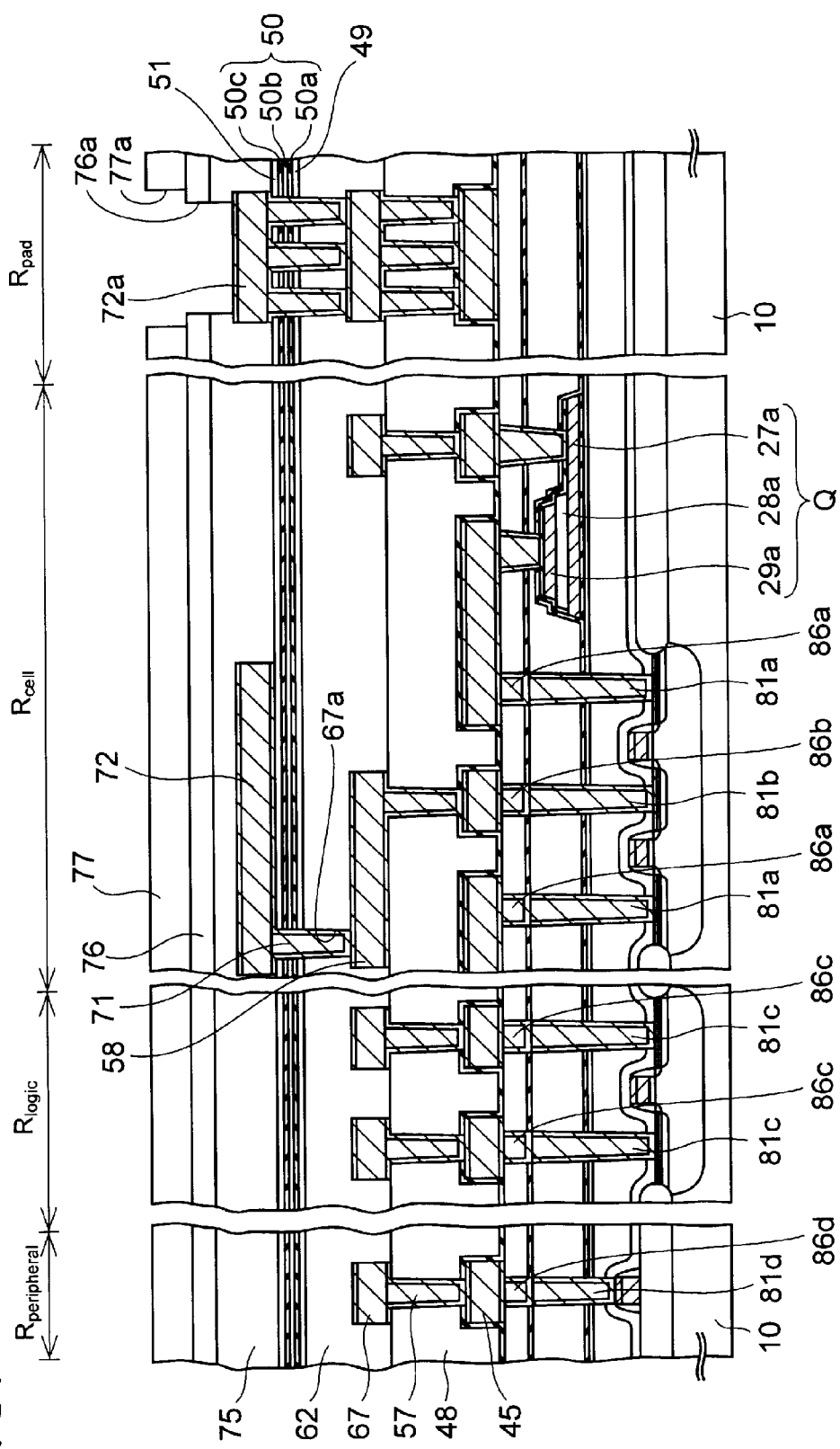
FIG. 14 is a cross-sectional view of a semiconductor device according to a first modification of the second embodiment.

FIG. 14 is a cross-sectional view of a semiconductor device according to a first modification of the second embodiment.

In the first modification, the third cap insulating film 49, the fifth capacitor protection insulating film 50, and the cover insulating film 51 are formed between the third interlayer insulating film 62 and each third metal interconnection 72.

In this case, fourth holes 67a are also formed in these insulating films 49 to 51.

The intermediate insulating film 50b constituting the fifth capacitor protection insulating film 50 is made of a silicon oxide-based material, similar to the third interlayer insulating film 62. Accordingly, when the fourth holes 67a are formed by the etching, there is not generated a substantial difference in etching rate between the intermediate insulating film 50b and the third interlayer insulating film 62.

For this reason, the diameter of the lower end of the fourth hole 67a is made wider and become nearly equal to the diameter of the upper end thereof. Thus, the contact resistance of each sixth conductive plug 71 can be stabilized.

Second Modification

Figure 15:
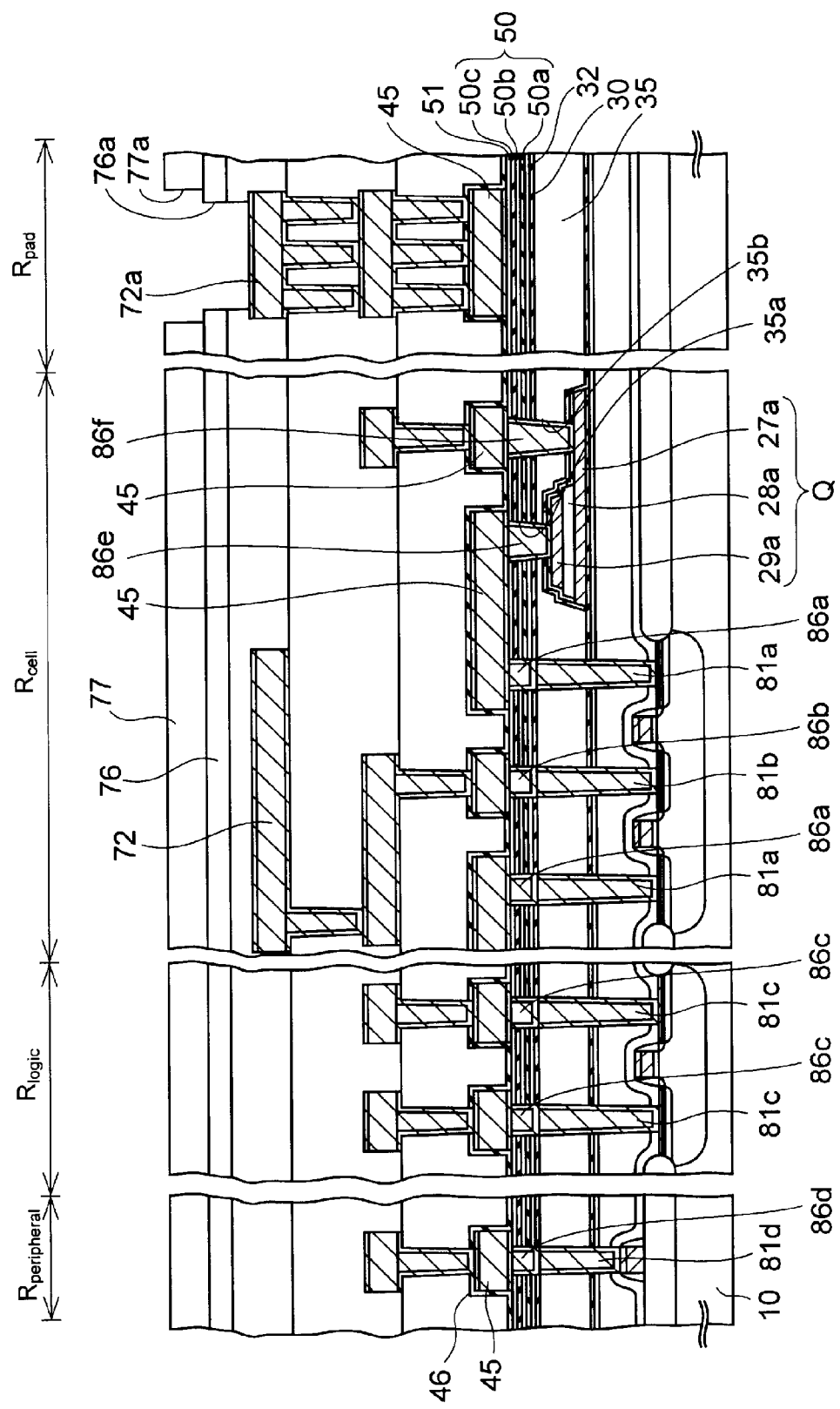
FIG. 15 is a cross-sectional view of a semiconductor device according to a second modification of the second embodiment.

FIG. 15 is a cross-sectional view of a semiconductor device according to a second modification of the second embodiment.

In the second modification, the fifth capacitor protection insulating film 50 and the cover insulating film 51 are formed between the first interlayer insulating film 35 and each first metal interconnection 45.

In this case, the first and second holes 35a and 35b in the first interlayer insulating film 35 and the first to fourth upper contact holes 32a to 32d described in FIG. 13E are also formed in the insulating films 50 and 51.

Even with such configuration, there is not generated a substantial difference in etching rate between the intermediate insulating film 50b and the first interlayer insulating film 35 when the above-described holes 32a to 32d, 35a and 35b are formed by the etching. This is because the intermediate insulating film 50b in the fifth capacitor protection insulating film 50 and the first interlayer insulating film 35 are both made of a silicon oxide-based material. Thus, the bottoms of the individual holes 32a to 32d, 35a and 35b can be formed substantially large, so that the contact resistances of the conductive plugs 86a to 86f which are filled in these holes can be stabilized.

Third Embodiment

Next, a semiconductor device according to a third embodiment of the present invention is described along with manufacturing processes thereof.

Figure 16A:
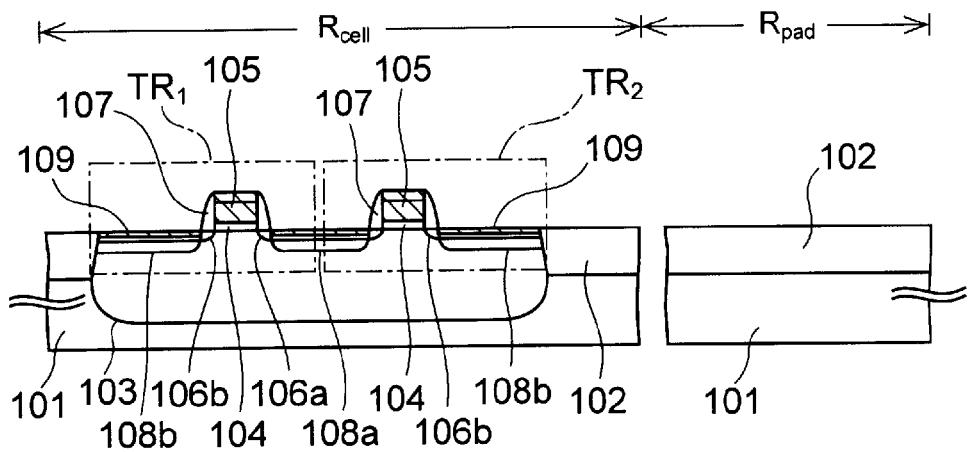
FIGS. 16A to 16U are cross-sectional views of a semiconductor device according to a third embodiment during the course of manufacturing.
Figure 16B:
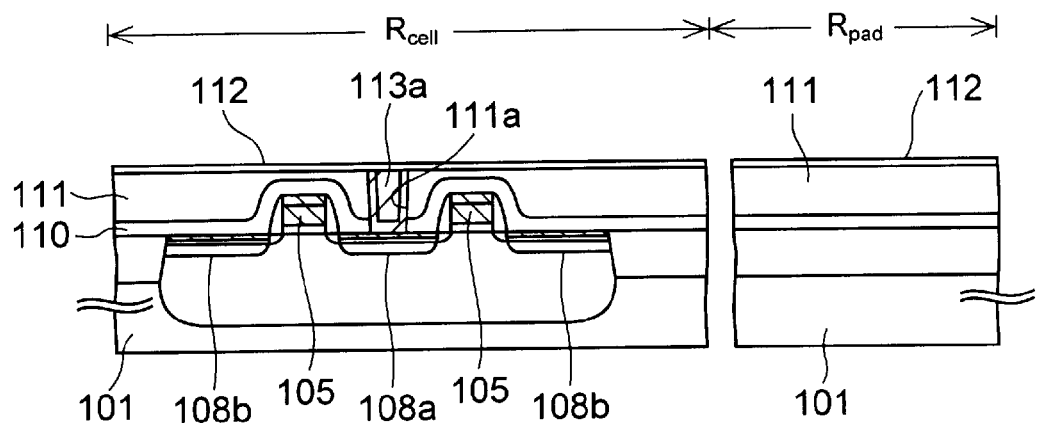
Figure 16C:
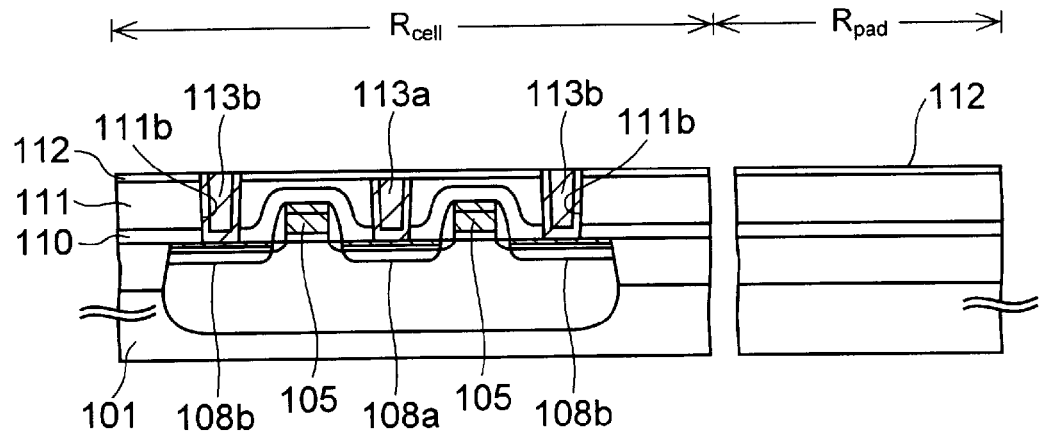
Figure 16D:
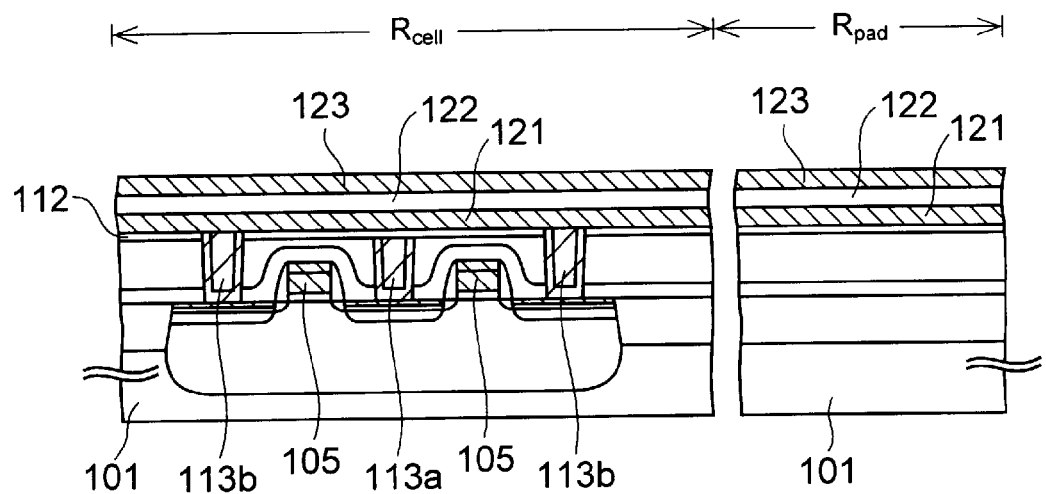
Figure 16E:
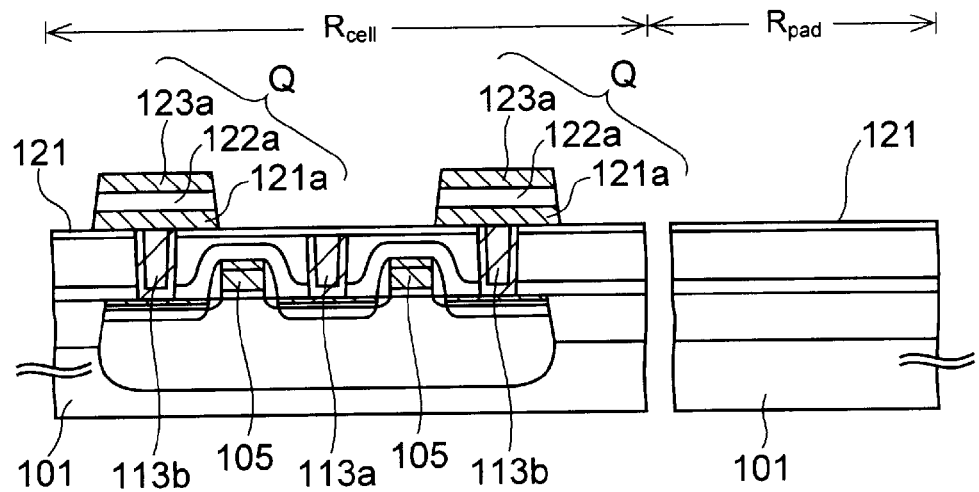
Figure 16F:
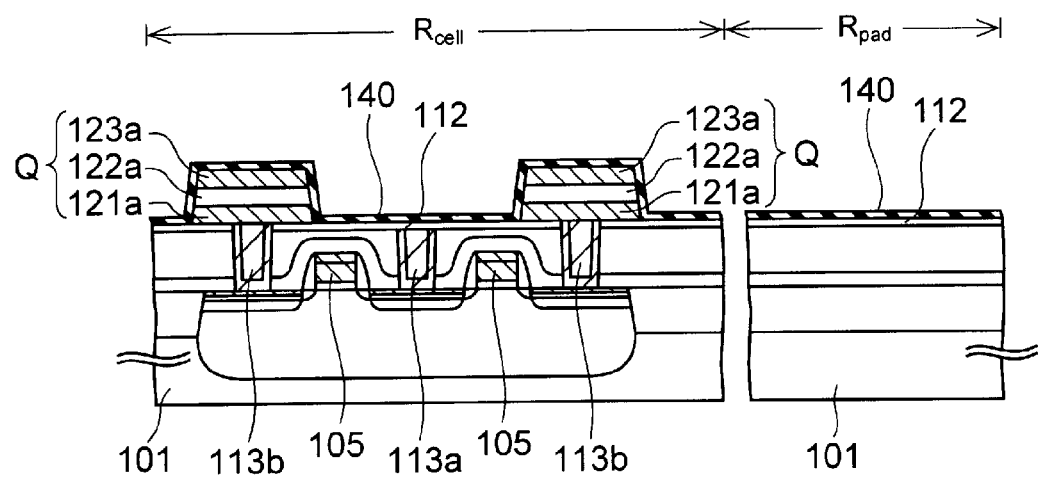
Figure 16G:
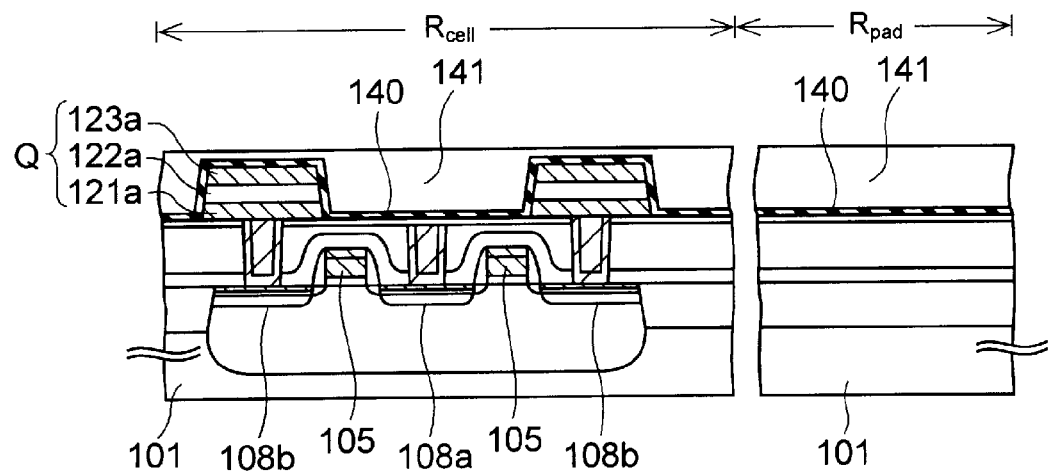
Figure 16H:
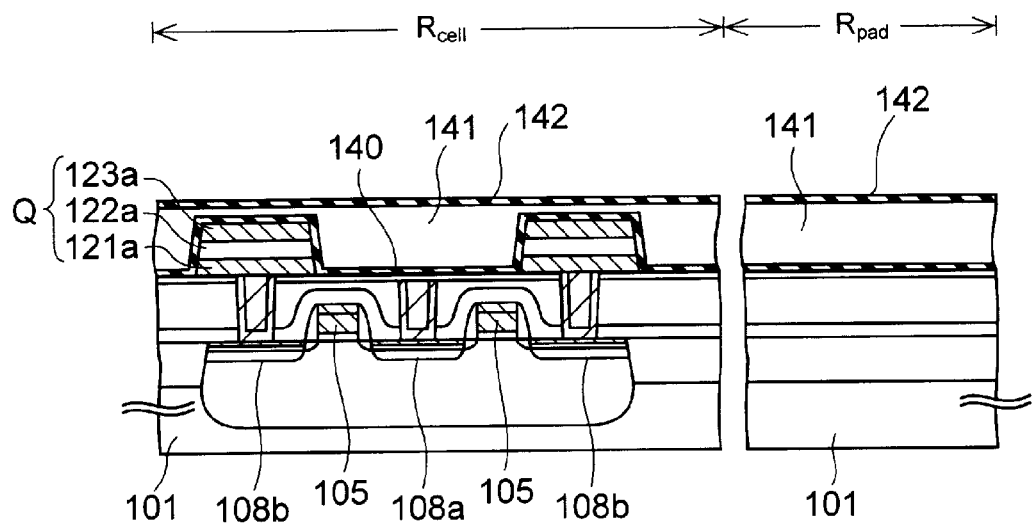
Figure 16I:
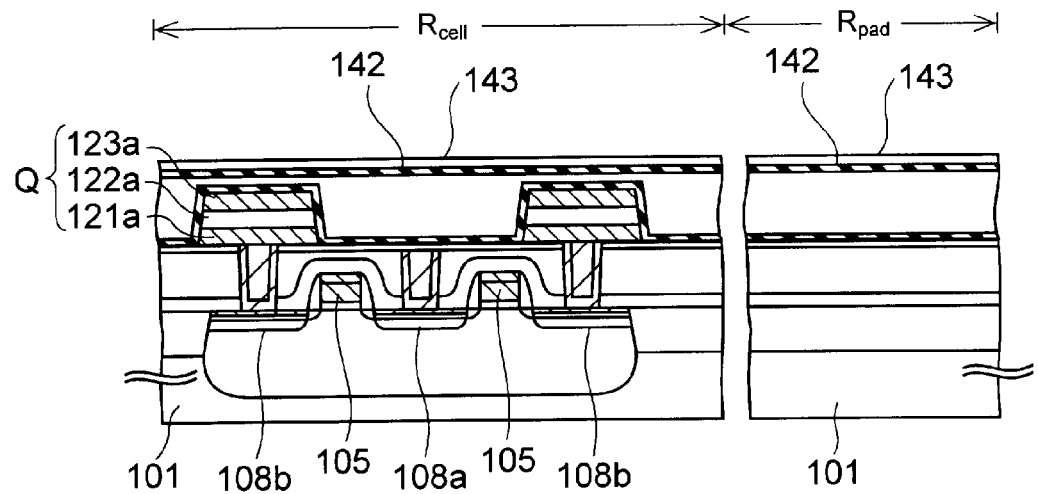
Figure 16J:
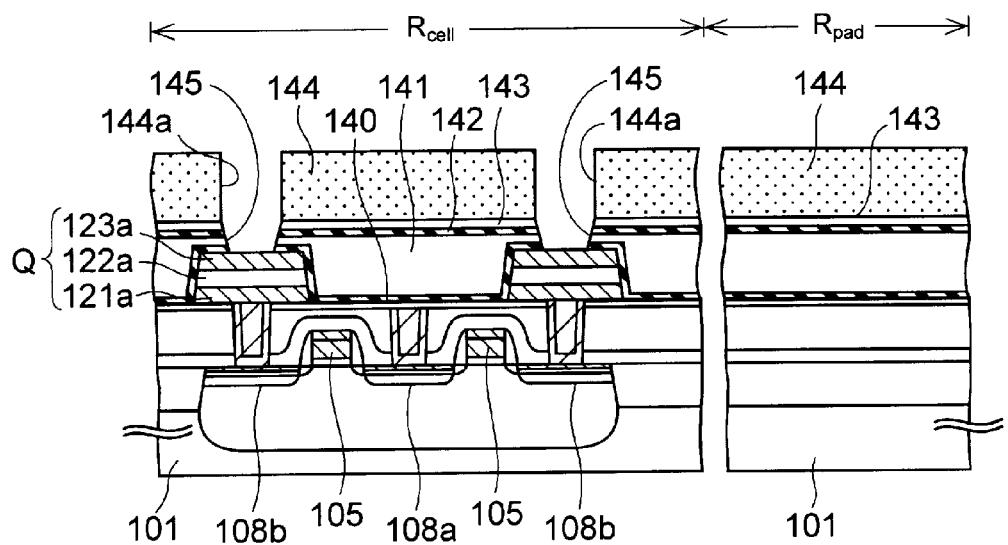
Figure 16K:
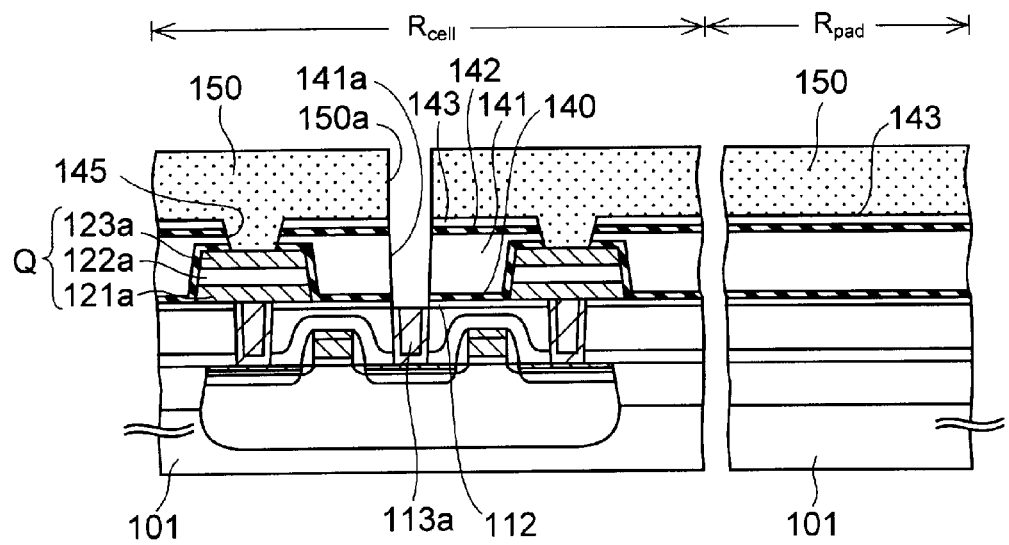
Figure 16L:
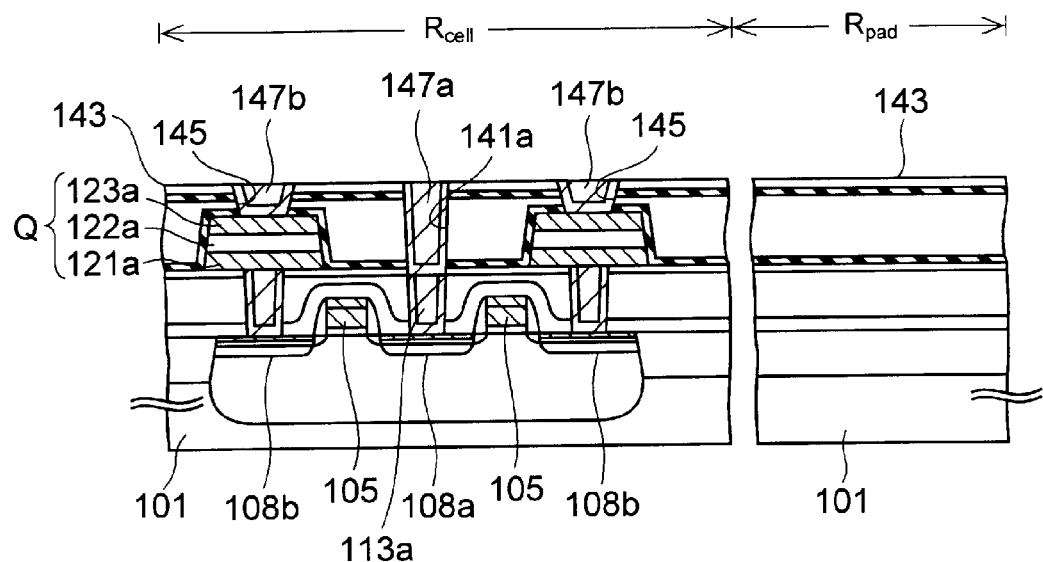
Figure 16M:
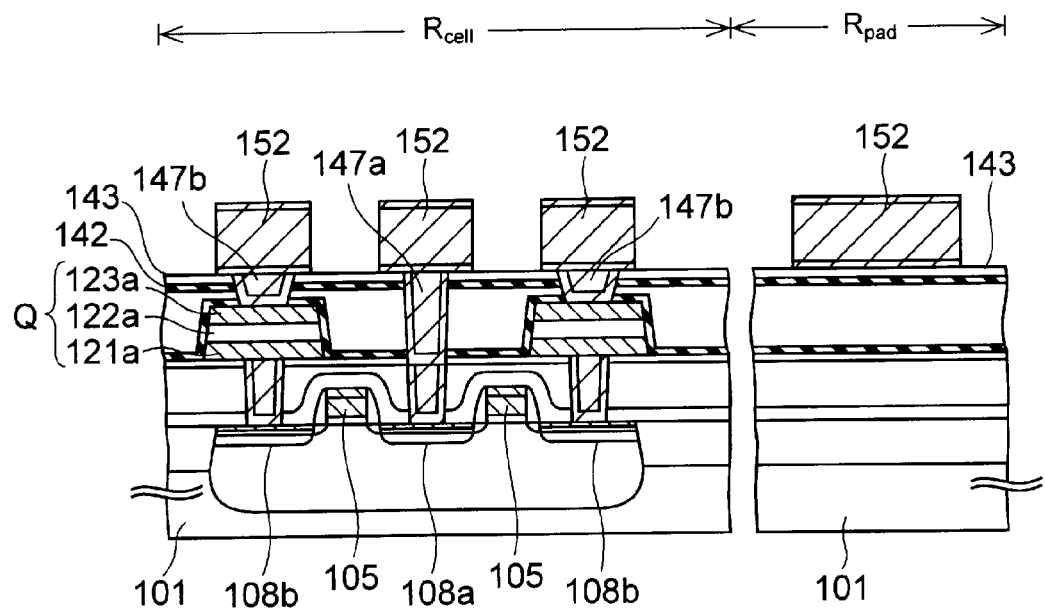
Figure 16N:
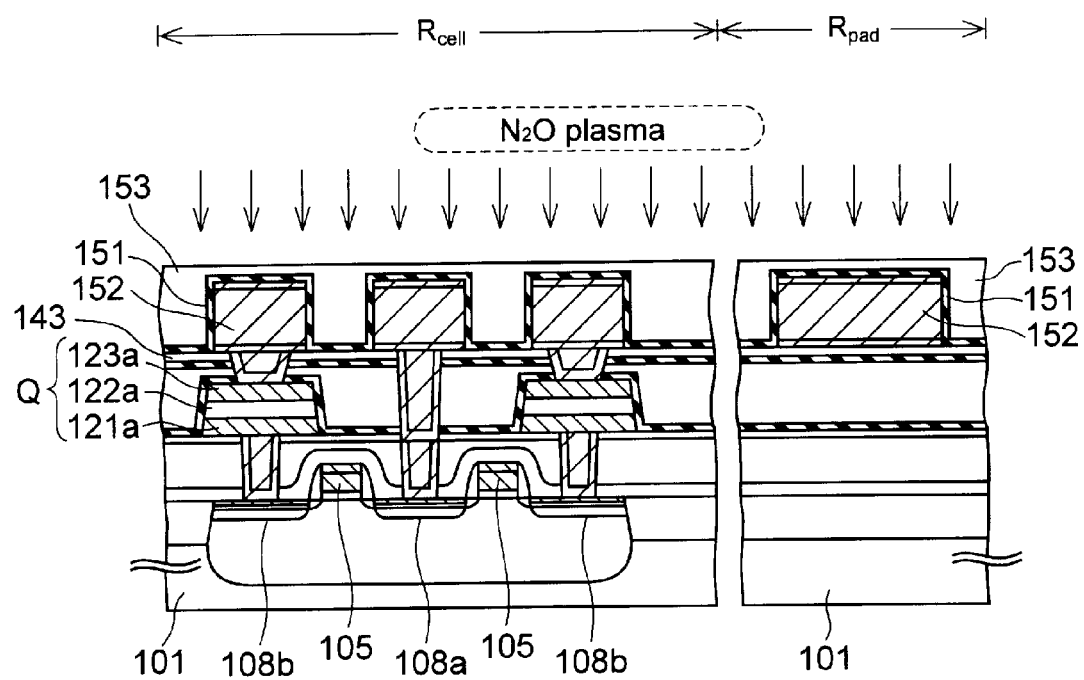
Figure 16O:
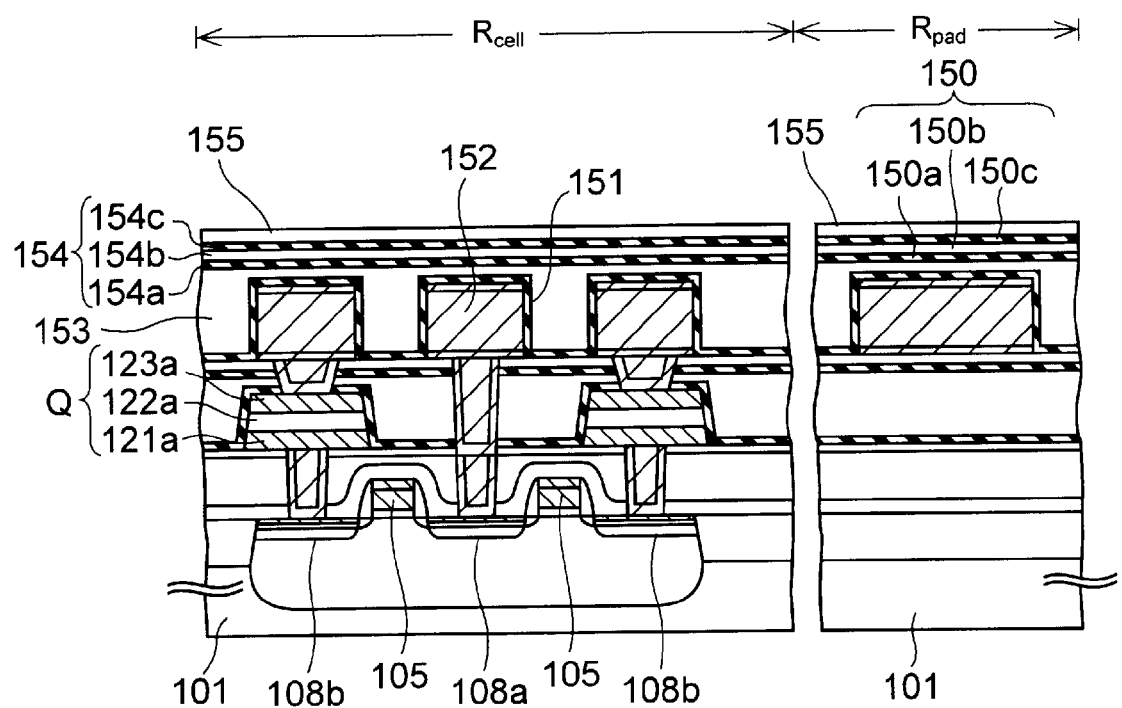
Figure 16P:
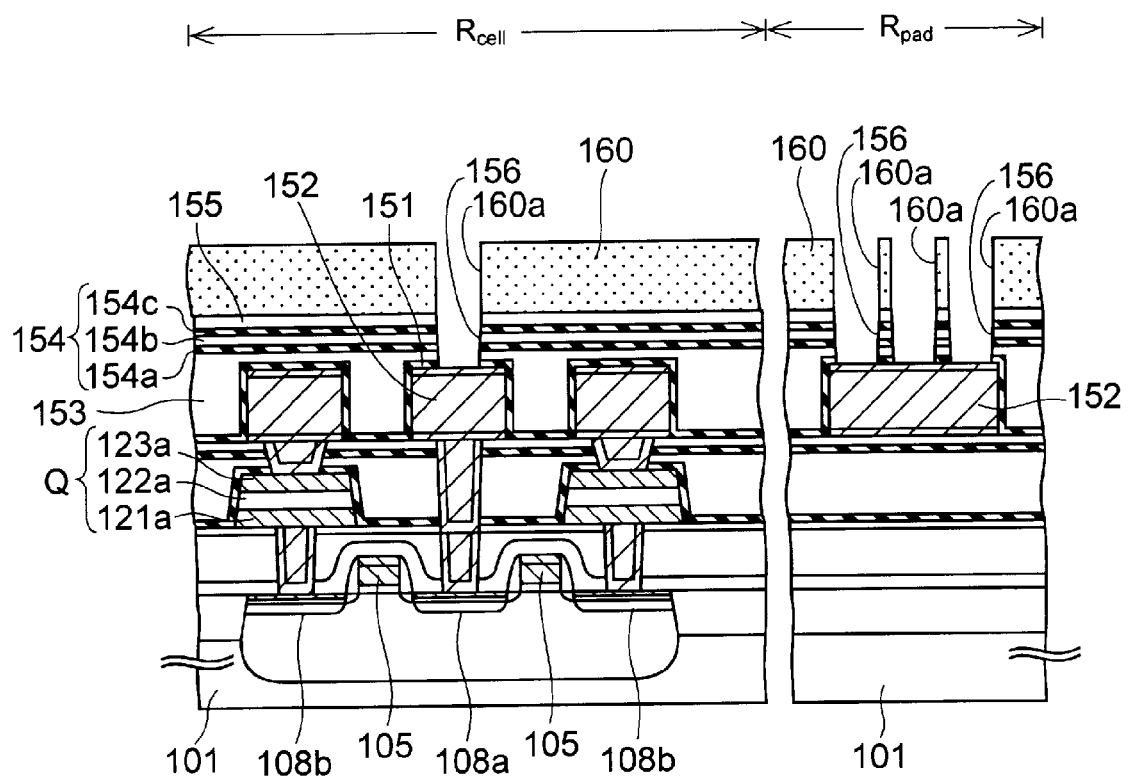
Figure 16Q:
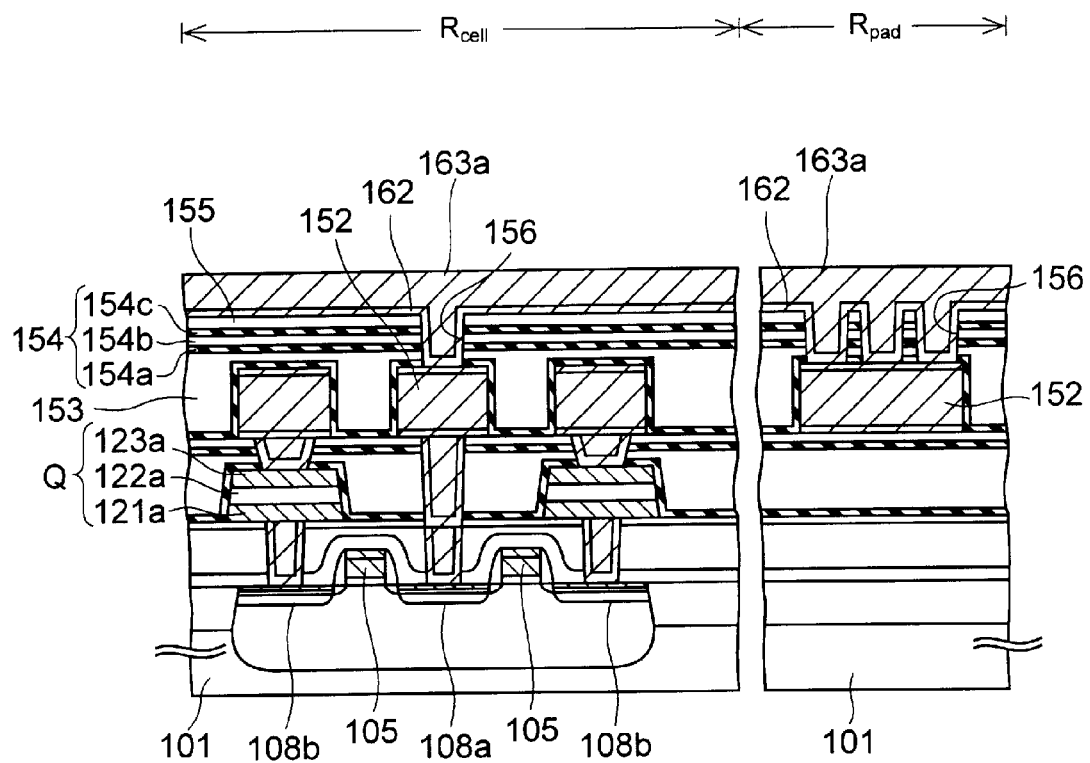
Figure 16R:
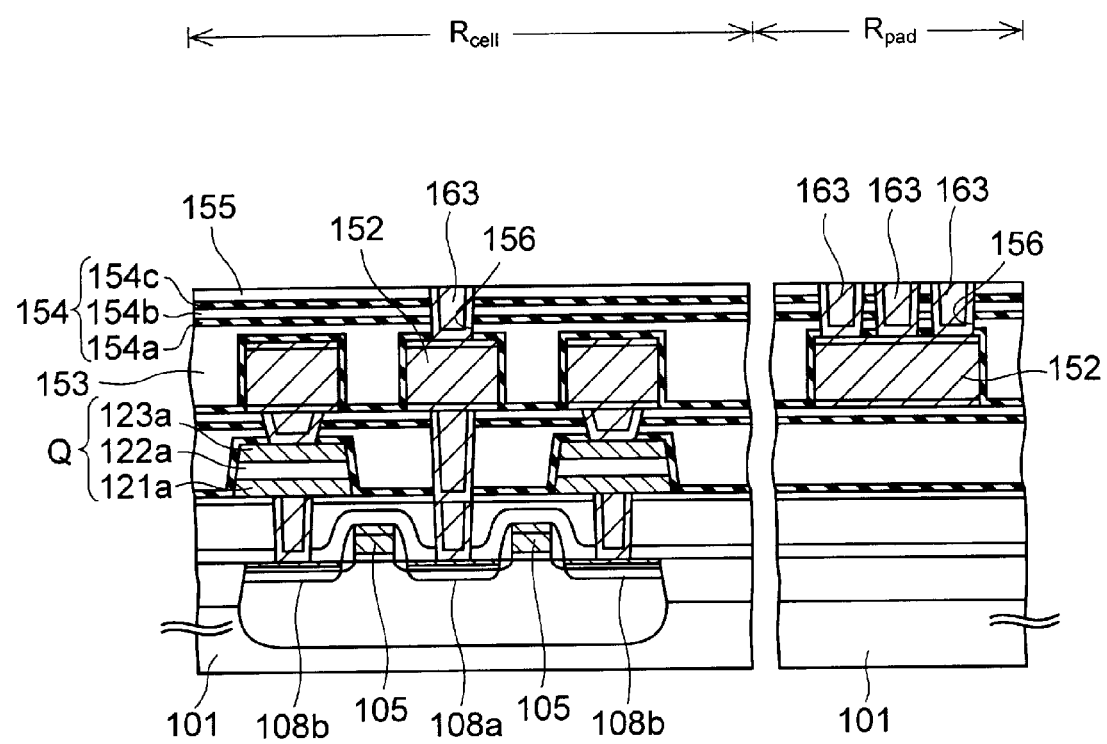
Figure 16S:
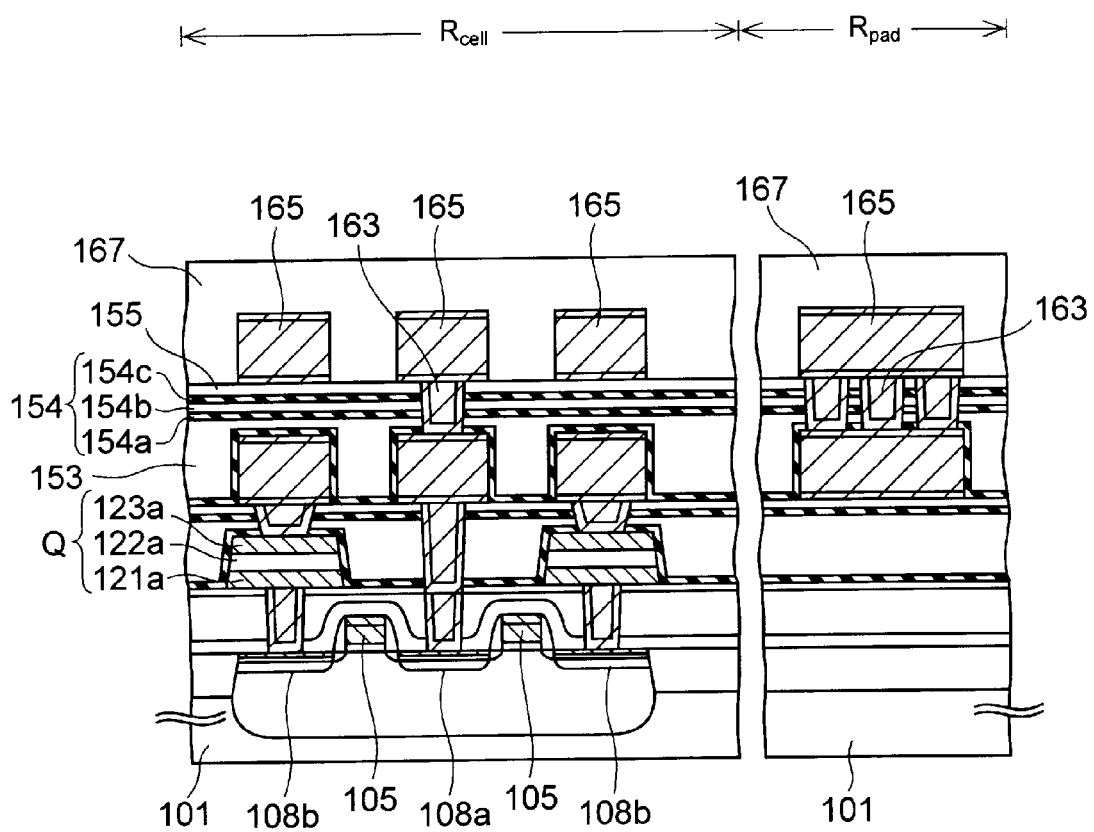
Figure 16T:
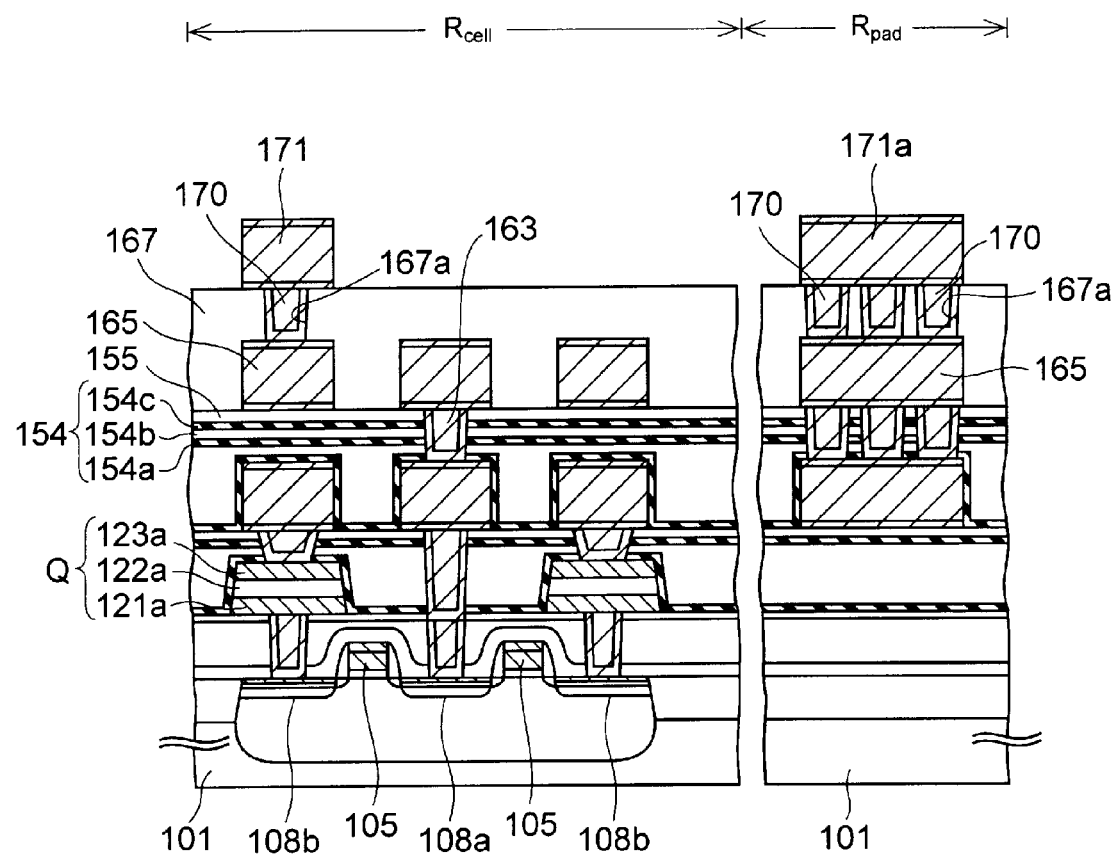
Figure 16U:
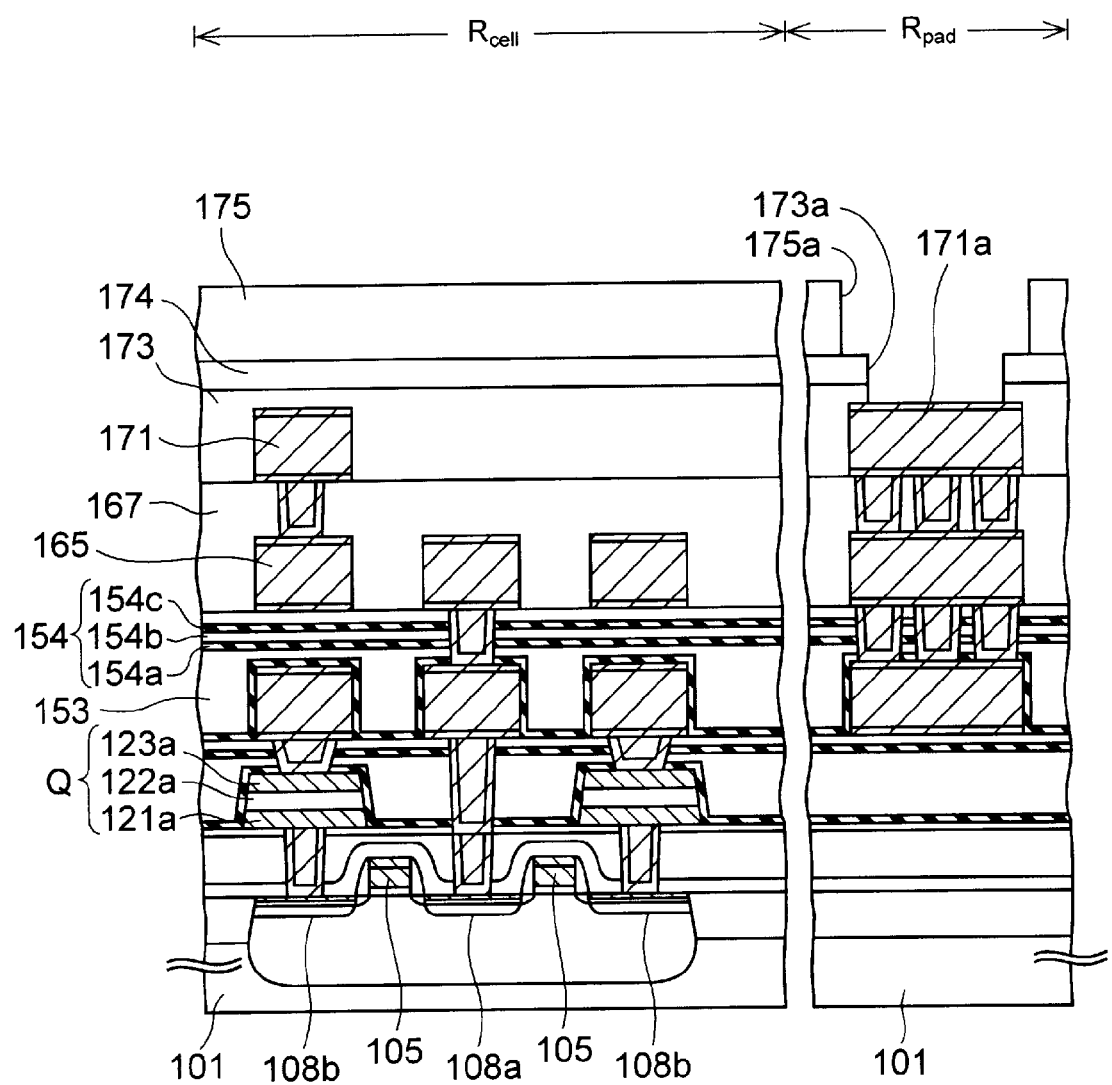

FIGS. 16A to 16U are cross-sectional views of a semiconductor device according to the present embodiment during the manufacturing thereof. In these figures, a cell region $R_{cell}$ and a pad region $R_{pad}$ in one semiconductor chip are depicted together.

This semiconductor device is a stack-type FeRAM which is an advantage in micro-fabrication, and is manufactured in the following manner.

Firstly, processes for obtaining a cross-sectional structure depicted in FIG. 16A are described.

Firstly, an STI trench for defining an active region of a transistor is formed in a surface of an n type or p type silicon substrate 101. An insulating film such as silicon oxide is then filled in the trench so as to form a device isolation insulating film 102. Note that the device isolation structure is not limited to STI and the device isolation insulating film 102 may be formed by the LOCOS method.

Subsequently, p type impurities are introduced into the active region of the silicon substrate 101 so as to form a p well 103. Thereafter, the surface of the active region is thermally oxidized to form a thermal oxidation film serving as a gate insulating film 104.

After that, an amorphous or polycrystalline silicon film is formed on the entire upper surface of the silicon substrate 101. These films are patterned by photolithography to form two gate electrodes 105.

The two gate electrodes 105 are disposed on the p well 103 in such a way as to be spaced apart from and parallel with each other. These gate electrodes 105 constitute a part of ward lines.

Next, n type impurities are introduced into the silicon substrate 101 beside the gate electrode 105 by ion implantation using the gate electrodes 105 as masks, so that first and second source/drain extensions 106a and 106b are formed.

After that, an insulating film is formed on the entire upper surface of the silicon substrate 101. The insulating film is then etched back to form insulating side walls 107 on the sides of each gate electrode 105. As the insulating film, a silicon oxide film is formed by the CVD method, for example.

Subsequently, by using the insulating side walls 107 and the gate electrodes 105 as masks, ions of n type impurities are implanted again into the silicon substrate 101, so that first and second source/drain regions 108a and 108b are formed in the surface of the silicon substrate 101 beside the two gate electrodes 105.

Next, a refractory metal layer such as a cobalt layer is formed by the sputtering method on the entire upper surface of the silicon substrate 101. Thereafter, the refractory metal layer is heated to be reacted with silicon, so that a refractory metal silicide layer 109 is formed on the silicon substrate 101. The refractory metal silicide layer 109 is also formed on the surface portion of each gate electrode 105, so that the resistance of the gate electrode 105 is lowered.

After that, the refractory metal layer which is left unreacted on the device isolation insulating film 102 and the like are removed by wet etching.

With the processes up to this point, first and second MOS transistors $TR_1$ and $TR_2$, each of which includes the gate insulating film 104, the gate electrode 105, and the first and second source/drain regions 108a and 108b, are formed in the active region of the silicon substrate 101.

Next, as depicted in FIG. 16B, by the plasma CVD method, a silicon oxynitride film is formed with a thickness of approximately 80 nm on the entire upper surface of the silicon substrate 101. The resultant film serves as an etching stopper film 110. Subsequently, by a plasma CVD method using a TEOS gas, a silicon oxide film is formed, as a base insulating film 111, with a thickness of approximately 1100 nm on the etching stopper film 110.

After that, the upper surface of the base insulating film 111 is polished and thus planarized by the CMP method. As a result of the CMP, the thickness of the base insulating film 111 becomes approximately 800 nm on the planar surface of the silicon substrate 101.

Thereafter, the base insulating film 111 and the etching stopper film 110 are patterned by photolithography to form a first contact hole 111a in these insulating films on the first source/drain region 108a. The patterning is performed in two-step etching including the etching of the base insulating film 111 and the etching of the etching stopper film 110.

Subsequently, by the sputtering method, a titanium film with a thickness of approximately 30 nm and a titanium nitride film with a thickness of approximately 50 nm are formed in this order on the upper surface of the base insulating film 111 and on the inner surface of the first contact hole 111a. The titanium film and the titanium nitride film thus formed serve as a glue film.

Furthermore, by using a plasma CVD method using a tungsten hexafluoride gas, a tungsten film is formed on the glue film, so that the first contact hole 111a is completely filled with the tungsten film.

After that, the unnecessary glue film and the tungsten film on the base insulating film 111 are polished and removed, so that the glue film and the tungsten film are left only in the first hole 111a as a first conductive plug 113a.

Here, the first conductive plug 113a, which is mainly made of tungsten, is easily oxidized when coming in contact with oxygen, and thus is likely to cause contact failure.

To deal with this problem, a silicon oxynitride film is formed, as an oxidation preventive insulating film 112, is formed with a thickness of approximately 100 nm on each of the upper surfaces of the first conductive plug 113a and the base insulating film 111. The oxidation preventive insulating film 112 protects the first conductive plug 113a from an oxygen atmosphere.

Next, as depicted in FIG. 16C, the individual insulating films 110 to 112 are patterned to form second contact holes 111b in these insulating films on the second source/drain regions 108b. This patterning is performed in three-step etching including the etching of the oxidation preventive insulating film 112, the etching of the base insulating film 111, and the etching of the etching stopper film 110.

In addition, second conductive plugs 113b are respectively formed in the second contact holes 111b by employing the same method as those for forming the first conductive plug 113a.

Subsequently, as depicted in FIG. 16D, an iridium film is formed with a thickness of approximately 200 nm on each of the upper surfaces of the second conductive plugs 113b and the oxidation preventive insulating film 112 by the DC sputtering method. The iridium film thus formed serves as a first conductive film 121. The conditions for forming the iridium film are not particularly limited. In the present embodiment, an argon gas is used as a sputtering gas, the pressure in the chamber is approximately 0.11 Pa, the DC power is 0.5 kW, the film-forming time is 335 seconds, and the substrate temperature is 500° C.

Furthermore, by using an MOCVD method, a PZT film is formed, as a ferroelectric film 122, with a thickness of approximately 120 nm on the first conductive film 121. The MOCVD method is performed by setting, for example: the flow rate of tetrahydrofuran (THF: $C_4H_8O$) to 0.474 ml per minute; the flow rate of a Pb material to 0.326 ml per minute, the Pb material formed by dissolving $Pb(DPM)_2$ into the THF solvent at a concentration of 0.3 mol per liter; the flow rate of a Zr material to 0.2 ml per minute, the Zr material formed by dissolving $Zr(dmhd)_4$ into the THF solvent at a concentration of 0.3 mol per liter; and the flow rate of a Zr material to 0.2 ml per minute, the Zr material formed by dissolving $Ti(O-iPr)_2$ $(DPM)_2$ into the THF solvent at a concentration of 0.3 mol per liter. In addition, the film-forming pressure is approximately 5 Torr, the substrate temperature is approximately 620° C., and the film-forming time is approximately 620 seconds.

Note that the film-forming methods for the ferroelectric film 122 include a sputtering method and a sol-gel method in addition to the MOCVD method. Furthermore, the material for the ferroelectric film 122 is not limited to the above-described PZT. The ferroelectric film 122 may be made of: a Bi layer structure compound such as $SrBi_2Ta_2O_9$ and $SrBi_2(Ta, Nb)_2O_9$; a PLZT obtained by doping lanthanum into the PZT; or other metal oxide ferroelectrics.

After that, an iridium oxide film is formed with the thickness of 200 nm on the ferroelectric film 122 by the sputtering method. The resultant iridium oxide film serves as a second conductive film 123.

Subsequently, to recover damages received by the ferroelectric film 122 when the second conductive film 123 is formed, recovery annealing is performed in a furnace filled with an oxygen containing atmosphere, under conditions of the substrate temperature of 500° C. and the processing time of 60 minutes.

Next, as depicted in FIG. 16E, by using a hard mask (unillustrated) having capacitor upper electrode shapes as an etching mask, the first conductive film 121, the ferroelectric film 122, and the second conductive film 123 are simultaneously dry-etched so as to form capacitors Q including a lower electrode 121a, a capacitor dielectric film 122a, and an upper electrode 123a stacked in this order. The dry etching uses, for example, an etching gas containing a halogen gas.

Next, as depicted in FIG. 16F, an alumina film is formed with a thickness of approximately 20 nm on the entire upper surface of the silicon substrate 101 by an ALD (atomic layer deposition) method using a mixed gas of, for example, TMA (trimethyl aluminum) and $O_3$. The resultant alumina film serves as a first capacitor protection insulating film 140.

The first capacitor protection insulating film 140 has a function to block a reducing material such as hydrogen, thereby preventing the capacitor dielectric film 122a from being deteriorated due to reduction. Films having such a function include a titanium oxide film, a zirconium oxide film, a magnesium oxide film, and a titanium magnesium oxide film, in addition to the alumina film. Any one of these films may be formed as the first capacitor protection insulating film 140.

After that, recovery annealing is performed for recovering damages received by the capacitor dielectric film 122*a* during the manufacturing processes up to this point. The recovery annealing is performed in a furnace in the oxygen-containing atmosphere at a substrate temperature of approximately 560° C.

Next, as depicted in FIG. 16G, a silicon oxide film is formed on the first capacitor protection insulating film 140 by, for example, the plasma CVD method using the TEOS gas. The resultant silicon oxide film serves as a first interlayer insulating film 141.

Thereafter, the upper surface of the interlayer insulating film 141 is polished and thus planarized by the CMP method. With this CMP, the thickness of the interlayer insulating film 141 is made to be approximately 300 nm on each upper electrode 123*a*.

Note that a cover insulating film may be formed on this interlayer insulating film 141. The cover insulating film is formed for the purpose of filling microscratches formed in the upper surface of the interlayer insulating film 141 during the CMP and voids generated in the interlayer insulating film 141 between the adjacent capacitors Q. When such a cover insulating film is formed, a capability of coating a film to be formed thereon is improved. As the cover insulating film, a silicon oxide film with a thickness of approximately 50 nm which is formed by the plasma CVD method using the TEOS gas, may be employed, for example.

Next, as depicted in FIG. 16H, an alumina film is formed, as a second capacitor protection insulating film 142 for protecting the capacitor dielectric film 122*a* from reducing materials, with a thickness of approximately 40 nm by the sputtering method.

Note that dehydration annealing using $N_2O$ plasmas may be performed on the first interlayer insulating film 141 before the interlayer capacitor protection insulating film 142 is formed.

In addition, the second capacitor protection insulating film 142 is not limited to the alumina film. The second capacitor protection insulating film 142 may be of a single layer of an alumina film, a titanium oxide film, a silicon nitride film, or a silicon oxynitride film, or a stacked film of any of these films.

Subsequently, as depicted in FIG. 16I, a silicon oxide film is formed, as a first cover insulating film 143, with a thickness of approximately 100 nm to 150 nm on the second capacitor protection insulating film 142 by the plasma CVD method using the TEOS gas.

Next, processes for obtaining a cross-sectional structure depicted in FIG. 16J are described.

Firstly, a photoresist is applied on the cover insulating film 143. The photoresist is then exposed and developed, so as to form a first resist pattern 144 including first hole-shaped windows 144*a* over the upper electrode 123*a*.

Subsequently, the individual insulating films 140 to 143 are etched through the first windows 144*a* so as to form, in these insulating films, first holes 145 each with such a depth so as to reach the upper electrode 123*a*. Conditions for this etching are not particularly limited. In the present embodiment, a parallel plate-type plasma etching chamber (unillustrated) as well as a mixed gas of $C_4F_8$, Ar, and $O_2$ as an etching gas are used.

After the first resist pattern 144 is removed, in order to recover damages received by the capacitor dielectric film 122*a* during the manufacturing processes up to this point, a silicon substrate 101 is placed in an unillustrated furnace.

Then, recovery annealing is performed in an oxygen atmosphere at the substrate temperature of 550° C. for approximately 40 minutes.

Subsequently, as depicted in FIG. 16K, a second resist pattern 150 is formed on the entire upper surface of the silicon substrate. The second resist pattern 150 has a second hole-shaped window 150*a* over the first conductive plug 113*a*.

After that, the individual insulating films 112 and 140 to 143 are etched through the second window 150*a* so as to form a second hole 141*a* through which the first conductive plug 113*a* is exposed. Such etching is performed in the parallel plate plasma etching chamber using the mixed gas of, for example, $C_4F_8$, Ar, $O_2$, and CO as an etching gas.

Here, the first conductive plug 113*a* is covered with the oxidation protection insulating film 112 until this etching is performed. Accordingly, the first conductive plug 113*a* is isolated from the oxygen atmosphere in the manufacturing processes up to this point. Thus, contact failure due to oxidation is unlikely to occur.

After the etching is finished, the second resist pattern 150 is removed.

Next, processes for obtaining a cross-sectional structure depicted in FIG. 16L are described.

Firstly, by the sputtering method, a titanium nitride film is formed, as a glue film, with a thickness of approximately 50 nm on the upper surface of the first cover insulating film 143 and each of the inner surfaces of the first and second holes 145 and 141*a*. After that, a tungsten film is formed on the glue film with a thickness sufficient enough to fill the first and second holes 145 and 141*a*, for example, the thickness of 300 nm on the planar surface of the first cover insulating film 143.

Thereafter, the unnecessary glue film and the tungsten film on the first cover insulating film 143 are polished and removed by the CMP method, so that the glue film and the tungsten film are left only in the first and second holes 145 and 141*a* as third and fourth plugs 147*a* and 147*b*.

Among these conductive plugs, the third conductive plug 147*a* is electrically connected to the first conductive plug 113*a*. In addition, together with the first conductive plug 113*a*, the third conductive plug 147*a* constitutes a part of a bit line. On the other hand, the fourth conductive plugs 147*b* are electrically connected to the upper electrodes 123*a*.

Next, processes for obtaining a cross-sectional structure depicted in FIG. 16M are described.

Firstly, by the sputtering method, a metal stacked film is formed on each of the upper surfaces of the first cover insulating film 143 and the third and fourth conductive plugs 147*a* and 147*b*. The metal stacked film is formed by stacking, for example, a titanium nitride film with a thickness of approximately 50 nm, an aluminum film with a thickness of approximately 360 nm, and a titanium nitride film with a thickness of approximately 70 nm in this order.

After that, the metal stacked film is patterned by photolithography to form first metal interconnections 152 electrically connected to the third and fourth conductive plugs 147*a* and 147*b*, respectively.

Here, during the patterning of the metal stacked film, over-etching is performed so as not to leave etching residues of the metal stacked film on the first cover insulating film 143. Being covered with the first cover insulating film 143, the first capacitor protection insulating film 142 is not etched even when the over-etching is performed in this manner. For this reason, the thickness of the first capacitor protection insulating film 142 does not decrease even after the patterning of the metal stacked film is finished. Thus, the blocking capability of the first capacitor preventive insulating film 142 against reducing materials can be sufficiently maintained.

Next, as depicted in FIG. 16N, by the sputtering method, an alumina film is formed, as a third capacitor protection insulating film 151, with a thickness of approximately 20 nm on each of the first cover insulating film 143 and the first metal interconnections 152. The third capacitor protection insulating film 151 functions to block reducing materials such as hydrogen and moisture, thereby preventing the capacitor dielectric film 122a from being deteriorated by the reducing materials.

Films having such a function include a titanium oxide film, a zirconium oxide film, a magnesium oxide film, and a titanium magnesium oxide film, in addition to the alumina film. Any one of these films may be formed as the third capacitor protection insulating film 151.

Note that if the capacitor dielectric film 122a is not deteriorated even when the third capacitor protection insulating film 151 is not formed, the third capacitor protection insulating film 151 may be omitted.

Next, a silicon oxide film is formed, as a second interlayer insulating film 153, on the third capacitor protection insulating film 151 by a plasma CVD method. In the plasma CVD method, the TEOS gas is used as a reaction gas. The thickness of the second interlayer insulating film 153 on the first metal interconnection 152 is made to approximately 2600 nm.

After that, the upper surface of the second interlayer insulating film 153 is polished and thus planarized by the CMP method. Thereafter, the $N_2O$ plasma processing is performed on the surface of the second interlayer insulating film 153 so as to dehydrate the second interlayer insulating film 153 and to nitride the surface thereof to prevent moisture from being re-adsorbed. This $N_2O$ plasma processing is performed in CVD equipment under conditions of the substrate temperature of approximately 350° C. and the processing time of approximately 4 minutes.

Note that a cover insulating film may be formed on this second interlayer insulating film 153. This cover insulating film is formed for the purpose of filling microscratches formed in the upper surface of the second interlayer insulating film 153 during the CMP and voids generated in the second interlayer insulating film 153 between the adjacent capacitors Q. By forming such a cover insulating film, a capability of coating a film to be formed thereon is improved. As the cover insulating film, a silicon oxide film with a thickness of approximately 50 nm, which is formed by the plasma CVD method using the TEOS gas, may be employed, for example.

Next, processes for obtaining a cross-sectional structure depicted in FIG. 16O are described.

Firstly, as a first insulating metal oxide film 154a for protecting the capacitor dielectric film 122a from reducing materials, an alumina film is formed with a thickness of approximately 20 nm on the second interlayer insulating film 153 by the sputtering method.

Note that, in place of the alumina film, any one of a titanium oxide film, a zirconium oxide film, a magnesium oxide film, and a titanium magnesium oxide film may be formed as the first insulating metal oxide film 154a.

Moreover, the silicon substrate 101 is heated when the first insulating metal oxide film 50a is formed by the sputtering method. However, the second interlayer insulating film 153 is sufficiently dehydrated by the $N_2O$ plasma processing as described above. Accordingly, the capacitors Q are not steamed with moisture contained in the second interlayer insulating film 153.

Next, an intermediate insulating film 154b having a low dielectric constant is formed with a thickness of approximately 50 nm on the first insulating metal oxide film 154a.

The intermediate insulating film 154b is made of a material having a relative dielectric constant lower than that of silicon oxide (relative dielectric constant of approximately 4.1) constituting the second interlayer insulating film 153. For example, the intermediate insulating film 154b is made of nano-clustering silica which is a porous silica-based material having a relative dielectric constant of 2.25.

Moreover, the intermediate insulating film 154b may be made of silicon oxide-based "Black Diamond" (relative dielectric constant of approximately 3.8 to 4.2) which is developed by Applied Materials Inc., or porous MSQ (relative dielectric constant of 2.5 or less).

The intermediate insulating film 154b has a small thickness of approximately 50 nm. Accordingly, the amount of moisture to be taken into the intermediate insulating film 154b at the time of the forming thereof is very small. Thus, the $N_2O$ plasma processing (see FIG. 16N) performed to dehydrate the second interlayer insulating film 153 is not necessary for the intermediate insulating film 154b.

However, when the intermediate insulating film 154b is exposed to an atmosphere for a long period of time, the amount of moisture in the intermediate insulating film 154b increases by moisture absorption. Accordingly, to prevent the intermediate insulating film 154b from moisture absorption, it is preferable that the subsequent process be performed within 12 hours as much as possible after the intermediate insulating film 154b is formed.

Moreover, if it is required to take 12 hours or longer before the subsequent process is performed due to manufacturing reasons, it is preferable that the silicon substrate 101 be stored in a sealed container described in FIG. 10 after the intermediate insulating film 154b is formed, in order to prevent the intermediate insulating film 154b from absorbing moisture as less as possible.

After that, an alumina film is formed, as a second insulating metal oxide film 154c, with a thickness of approximately 20 nm on the intermediate insulating film 154b. Similar to the first insulating metal oxide film 154a, the second insulating metal oxide film 154c plays a role to prevent reducing materials such as hydrogen and moisture from entering the capacitor dielectric film 122a, thereby preventing the capacitor dielectric film 122a from being deteriorated.

Note that that, in place of the alumina film, any one of a titanium oxide film, a zirconium oxide film, a magnesium oxide film, and a titanium magnesium oxide film may be formed as the second insulating metal oxide film 154c.

With the processes described so far, a fourth capacitor protection insulating film 154 formed of the first and second insulating metal oxide films 154a and 154c and the intermediate insulating film 154b is formed on the second interlayer insulating film 153.

After that, a silicon oxide film is formed on the fourth capacitor protection insulating film 154 by the plasma CVD method using the TEOS gas. The resultant silicon oxide film serves as a second cover insulating film 155.

The thickness of the second cover insulating film 155 is as thin as approximately 100 nm. Accordingly, the amount of moisture in the second cover insulating film 155 is small. Thus, there is no need to perform the dehydration processing using the $N_2O$ plasma on the second cover insulating film 155.

However, similar to the intermediate insulating film 154b, when the second cover insulating film 155 is left in an atmosphere for a long period of time, the second cover insulating film 155 absorbs moisture. Accordingly, in order to suppress the moisture absorption of the second cover insulating film 155, it is preferable that the subsequent process be performed within 12 hours as much as possible after the second cover insulating film 155 is formed.

Note that, if it is required to take 12 hours or longer before the subsequent process is performed due to manufacturing reasons, it is preferable that the silicon substrate 101 be stored in the sealed container described in FIG. 10, after the second cover insulating film 155 is formed, in order to prevent the second cover insulating film 155 from absorbing moisture.

Next, as depicted in FIG. 16P, a third resist pattern 160 having a third window 160a over the first metal interconnection 152 is formed on the second cover insulting film 155.

After that, the individual insulating films 151, and 153 to 155 are dry-etched through the third window 160a so as to form a third hole 156 in these insulating films formed over the first metal interconnection 152. Conditions for the dry etching are not particularly limited. In the present embodiment, a parallel plate-type plasma etching chamber (unillustrated) is used, and the mixed gas of $C_4F_8$, Ar, and $O_2$ is used as an etching gas.

Figure 2A:
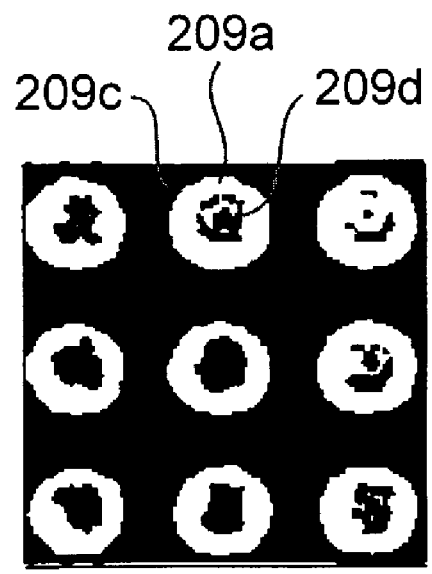
FIGS. 2A and 2B are plan views of holes which are disclosed in Patent Document 1 and depicted based on an SEM image viewed from above.
Figure 2B:
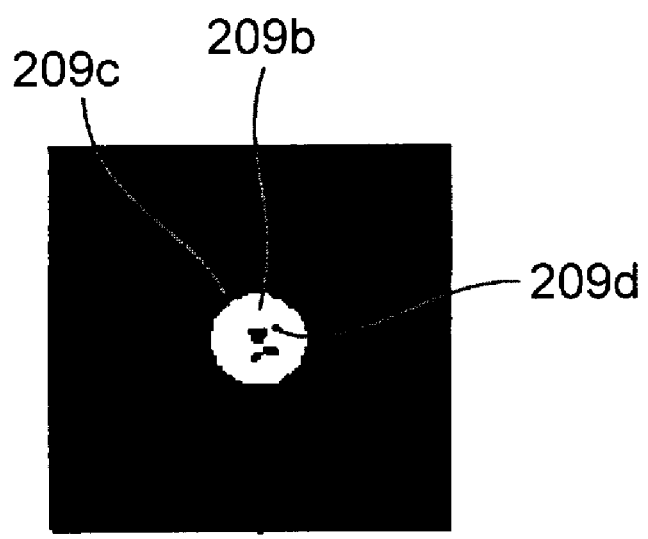

The third hole 156 is formed also in the fourth capacitor protection insulating film 154. Note that the intermediate insulating film 154b constituting the fourth capacitor protection insulating film 154 is made of a silicon oxide-based material similar to that of the second interlayer insulating film 153. Accordingly, the intermediate insulating film 154a and the second interlayer insulating film 153 are etched at a substantially same etching rate. For this reason, the diameters of the third hole 156 at the upper end and lower end thereof become substantially the same. Thus, the lower end diameter does not become extremely small as depicted in FIGS. 2A and 2B.

After the etching is finished, the third resist pattern 160 is removed.

The first and second insulating metal oxide films 154a and 154c are etched by the sputtering effect of the etching gas. Accordingly, when the total film thickness of these insulating metal oxide films 154a and 154c is too thick, the third hole 156 becomes difficult to be formed by the etching. For this reason, to facilitate the formation of the third hole 156 by the etching, it is preferable that the total film thickness of the first and second insulating metal oxide films 154a and 154c be less than 100 nm, and more preferably at least 20 nm and no more than 50 nm. Here, the reason why the lower limit of the total film thickness is set to 20 nm is that, if it is thinner than 20 nm, the blocking capability of the first and second insulating metal oxide films 154a and 154c against the reducing materials cannot exhibit.

Next, as depicted in FIG. 16Q, a titanium nitride film is formed, as a glue film, with a thickness of approximately 150 nm on the inner surface of the third hole 156 and on the upper surface of the second cover insulating film 155 by the sputtering method.

Furthermore, by the plasma CVD method using the tungsten hexafluoride gas, a tungsten film 163a is formed with such a thickness so as to completely fill the third hole 156, for example, with a thickness of approximately 650 nm, on the glue film 162.

After that, as depicted in FIG. 16R, the unnecessary glue film 162 and the tungsten film 163a on the upper surface of the second cover insulating film 155 are removed, so that the glue film 162 and the tungsten film 163a are left only in the third hole 156 as a fifth conductive plug 163.

As described above, the lower end of the third hole 156 is sufficiently largely opened. Accordingly, the fifth conductive plug 163 comes into broad contact with the first metal interconnection 152. Thus, the contact resistance of the fifth conductive plug 163 is stabilized.

Next, processes for obtaining a cross-sectional structure depicted in FIG. 16S are described.

Firstly, by the sputtering method, a metal stacked film is formed on each of the fifth conductive plug 163 and the second cover insulating film 155. As the metal stacked film, in the present embodiment, a Ti film with a thickness of approximately 60 nm, a TiN film with a thickness of approximately 30 nm, a copper-containing aluminum film with a thickness of approximately 400 nm, a Ti film with a thickness of approximately 5 nm, and a TiN film with a thickness of approximately 70 nm are formed in this order.

After that, the metal stacked film is patterned by photolithography to form second metal interconnections 165.

Here, since the second cover insulating film 155 is formed on the fourth capacitor protection insulating film 154, the etching does not reach the first capacitor protection insulating film 154 when the metal stacked film is patterned. Thus, the fourth capacitor protection insulating film 154 is prevented from being reduced in film thickness, so that the blocking capability thereof against the reducing materials can be sufficiently maintained.

Furthermore, by the plasma CVD method using the TEOS gas, a silicon oxide film is formed on each of the second cover insulating film 155 and the second metal interconnections 165. The resultant silicon oxide film serves as a third interlayer insulating film 167.

After that, the upper surface of the third interlayer insulating film 167 is polished and thus planarized by the CMP method. The film thickness of the third interlayer insulating film 167 after the planarization is, for example, approximately 1000 nm on the second metal interconnections 165.

After the CMP, the $N_2O$ plasma processing may be performed as dehydration processing on the third interlayer insulating film 167.

Subsequently, as depicted in FIG. 16T, the third interlayer insulating film 167 is patterned to form fourth holes 167a on the second metal interconnections 165.

Thereafter, by a method similar to the method of forming the fifth conductive plugs 163, sixth conductive plugs 170 electrically connected to the second metal interconnections 165 are formed.

Furthermore, by the sputtering method, a metal stacked film is formed on each of the upper surfaces of the sixth conductive plugs 170 and the third interlayer insulating film 167. Thereafter, the metal stacked film is patterned by photolithography to form a third metal interconnection 171 in the cell region $R_{cell}$ and a bonding pad 171a in the pad region $R_{pad}$.

Next, processes for obtaining a cross-sectional structure depicted in FIG. 16U are described.

Firstly, on each of the third interlayer insulating film 167 and the third metal interconnections 171, a silicon oxide film is formed, as a first passivation film 173, with a thickness of approximately 100 nm by the CVD method.

Incidentally, the $N_2O$ plasma processing may be performed on the first passivation film 173 so as to dehydrate the first passivation film 173 and to prevent moisture re-absorption thereof.

Furthermore, a silicon nitride film is formed, as a second passivation film 174, with a thickness of approximately 350 nm on the first passivation film 173 by the CVD method.

After that, these first and second passivation films 173 and 174 are patterned to form a first opening 173a through which the bonding pad 171a in the pad region $R_{pad}$ is exposed.

Thereafter, a photosensitive polyimide material is formed with a thickness of approximately 3 μm on the entire upper surface of the silicon substrate 101 so as to form a protection layer 175 formed of a polyimide coating film.

After that, the protection layer 175 is exposed and developed, so that a second opening 175a through which the bonding pad 171a is exposed is formed in the protection layer 175. Thereafter, the protection layer 175 is cured by heat under conditions of the substrate temperature of 310° C., the $N_2$ flow rate of 100 liters per minute, and the processing time of 40 minutes.

By the processes described above, the basic structure of the semiconductor device according to the present embodiment is completed.

According to the present embodiment described above, the stacked film which is formed by stacking the first insulating metal oxide film 154a, the intermediate insulating film 154b, and the second insulating metal oxide film 154c in this order is employed as the fourth capacitor protection insulating film 154 for preventing reducing materials from entering the capacitor dielectric film 122a.

By forming the two layers of the first insulating metal oxide film 154a and the second insulating metal oxide film 154c are formed in this manner, the blocking capability against reducing materials such as hydrogen and moisture is increased as compared with the case where only one of the two layers is formed.

Furthermore, by the same reason as that described in the first embodiment, defect is unlikely to occur in the semiconductor device as compared with the case where a single-layered insulating metal oxide film is formed with a thickness equal to the total film thickness of the first insulating metal oxide film 154a and the second insulating metal oxide film 154c.

In addition, both the first insulating metal oxide film 154a and the second insulating metal oxide film 154c are formed between the same layers, in other words, between the second interlayer insulating film 153 and the second metal interconnection 165. Thereby, an interval between the first insulating metal oxide film 154a and the second insulating metal oxide film 154c is narrowed to the minimum. With this configuration, as described in the first embodiment, the thickness of the intermediate insulating film 153b formed between the insulating metal oxide films 154a and 154c becomes thin. Accordingly, the generation of a void in the intermediate insulating film 153b becomes difficult. As a result, the capacitor dielectric film 122a can be prevented from being deteriorated by moisture in the void.

Furthermore, the intermediate insulating film 154b constituting the fourth capacitor protection insulating film 154 is made of a material having a relative dielectric constant lower than that of the second interlayer insulating film 153. Accordingly, the intermediate insulating film 154b has a small film stress and a small tensile stress as compared with the silicon oxide films formed by the plasma CVD method. For this reason, as compared with the case where the silicon oxide films 221 and 223 are formed by the plasma CVD method as described in FIG. 3, the warpage of the silicon substrate 101 caused by a film stress can be prevented, and thus the capacitors Q of piezoelectric elements can be prevented from being deteriorated by the stress.

Modifications of Third Embodiment

Next, modifications of the third embodiment are described below by referring to FIGS. 17 and 18. Note that, in these figures, same reference numerals are given to denote components same as those described in the third embodiment, and the descriptions thereof are omitted below.

First Modification

Figure 17:
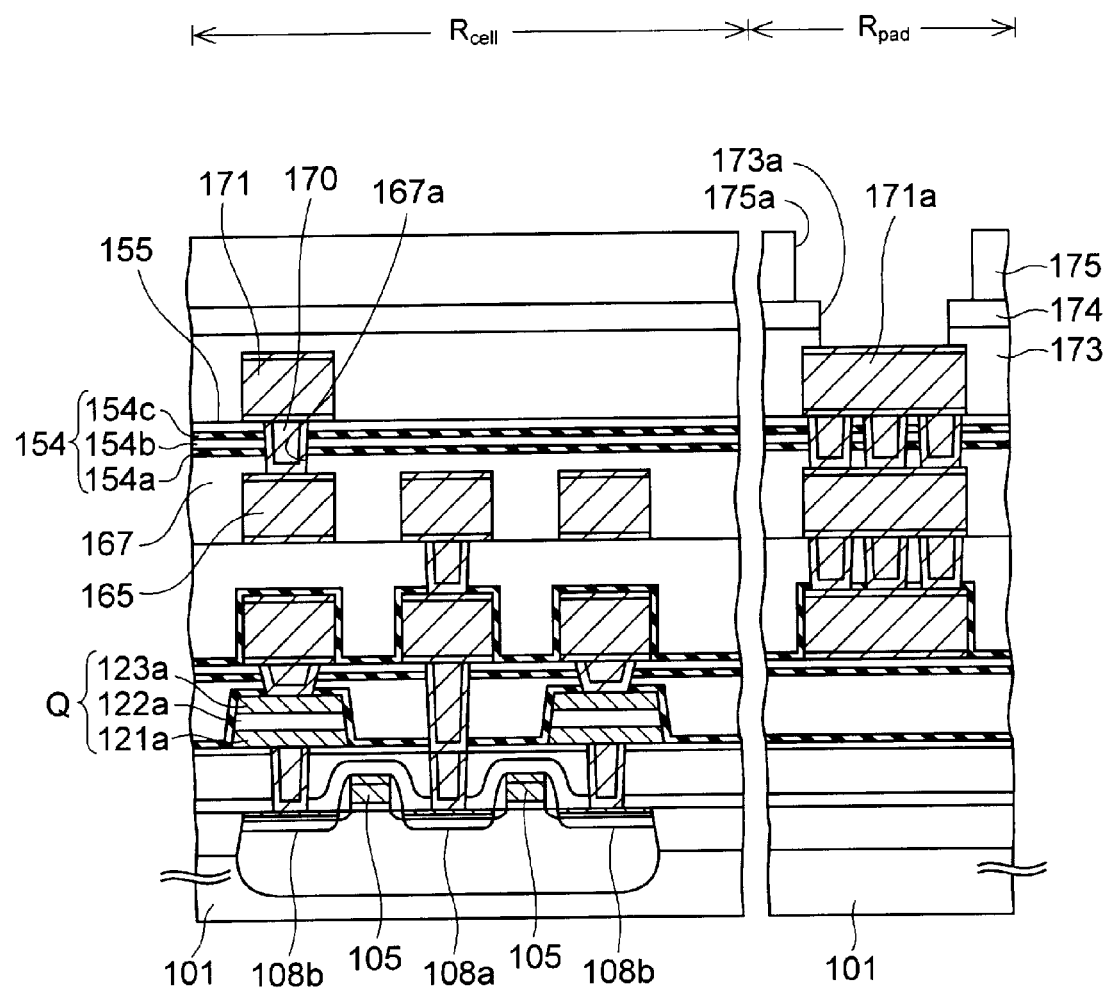
FIG. 17 is a cross-sectional view of a semiconductor device according to a second modification of the third embodiment.

FIG. 17 is a cross-sectional view of a semiconductor device according to a first modification of the third embodiment.

In the first modification, the fourth capacitor protection insulating film 154 and the second cover insulating film 155 are formed between the third interlayer insulating film 167 and each third metal interconnection 171.

With such a configuration, fourth holes 167a are formed also in these insulating films 154 and 155.

Note that the intermediate insulating film 154b constituting the fourth capacitor protection insulating film 154 is made of a silicon oxide-based material, similar to the third interlayer insulating film 167. Accordingly, when the fourth holes 167a are formed by the etching, there is not generated a substantial difference in etching rate between the intermediate insulating film 154b and the third interlayer insulating film 167.

Accordingly, the diameter at the lower end of each fourth hole 167a becomes nearly equal to the diameter at the upper end thereof. Thus, the contact resistance of the sixth conductive plugs 170 can be stabilized.

Second Modification

Figure 18:
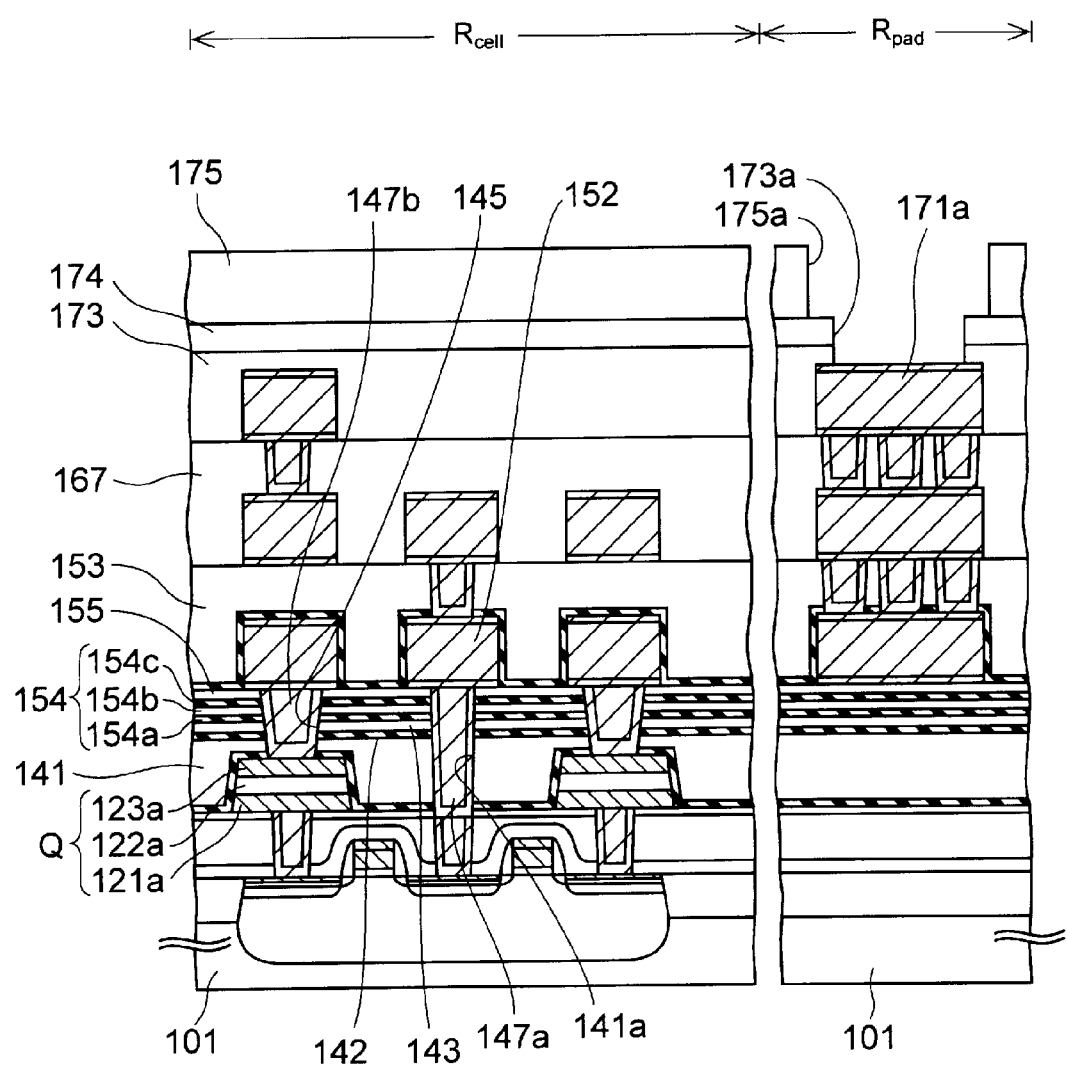
FIG. 18 is a cross-sectional view of a semiconductor device according to a second modification of the third embodiment.

FIG. 18 is a cross-sectional view of a semiconductor device according to a second modification of the third embodiment.

In the second modification, the fourth capacitor protection insulating film 154 and the second cover insulating film 155 are formed between the first interlayer insulating film 141 and the first metal interconnection 152.

In this case, the first and second holes 145 and 141a in the first interlayer insulating film 141 are also formed in the insulating films 154 and 155.

As described in the first modification, even with such a configuration, there is not generated a substantial difference in etching rate between the intermediate insulating film 154b and the first interlayer insulating film 141, when the first and second holes 145 and 141a are formed by the etching. This is because the intermediate insulating film 154b and the first interlayer insulating film 141 are both made of a silicon oxide-based material. Accordingly, the bottoms of the first and second holes 145 and 141a can be formed substantially large, so that the contact resistances of the third and fourth conductive plugs 147a and 147b, which are filled in these holes 141a and 145, can be stabilized.

Note that, if the total film thickness of the second capacitor protection insulating film 142 and the first and second insulating metal oxide films 154a and 154c, which are etched with the sputtering effect of an etching gas, is too thick when the first and second holes 145 and 141a are formed by the etching, it becomes difficult to etch these holes 145 and 141a. For this reason, it is preferable that the total film thickness of the second capacitor protection insulating film 142 and the first and second insulating metal oxide films 154a and 154c be set to less than 100 nm so as to facilitate the formation of the first and second holes 145 and 141a by the etching.

What is claimed is:

1. A semiconductor device comprising: a base insulating film formed over a semiconductor substrate; a capacitor formed on the base insulating film, the capacitor including a lower electrode, a capacitor dielectric film made of a ferroelectric material, and an upper electrode; a plurality of interlayer insulating films and metal interconnections which are alternately formed over the capacitor; and a conductive plug which is formed in a hole provided in the interlayer insulating films and is electrically connected to the first metal interconnections, wherein a first capacitor protection insulating film is formed on an upper surface of at least one interlayer insulating film among the plurality of interlayer insulating films, the first capacitor protection insulating film being formed by sequentially stacking a first insulating metal oxide film, an intermediate insulating film having a relative dielectric constant lower than that of silicon oxide, and a second insulating metal oxide film, wherein the at least one interlayer insulating film is a silicon oxide film; and the hole is also formed in the first capacitor protection insulating film.

2. The semiconductor device according to claim 1, wherein a cover insulating film is formed on the first capacitor protection insulating film, and the metal interconnections are formed on the cover insulating film.

3. The semiconductor device according to claim 1, wherein a cap insulating film is formed on the upper surface of the at least one interlayer insulating film among the plurality of the interlayer insulating films, and the first capacitor protection insulating film is formed on the cap insulating film.

4. The semiconductor device according to claim 3, wherein a second capacitor protection insulating film formed of an insulating metal oxide film is formed on an upper surface of the interlayer insulating film over which the cap insulating film is formed, and the cap insulating film is formed on the second capacitor protection insulating film.

5. The semiconductor device according to claim 4, wherein the interlayer insulating film, which has the upper surface on which the second capacitor protection insulating film is formed, is a first layer of the plurality of the interlayer insulating films.

6. The semiconductor device according to claim 1, wherein the upper surface of the interlayer insulating film, on which the first capacitor protection insulating film is formed, is planarized.

7. The semiconductor device according to claim 1, wherein a third capacitor protection insulating film made of an insulating metal oxide is formed on the capacitor, and the plurality of the interlayer insulating films and the metal interconnections are alternately formed over the third capacitor protection insulating film.

8. The semiconductor device according to claim 1, wherein a fourth capacitor protection insulating film made of an insulating metal oxide is formed on at least one of the plurality of metal interconnections.

9. The semiconductor device according to claim 1, wherein the intermediate insulating film and the interlayer insulating films in which the hole is formed are both made of a silicon oxide-based material.

10. The semiconductor device according to claim 1, wherein the intermediate insulating film is a porous insulating film.

11. The semiconductor device according to claim 1, wherein each of the first insulating metal oxide film and the second insulating metal oxide film is any one selected from the group consisting of an alumina film, a titanium oxide film, a zirconium oxide film, a magnesium oxide film, and a titanium magnesium oxide film.

12. A method for manufacturing a semiconductor device, comprising: forming a base insulating film over a semiconductor substrate; forming a capacitor on the base insulating film, the capacitor including a lower electrode, a capacitor dielectric film made of a ferroelectric material, and an upper electrode; alternately forming a plurality of interlayer insulating films and metal interconnections over the capacitor; forming a hole in at least one of the plurality of the interlayer insulating films; forming a conductive plug electrically connected to the metal interconnections in the hole; wherein the method further comprising: forming a first capacitor protection insulating film on an upper surface of at least one interlayer insulating film among the plurality of the interlayer insulating films, the first capacitor protection insulating film being formed by sequentially stacking a first insulating metal oxide film, an intermediate insulating film having a relative dielectric constant lower than that of silicon oxide, and a second insulating metal oxide film, wherein the at least one interlayer insulating film is a silicon oxide film; and when forming the hole, the hole is also formed in the first capacitor protection insulating film.

13. The method for manufacturing a semiconductor device according to claim 12, wherein the intermediate insulating film and the interlayer insulating film in which the hole is formed are both made of a silicon oxide-based material.

14. The method for manufacturing a semiconductor device according to claim 12, wherein, when forming the first capacitor protection insulating film, a porous insulating film is formed as the intermediate insulating film.

15. The method for manufacturing a semiconductor device according to claim 12, wherein, when forming the first capacitor protection insulating film, after the intermediate insulating film is formed, the second insulating metal oxide film is formed without performing a heat treatment on the intermediate insulating film.

16. The method for manufacturing a semiconductor device according to claim 15, wherein, when forming the first capacitor protection insulating film, the semiconductor substrate is stored in a sealed container filled with an inert gas having a pressure higher than an atmospheric pressure for a predetermined period of time after the intermediate insulating film is formed, and then the semiconductor substrate is taken out from the sealed container, and the second insulating metal oxide film is formed.

17. The method for manufacturing a semiconductor device according to claim 12, wherein, when forming the first capacitor protection insulating film, a total film thicknesses of the first insulating metal oxide film and the second insulating metal oxide film is set to 100 nm or less.

18. The method for manufacturing a semiconductor device according to claim 12, further comprising: forming a cover insulating film on the first capacitor protection insulating film after forming the first capacitor protection insulating film, wherein the metal interconnections are formed on the cover insulating film.

19. The method for manufacturing a semiconductor device according to claim 12, further comprising: polishing and planarizing an upper surface of one of the plurality of the interlayer insulating films; and forming a cap insulating film on the planarized upper surface of the interlayer insulating film, wherein the first capacitor protection insulating film is formed on the cap insulating film.

20. The method for manufacturing a semiconductor device according to claim 19, further comprising:
forming a second capacitor protection insulating film formed of an insulating metal oxide film on the planarized upper surface of the interlayer insulating film,
wherein the cap insulating film is formed on the second capacitor protection insulating film.

* * * * *